United States Patent

(12) United States Patent
Park et al.

(10) Patent No.: US 11,888,039 B2
(45) Date of Patent: Jan. 30, 2024

(54) INTEGRATED CIRCUIT DEVICE

(71) Applicant: SAMSUNG ELECTRONICS CO., LTD., Suwon-si (KR)

(72) Inventors: Yonghee Park, Hwaseong-si (KR); Myunggil Kang, Suwon-si (KR); Uihui Kwon, Hwaseong-si (KR); Seungkyu Kim, Seoul (KR); Ahyoung Kim, Seoul (KR); Youngseok Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 17/352,973

(22) Filed: Jun. 21, 2021

(65) Prior Publication Data

US 2022/0165857 A1 May 26, 2022

(30) Foreign Application Priority Data

Nov. 26, 2020 (KR) .................. 10-2020-0161185

(51) Int. Cl.
*H01L 29/417* (2006.01)
*H01L 29/06* (2006.01)
(Continued)

(52) U.S. Cl.
CPC ...... *H01L 29/41775* (2013.01); *H01L 27/088* (2013.01); *H01L 29/0665* (2013.01); *H01L 29/42392* (2013.01); *H01L 29/78696* (2013.01)

(58) Field of Classification Search
CPC ............. H01L 29/41775; H01L 27/088; H01L 29/0665; H01L 29/42392; H01L 29/78696; H01L 29/41766; H01L 29/66439; H01L 29/775; H01L 21/823418; H01L 21/823814; H01L 21/823456; H01L 21/823475; H01L 21/82385; H01L 21/823871; H01L 27/092; H01L 29/0673; H01L 27/0886; H01L 21/823431; H01L 21/823437; H01L 21/823807; H01L 21/823828; H01L 21/823857; B82Y 10/00
(Continued)

(56) References Cited

U.S. PATENT DOCUMENTS 8,896,030 B2 11/2014 Mukherjee et al.
10,256,342 B2 4/2019 Park et al.
(Continued)

*Primary Examiner* — Tong-Ho Kim
(74) *Attorney, Agent, or Firm* — Sughrue Mion, PLLC

(57) ABSTRACT

An integrated circuit device includes a fin-type active region disposed on a substrate and extending in a first horizontal direction, a gate line disposed on the fin-type active region and extending in a second horizontal direction intersecting the first horizontal direction, the gate line including, a connection protrusion portion including a protrusion top surface at a first vertical level from the substrate, and a main gate portion including a recess top surface extending in the second horizontal direction from the connection protrusion portion, the recess top surface being at a second vertical level lower than the first vertical level, a gate contact disposed on the gate line and connected to the connection protrusion portion, a source/drain region disposed on the fin-type active region and disposed adjacent to the gate line, and a source/drain contact disposed on the source/drain region.

20 Claims, 65 Drawing Sheets

(51) Int. Cl.
    *H01L 29/423*    (2006.01)
    *H01L 29/786*    (2006.01)
    *H01L 27/088*    (2006.01)

(58) Field of Classification Search
    USPC ........................................................ 257/401
    See application file for complete search history.

(56) References Cited

U.S. PATENT DOCUMENTS

| | | |
|---|---|---|
| 10,319,812 B2 | 6/2019 | Webb et al. |
| 10,529,712 B2 | 1/2020 | Kim et al. |
| 2019/0393352 A1 | 12/2019 | Guha et al. |
| 2020/0043926 A1* | 2/2020 | Ohtou ................ H01L 29/0649 |
| 2020/0105577 A1 | 4/2020 | Liang et al. |
| 2020/0135579 A1 | 4/2020 | Wu et al. |
| 2020/0176575 A1* | 6/2020 | Lee .................... H01L 27/0886 |

* cited by examiner

X2 - X2'

Y1 - Y1'

Y1 - Y1'

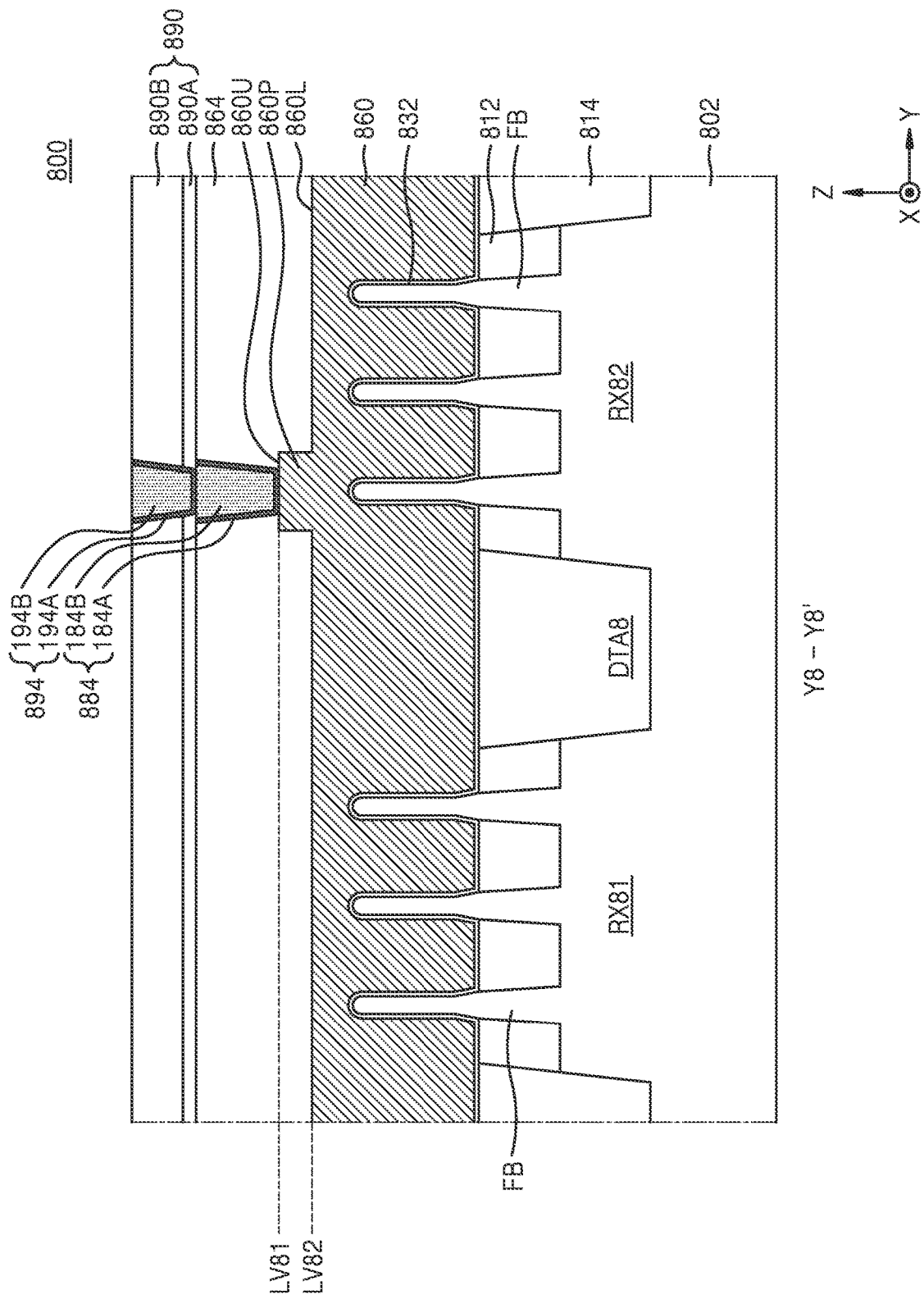

Y1 - Y1'

INTEGRATED CIRCUIT DEVICE

CROSS-REFERENCE TO RELATED APPLICATION

This application is based on and claims priority under 35 U.S.C. § 119 to Korean Patent Application No. 10-2020-0161185, filed on Nov. 26, 2020, in the Korean Intellectual Property Office, the disclosure of which is incorporated by reference herein in its entirety.

BACKGROUND

The inventive concept relates to an integrated circuit device, and more particularly, to an integrated circuit device including a field-effect transistor.

Recently, as the down-scaling of integrated circuit devices has been rapidly done, it may be required to secure the accuracy of an operation as well as a fast operation speed in integrated circuit devices. Therefore, it may be required to develop technology for integrated circuit devices in which an undesired parasitic capacitance is reduced by decreasing an area occupied by conductive regions in a relatively small area. Thus, reliability is enhanced.

SUMMARY

The inventive concept provides an integrated circuit device in which an undesired parasitic capacitance is reduced by decreasing an area occupied by conductive regions in the integrated circuit device including a device region having an area reduced based on down-scaling. Thus, reliability is enhanced.

According to an aspect of the inventive concept, there is provided an integrated circuit device including a fin-type active region disposed on a substrate and extending in a first horizontal direction, and a gate line disposed on the fin-type active region and extending in a second horizontal direction intersecting the first horizontal direction, the gate line including, a connection protrusion portion including a protrusion top surface at a first vertical level from the substrate, and a main gate portion including a recess top surface extending in the second horizontal direction from the connection protrusion portion, the recess top surface being at a second vertical level lower than the first vertical level. The integrated circuit device further includes a gate contact disposed on the gate line and connected to the connection protrusion portion, a source/drain region disposed on the fin-type active region and disposed adjacent to the gate line, and a source/drain contact disposed on the source/drain region, the source/drain contact including an uppermost surface at a third vertical level higher than the first vertical level.

According to another aspect of the inventive concept, there is provided an integrated circuit device including a substrate including a first region, and a second region disposed apart from the first region, a first fin-type active region extending in a first horizontal direction in the first region, and a first gate line extending in a second horizontal direction intersecting the first horizontal direction, in the first fin-type active region, the first gate line including a top surface at a first vertical level from the substrate. The integrated circuit device further includes a second fin-type active region extending in the first horizontal direction in the second region, and a second gate line extending in the second horizontal direction in the second fin-type active region, the second gate line including a recess top surface at a second vertical level lower than the first vertical level.

According to another aspect of the inventive concept, there is provided an integrated circuit device including a substrate including a first device region, and a second device region disposed apart from the first device region, a first fin-type active region extending in a first horizontal direction in the first device region, and a second fin-type active region extending in the first horizontal direction in the second device region. The integrated circuit device further includes a first nanosheet stack including at least one first nanosheet facing a first fin top surface of the first fin-type active region and disposed apart from the first fin top surface in a vertical direction, and a second nanosheet stack including at least one second nanosheet facing a second fin top surface of the second fin-type active region and disposed apart from the second fin top surface in the vertical direction. The integrated circuit device further includes a gate line including a connection protrusion portion extending in a second horizontal direction intersecting the first horizontal direction, in the first device region and the second device region, the connection protrusion portion including a protrusion top surface at a first vertical level from the substrate, and a main gate portion including a recess top surface extending in the second horizontal direction from the connection protrusion portion, the recess top surface being at a second vertical level lower than the first vertical level. The integrated circuit device further includes a plurality of sub gate portions connected to the main gate portion as one body and surrounding the first nanosheet stack and the second nanosheet stack, a gate contact disposed on the gate line and contacting the connection protrusion portion, a source/drain region disposed on one among the first fin-type active region and the second fin-type active region and disposed adjacent to the gate line, and a source/drain contact disposed on the source/drain region, the source/drain contact including an uppermost surface at a third vertical level higher than the first vertical level.

BRIEF DESCRIPTION OF THE DRAWINGS

Embodiments of the inventive concept will be more clearly understood from the following detailed description taken in conjunction with the accompanying drawings in which:

FIG. 20B is a cross-sectional view illustrating some elements of a cross-sectional surface taken along line Y8-Y8' of FIG. 20A;

FIGS. 21A, 22A, . . . , and 31A are cross-sectional views illustrating some elements, based on a process sequence, of a portion corresponding to a cross-sectional surface taken along line X1-X1' of FIG. 1;

FIGS. 21B, 22B, . . . , and 31B are cross-sectional views illustrating some elements, based on a process sequence, of a portion corresponding to a cross-sectional surface taken along line X2-X2' of FIG. 1; and FIGS. 21C, 22C, . . . , and 31C are cross-sectional views illustrating some elements, based on a process sequence, of a portion corresponding to a cross-sectional surface taken along line Y1-Y1' of FIG. 1.

DETAILED DESCRIPTION

Hereinafter, embodiments will be described in detail with reference to the accompanying drawings. Like numeral references refer to like elements, and their repetitive descriptions may be omitted.

Figure 1:
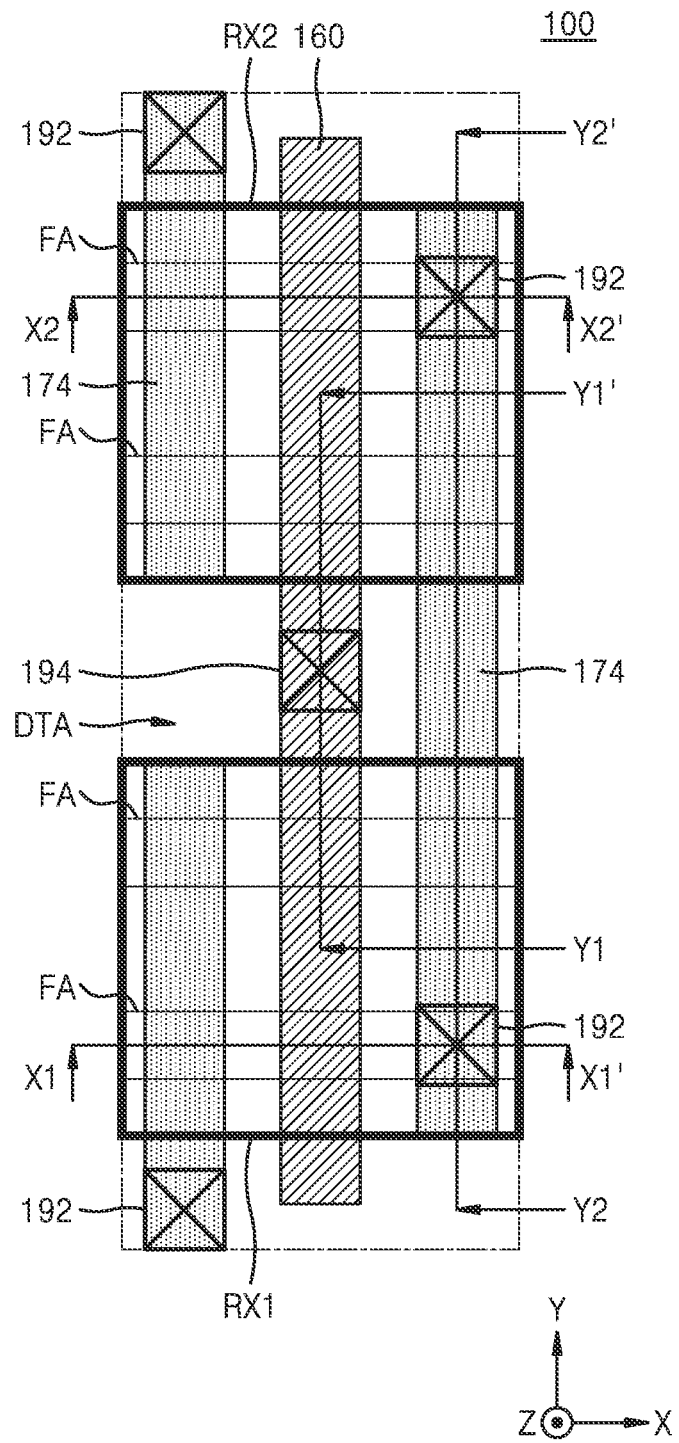
FIG. 1 is a plan layout diagram illustrating some elements of an integrated circuit device according to embodiments.
Figure 2A:
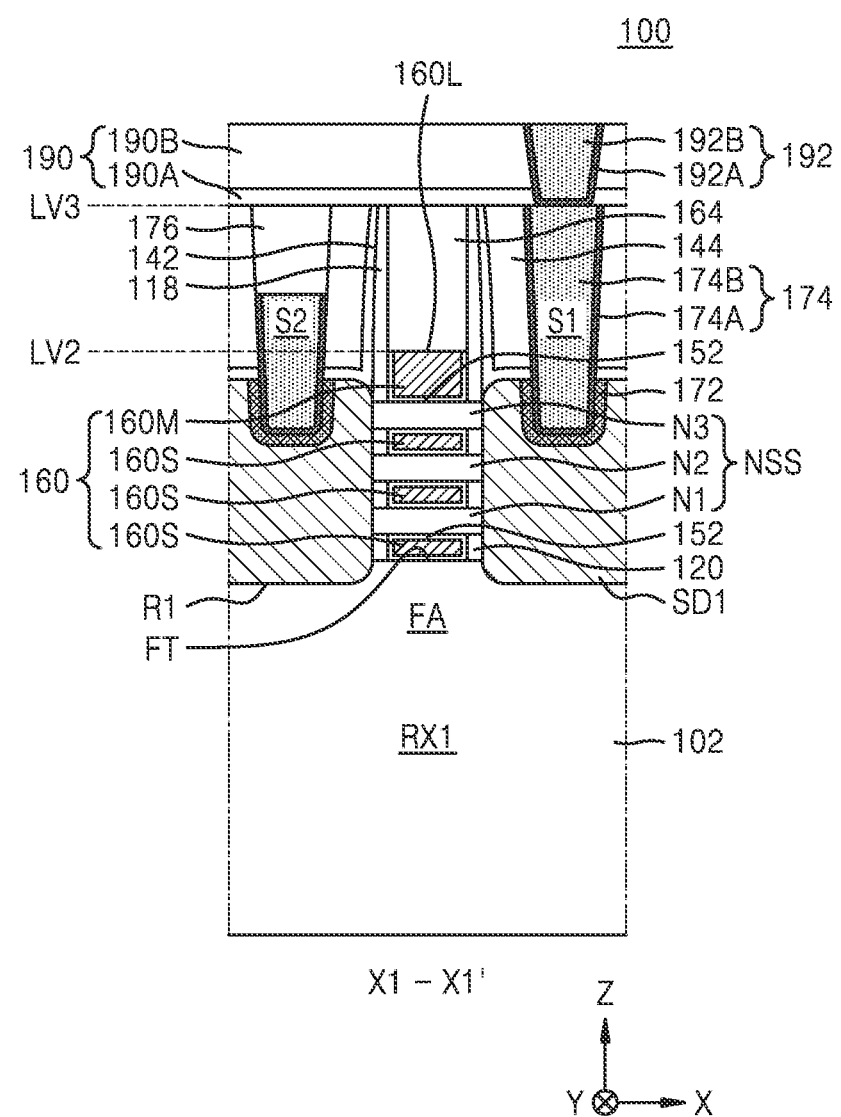
FIG. 2A is a cross-sectional view illustrating some elements of a cross-sectional surface taken along line X1-X1' of FIG. 1.
Figure 2B:
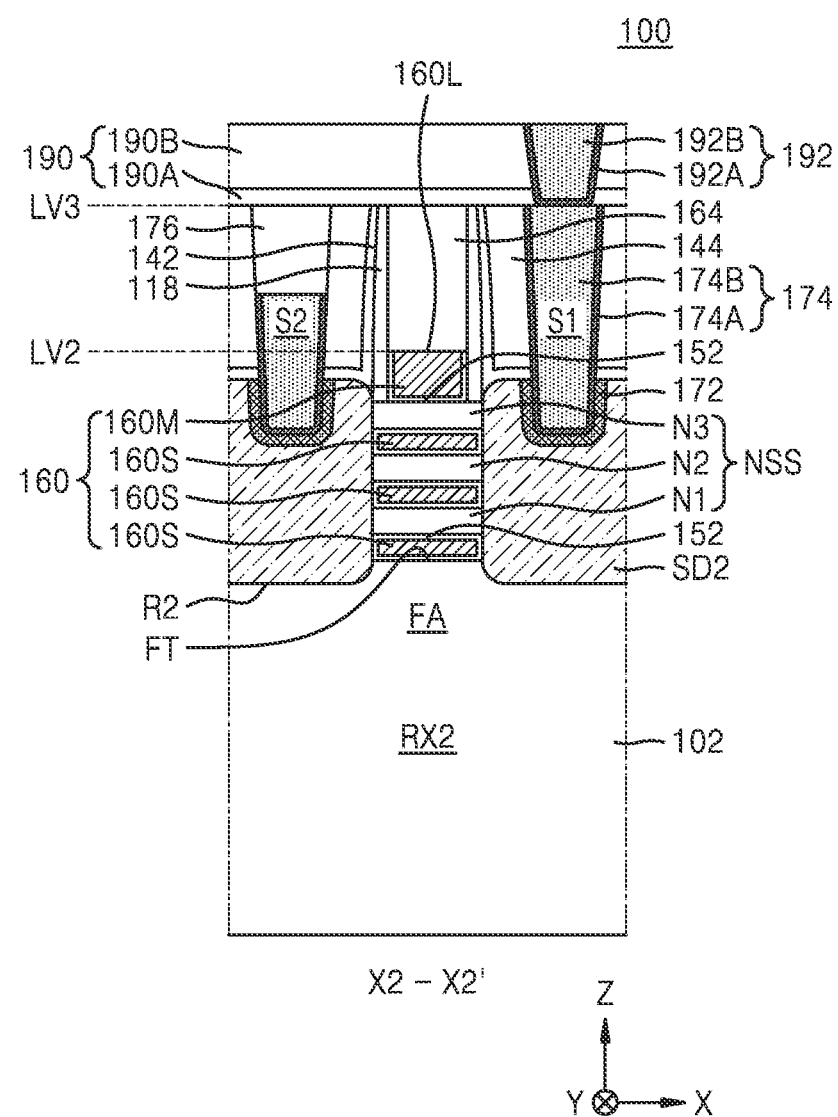
FIG. 2B is a cross-sectional view illustrating some elements of a cross-sectional surface taken along line X2-X2' of FIG. 1.
Figure 2C:
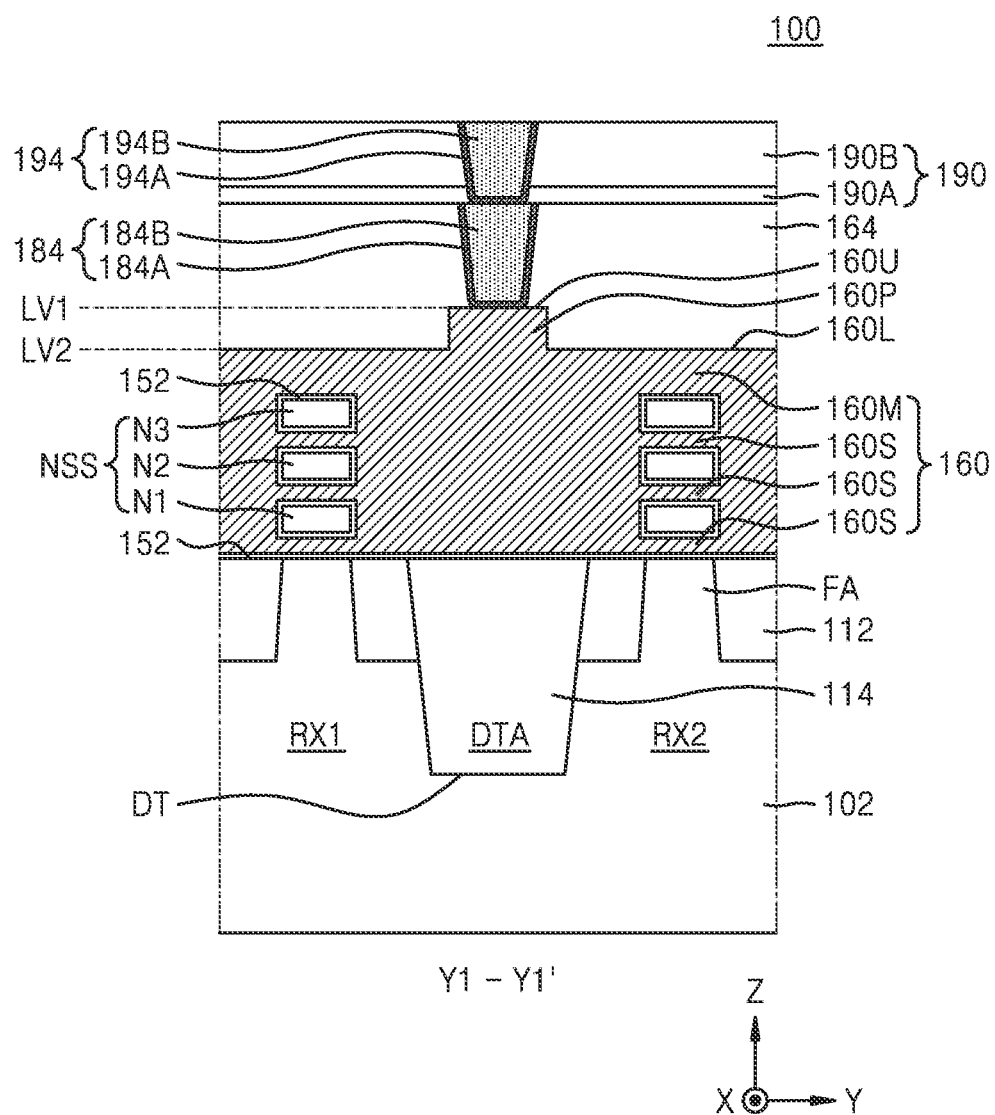
FIG. 2C is a cross-sectional view illustrating some elements of a cross-sectional surface taken along line Y1-Y1' of FIG. 1.
Figure 2D:
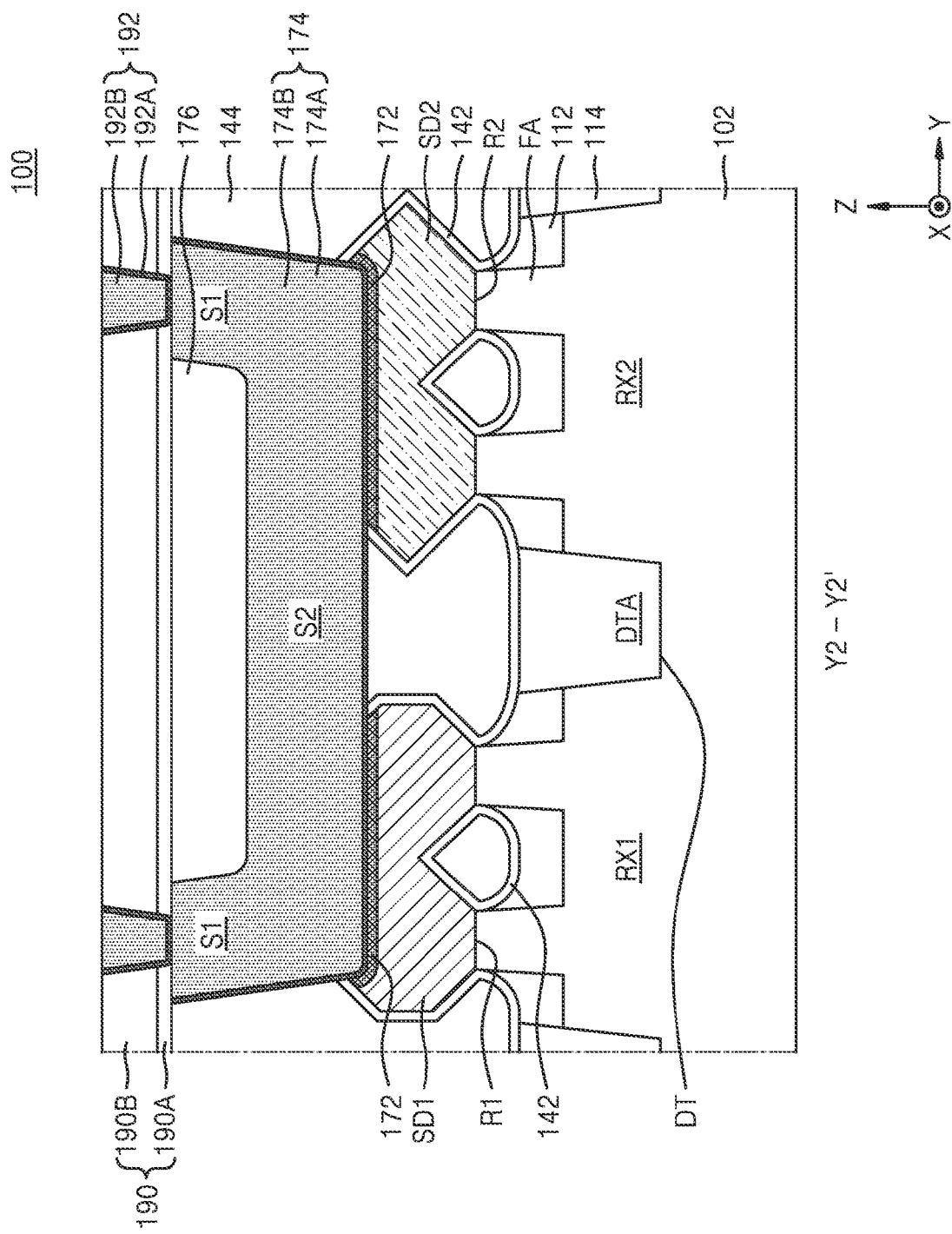
FIG. 2D is a cross-sectional view illustrating some elements of a cross-sectional surface taken along line Y2-Y2' of FIG. 1.

FIG. 1 is a plan layout diagram illustrating some elements of an integrated circuit device 100 according to embodiments. FIG. 2A is a cross-sectional view illustrating some elements of a cross-sectional surface taken along line X1-X1' of FIG. 1, FIG. 2B is a cross-sectional view illustrating some elements of a cross-sectional surface taken along line X2-X2' of FIG. 1, FIG. 2C is a cross-sectional view illustrating some elements of a cross-sectional surface taken along line Y1-Y1' of FIG. 1, and FIG. 2D is a cross-sectional view illustrating some elements of a cross-sectional surface taken along line Y2-Y2' of FIG. 1.

Referring to FIGS. 1 and 2A to 2D, the integrated circuit device 100 may include a substrate 102, including a first device region RX1 and a second device region RX2, and a plurality of fin-type active regions FA protruding from the first device region RX1 and the second device region RX2 of the substrate 102. The plurality of fin-type active regions FA may extend in parallel in a first horizontal direction (an X direction).

The substrate 102 may include a semiconductor, such as silicon (Si) or germanium (Ge), or a compound semiconductor such as SiGe, SiC, GaAs, InAs, InGaAs, or InP. The terms "SiGe", "SiC", "GaAs", "InAs", "InGaAs", and "InP" used herein may each denote a material including elements included in a corresponding term and may not be a chemical formula representing a stoichiometric relationship. The substrate 102 may include a conductive region (for example, an impurity-doped well) or an impurity-doped structure.

An isolation layer 112 covering both sidewalls of each of the plurality of fin-type active regions FA may be disposed on the substrate 102. An inter-device isolation region DTA defining the first device region RX1 and the second device region RX2 may be provided by a deep trench DT. The deep trench DT may be filled with an inter-device isolation layer 114. The isolation layer 112 and the inter-device isolation layer 114 may each include oxide, nitride, or a combination thereof. In the first device region RX1 and the second device region RX2, the plurality of fin-type active regions FA may protrude in a fin shape to a portion on the isolation layer 112.

In FIG. 1, an example in which two fin-type active regions FA are included in each of the first device region RX1 and the second device region RX2 is illustrated, but the inventive concept is not limited to the illustration of FIG. 1. One or more fin-type active regions FA may be disposed in each of the first device region RX1 and the second device region RX2.

A gate line 160 may extend long in a second horizontal direction (a Y direction) intersecting with a first horizontal direction (an X direction) in the plurality of fin-type active regions FA. A plurality of nanosheet stacks NSS may be disposed on a fin top surface FT of each of the plurality of fin-type active regions FA in regions where the plurality of fin-type active regions FA intersect with the gate line 160. Each of the plurality of nanosheet stacks NSS may face the fin top surface FT at a position apart from a corresponding fin-type active region FA in a vertical direction (a Z direction). The term "nanosheet" used herein may denote a conductive structure including a cross-sectional surface substantially vertical to a direction in which a current flows. The nanosheet has to be understood as including a nanowire.

Each of the plurality of nanosheet stacks NSS may include a plurality of nanosheets N1 to N3 which overlap one another in the vertical direction (the Z direction) on the fin top surface FT of a corresponding fin-type active region FA. The plurality of nanosheets N1 to N3 may have different vertical distances (Z-direction distances) from the fin top surface FT. The plurality of nanosheets N1 to N3 may include a first nanosheet N1, a second nanosheet N2, and a third nanosheet N3, which are sequentially stacked on the fin top surface FT of the fin-type active region FA.

In the present embodiment, an example in which one nanosheet stack NSS and one gate line 160 are formed on each of the plurality of fin-type active regions FA is illustrated. However, the number of nanosheet stacks NSS and gate lines 160 disposed on one fin-type active region FA is not limited thereto. For example, a plurality of nanosheet stacks NSS and gate lines 160 may be disposed on one fin-type active region FA.

The number of nanosheets included in a nanosheet stack NSS on a fin-type active region FA in the first device region RX1 may be the same as the number of nanosheets N1 to N3 included in a nanosheet stack NSS on a fin-type active region FA in the second device region RX2. In the present embodiment, an example in which each of the plurality of nanosheet stacks NSS includes three nanosheets N1 to N3 is illustrated, but in the inventive concept, the number of nanosheets configuring each nanosheet stack NSS is not limited thereto. For example, each of the plurality of nanosheet stacks NSS may include or more nanosheets. Each of the plurality of nanosheets N1 to N3 may include a channel region. For example, each of the plurality of nanosheets N1 to N3 may have a thickness which is selected within a range of about 4 nm to about 6 nm, but is not limited thereto. Here, a thickness of each of the plurality of nanosheets N1 to N3 may denote a size in the vertical direction (the Z direction). In embodiments, the plurality of nanosheets N1 to N3 may have substantially the same thickness in the vertical direction (the Z direction). In other embodiments, at least some of the plurality of nanosheets N1 to N3 may have different thicknesses in the vertical direction (the Z direction).

As illustrated in FIGS. 2A and 2B, each of the plurality of nanosheets N1 to N3 may have the same thickness in the first horizontal direction (the X direction). In other embodiments, at least some of the plurality of nanosheets N1 to N3 may have different thicknesses in the first horizontal direction (the X direction). For example, a length of each of the first nanosheet N1 and the second nanosheet N2, which are relatively close to the fin top surface FT, of the plurality of nanosheets N1 to N3 in the first horizontal direction (the X direction) may be less than that of the third nanosheet N3 farthest from the fin top surface FT. In this case, an effective channel length of a channel formed in each of the first and second nanosheets N1 and N2 relatively close to the fin top surface FT may be less than an effective channel length of a channel formed in the third nanosheet N3, and thus, based on the same operating voltage, the amount of current flowing through the first and second nanosheets N1 and N2 may increase.

A plurality of first recesses R1 may be formed in a top of a fin-type active region FA in the first device region RX1, and a plurality of second recesses R2 may be formed in a top of a fin-type active region FA in the second device region RX2. In FIGS. 2A and 2B, an example is illustrated in which a level of a lowermost surface of each of the plurality of first recesses R1 and the plurality of second recesses R2 is lower than that of the fin top surface FT of the fin-type active region FA, but the inventive concept is not limited thereto. A level of the lowermost surface of each of the plurality of first recesses R1 and the plurality of second recesses R2 may be approximately equal or similar to that of the fin top surface FT of the fin-type active region FA.

A plurality of first source/drain regions SD1 may be formed on the plurality of first recesses R1 in the first device region RX1, and a plurality of second source/drain regions SD2 may be formed on the plurality of second recesses R2 in the first device region RX1.

The gate line 160 may extend long in the second horizontal direction (the Y direction) on the fin-type active region FA and the isolation layer 112 in the first device region RX1 and the second device region RX2. The gate line 160 may cover the nanosheet stack NSS and may surround each of the plurality of nanosheets N1 to N3, on the fin-type active region FA. A plurality of nanosheet transistors TR may be formed at a plurality of portions, where the plurality of fin-type active regions FA intersect with the gate line 160, on the substrate 102.

The gate line 160 may include a main gate portion 160M and a plurality of sub gate portions 160S. The main gate portion 160M may cover a top surface of the nanosheet stack NSS and may extend long in the second horizontal direction (the Y direction). The plurality of sub gate portions 160S may be connected to the main gate portion 160M as one body and may each be disposed between two adjacent nanosheets of the plurality of nanosheets N1 to N3 and between the fin-type active region FA and the first nanosheet N1.

The main gate portion 160M of the gate line 160 may include a connection protrusion portion 160P, which includes a protrusion top surface 160U at a first vertical level LV1 on the substrate 102, and a recess top surface 160L which extends long in the second horizontal direction (the Y direction) from the connection protrusion portion 160P at a second vertical level LV2, which is lower than the first vertical level LV1. In embodiments, a height difference between the first vertical level LV1 and the second vertical level LV2 may be about 2 nm to about 20 nm, but is not limited thereto.

The main gate portion 160M may extend long in the second horizontal direction (the Y direction) in the first device region RX1, the inter-device isolation region DTA, and the second device region RX2. The recess top surface 160L of the main gate portion 160M in the vertical direction (the Z direction) may be higher than an uppermost surface of the nanosheet stack NSS, namely, an uppermost surface of the third nanosheet N3. In the vertical direction (the Z direction), a thickness of each of the plurality of sub gate portions 160S may be less than that of the main gate portion 160M.

The recess top surface 160L of the main gate portion 160M may overlap the plurality of fin-type active regions FA and the plurality of nanosheet stacks NSS in the vertical direction (the Z direction) in the first device region RX1 and the second device region RX2. The connection protrusion portion 160P of the main gate portion 160M may overlap the inter-device isolation layer 114 in the vertical direction (the Z direction) in the inter-device isolation region DTA. The connection protrusion portion 160P of the main gate portion 160M may include a portion which overlaps the plurality of fin-type active regions FA and the plurality of nanosheet stacks NSS in the vertical direction (the Z direction) in the first device region RX1 and the second device region RX2.

The gate line 160 may include metal, metal nitride, metal carbide, or a combination thereof. The metal may be selected from among titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from among TiN and TaN. The metal carbide may include TiAlC.

A gate dielectric layer 152 may be disposed between the nanosheet stack NSS and the gate line 160. The gate dielectric layer 152 may include a portion, which covers a surface of each of the plurality of nanosheets N1 to N3, and a portion which covers sidewalls of the main gate portion 160M. In embodiments, the gate dielectric layer 152 may include a stack structure of an interface layer and a high-k dielectric layer. The interface layer may include a low-k dielectric material layer having a dielectric constant of about 9 or less, and for example, may include silicon oxide, silicon oxynitride, or a combination thereof. In embodiments, the interface layer may be omitted. The high-k dielectric layer may include a material which has a greater dielectric constant than silicon oxide. For example, the high-k dielectric layer may have a dielectric constant of about 10 to about 25. The high-k dielectric layer may include hafnium oxide, but is not limited thereto.

In embodiments, the plurality of nanosheets N1 to N3 may include a semiconductor layer including the same element. For example, each of the plurality of nanosheets N1 to N3 may include a Si layer. The plurality of nanosheets N1 to N3 in the first device region RX1 may be doped with the same conductive dopant as that of the first source/drain region SD1. The plurality of nanosheets N1 to N3 in the second device region RX2 may be doped with the same conductive dopant as that of the second source/drain region SD2. For example, the plurality of nanosheets N1 to N3 in the first device region RX1 may include a Si layer doped with an n-type dopant, and the plurality of nanosheets N1 to N3 in the second device region RX2 may include a Si layer doped with a p-type dopant.

Both sidewalls of each of the gate line 160 may be covered by a plurality of outer insulation spacers 118, on the fin-type active region FA, the isolation layer 112, and the inter-device isolation layer 114. The plurality of outer insulation spacers 118 may cover both sidewalls of the main gate portion 160M, on top surfaces of the plurality of nanosheet stacks NSS. Each of the plurality of outer insulation spacers 118 may be apart from the gate line 160 with the gate dielectric layer 152 therebetween. Each of the plurality of outer insulation spacers 118 may include silicon nitride, silicon oxide, SiCN, SiBN, SiON, SiOCN, SiBCN, SiOC, or a combination thereof. The terms "SiCN", "SiBN", "SiON", "SiOCN", "SiBCN", and "SiOC" used herein may each denote a material including elements included in a corresponding term and may not be a chemical formula representing a stoichiometric relationship.

As illustrated in FIG. 2A, a plurality of inner insulation spacers 120 may be disposed between two adjacent nanosheets of the plurality of nanosheets N1 to N3 in the first device region RX1 and may be disposed between the plurality of sub gate portions 160S and the first source/drain region SD1, and between the fin-type active region FA and the first nanosheet N1. Both sidewalls of each of the plurality of sub gate portions 160S in the first device region RX1 may be covered by the inner insulation spacer 120 with the gate dielectric layer 152 therebetween. Each of the plurality of sub gate portions 160S may be apart from the first source/drain region SD1 with the gate dielectric layer 152 and the inner insulation spacer 120 therebetween. Each of the plurality of inner insulation spacers 120 may contact the first source/drain region SD1. At least some of the plurality of inner insulation spacers 120 may overlap the outer insulation spacer 118 in the vertical direction (the Z direction). The inner insulation spacers 120 may include silicon nitride, silicon oxide, SiCN, SiBN, SiON, SiOCN, SiBCN, SiOC, or a combination thereof. The inner insulation spacer 120 may further include an air gap. In embodiments, the inner insulation spacer 120 may include the same material as that of the outer insulation spacer 118. In other embodiments, the outer insulation spacer 118 and the inner insulation spacer 120 may include different materials.

Each of the plurality of first source/drain regions SD1 in the first device region RX1 may face the plurality of sub gate portions 160S with the inner insulation spacer 120 therebetween in the first horizontal direction (the X direction). The plurality of first source/drain regions SD1 may not include a portion which contacts the gate dielectric layer 152.

As illustrated in FIG. 2B, both sidewalls of each of the plurality of sub gate portions 160S may be apart from the second source/drain region SD2 with the gate dielectric layer 152 therebetween, between two adjacent nanosheets of the plurality of nanosheets N1 to N3 in the second device region RX2 and between the fin-type active region FA and the first nanosheet N1. The gate dielectric layer 152 may include a portion which contacts the second source/drain region SD2. Each of the plurality of second source/drain regions SD2 may face the nanosheet stack NSS and the plurality of sub gate portions 160S in the first horizontal direction (the X direction).

In embodiments, the gate line 160 may have a structure in which a metal nitride layer, a metal layer, a conductive capping layer, and a gap-fill metal layer are sequentially stacked. The metal nitride layer and the metal layer may include at least one metal selected from among Ti, Ta, W, Ru, Nb, Mo, and Hf. The gap-fill metal layer may include a W layer or an Al layer. The gate lines 160 may each include a work function metal containing layer. The work function metal containing layer may include at least one metal selected from among Ti, W, Ru, Nb, Mo, Hf, Ni, Co, Pt, Yb, Tb, Dy, Er, and Pd. In some embodiments, each of the gate lines 160 may include a stack structure of TiAlC/TiN/W, a stack structure of TiN/TaN/TiAlC/TiN/W, or a stack structure of TiN/TaN/TiN/TiAlC/TiN/W, but is not limited thereto.

As illustrated in FIGS. 2A to 2C, a top surface of each of the gate line 160 and the gate dielectric layer 152 may be covered by a capping insulation pattern 164. The capping insulation pattern 164 may cover the protrusion top surface 160U and the recess top surface 160L of the main gate portion 160M. The capping insulation pattern 164 may include silicon nitride.

In the first device region RX1, the main gate portion 160M of the gate line 160 may be apart from the first source/drain region SD1 with the outer insulation spacer 118 therebetween. In the second device region RX2, the main gate portion 160M of the gate line 160 may be apart from the second source/drain region SD2 with the outer insulation spacer 118 therebetween.

In embodiments, the first device region RX1 may be an NMOS transistor region, and the second device region RX2 may be a PMOS transistor region. In this case, the plurality of first source/drain regions SD1 in the first device region RX1 may include a Si layer doped with an n-type dopant, and the plurality of second source/drain regions SD2 in the second device region RX2 may include a SiGe layer doped with a p-type dopant. The n-type dopant may be selected from among phosphorus (P), arsenic (As), and antimony (Sb). The p-type dopant may be selected from among boron (B) and gallium (Ga).

As illustrated in FIG. 2D, the plurality of first source/drain regions SD1 in the first device region RX1 and the plurality of second source/drain regions SD2 in the second device region RX2 may have different shapes and sizes. However, the inventive concept is not limited thereto, and the plurality of first and second source/drain regions SD1 and SD2 having various shapes and sizes may be formed in the first device region RX1 and the second device region RX2.

The plurality of first and second source/drain regions SD1 and SD2 may be covered by an insulation liner 142. The insulation liner 142 may conformally cover a surface of each of the plurality of first and second source/drain regions SD1 and SD2 and the outer insulation spacer 118. The insulation liner 142 may include SiN, SiCN, SiBN, SiON, SiOCN, SiBCN, SiOC, SiO2, or a combination thereof.

An inter-gate insulation layer 144 and an insulation structure 190 may be formed on the insulation liner 142. The inter-gate insulation layer 144 may include silicon nitride, silicon oxide, SiON, SiOCN, or a combination thereof. The insulation structure 190 may include an etch stop layer 190A and an inter-layer insulation layer 190B, which are sequentially stacked on the inter-gate insulation layer 144. The etch stop layer 190A may include silicon carbide (SiC), SiN, nitrogen-doped silicon carbide (SiC:N), SiOC, AlN, AlON, AlO, AlOC, or a combination thereof. The inter-layer insulation layer 190B may include an oxide layer, a nitride layer, an ultra low-k (ULK) layer having an ultra low dielectric constant K of about 2.2 to about 2.4, or a combination thereof. For example, the inter-layer insulation layer 190B may include a tetraethylorthosilicate (TEOS) layer, a high density plasma (HDP) layer, a boro-phospho-silicate glass (BPSG) layer, a flowable chemical vapor deposition (FCVD) oxide layer, a SiON layer, a SiN layer, a SiOC layer, a SiCOH layer, or a combination thereof.

A plurality of source/drain contacts 174 and a plurality of source/drain via contacts 192 may be formed on the plurality of first and second source/drain regions SD1 and SD2. The plurality of first and second source/drain regions SD1 and SD2 may be connected to an upper conductive line through the plurality of source/drain contacts 174 and the plurality of source/drain via contacts 192. The plurality of source/drain contacts 174 may include an uppermost surface at a third vertical level LV3, which is higher than the first vertical level LV1.

A metal silicide layer 172 may be formed between the first and second source/drain regions SD1 and SD2 and the source/drain contact 174. In embodiments, the metal silicide layer 172 may include Ti, W, Ru, Nb, Mo, Hf, Ni, Co, Pt, Yb, Tb, Dy, Er, or Pd. For example, the metal silicide layer 172 may include titanium silicide. The plurality of source/drain contacts 174 may pass through the inter-gate insulation layer 144 and the insulation liner 142 in the vertical direction (the Z direction) and may contact the metal silicide layer 172. The plurality of source/drain via contacts 192 may pass through the insulation structure 190 in the vertical direction (the Z direction) and may contact the source/drain contact 174.

As illustrated in FIG. 2C, a gate contact 184 and a gate via contact 194 may be formed on the gate line 160. The gate line 160 may be connected to an upper conductive line through the gate contact 184 and the gate via contact 194. The gate contact 184 and the gate via contact 194 may be configured to be connected to the connection protrusion portion 160P of the main gate portion 160M in the inter-device isolation region DTA. The gate contact 184 may pass through the capping insulation pattern 164 in the vertical direction (the Z direction) and may contact a top surface of the connection protrusion portion 160P of the gate line 160. The gate via contact 194 may pass through the insulation structure 190 in the vertical direction (the Z direction) and may contact a top surface of the gate contact 184. A vertical level of an uppermost surface of the gate contact 184 may be the same as or similar to that of an uppermost surface of each of the plurality of source/drain contacts 174.

A stack structure of the gate contact 184 and the gate via contact 194 each disposed on the gate line 160 and a stack structure of the source/drain contact 174 and the source/drain via contact 192 each disposed in at least one source/drain region of the first and second source/drain regions SD1 and SD2 disposed adjacent to the gate line 160 may be arranged to be staggered to not be disposed on a straight line in the first horizontal direction (the X direction).

In FIGS. 1 and 2C, in the integrated circuit device 100, an example is illustrated in which the connection protrusion portion 160P of the gate line 160a and the gate contact 184 and the gate via contact each connected to the gate line 160 through the connection protrusion portion 160P are disposed in the inter-device isolation region DTA, but the inventive concept is not limited thereto. For example, the connection protrusion portion 160P of the gate line 160, the gate contact 184, and the gate via contact 194 may be disposed in either one or both of the first device region RX1 and the second device region RX2.

The plurality of source/drain contacts 174 may each include a conductive barrier layer 174A and a metal plug 174B. The plurality of source/drain via contacts 192 may each include a conductive barrier layer 192A and a metal plug 192B. The gate contact 184 may include a conductive barrier layer 184A and a metal plug 184B. The gate via contact 194 may include a conductive barrier layer 194A and a metal plug 194B. The conductive barrier layers 174A, 184A, 192A, and 194A may each include Ti, Ta, TiN, TaN, or a combination thereof. The metal plugs 174B, 184B, 192B, and 194B may each include W, Co, Cu, Ru, Mn, or a combination thereof. However, materials of the conductive barrier layers 174A, 184A, 192A, and 194A and the metal plugs 174B, 184B, 192B, and 194B are not limited thereto.

In embodiments, a sidewall of each of the plurality of source/drain contacts 174 and gate contacts 184 may be surrounded by a contact insulation spacer. The contact insulation spacer may include SiCN, SiCON, silicon nitride (SiN), or a combination thereof, but is not limited thereto.

As illustrated in FIGS. 2A, 2B, and 2D, the plurality of source/drain contacts 174 may have different heights on the basis of a position. Each of the plurality of source/drain contacts 174 may include a first segment S1 and a second segment S2, which have different heights and are connected to each other as one body in the vertical direction (the Z direction).

In the source/drain contact 174, a height of the first segment S1 in the vertical direction (the Z direction) may be greater than that of the second segment S2 in the vertical direction (the Z direction). In embodiments, in the vertical direction (the Z direction), a height of an uppermost surface of the first segment S1 may be greater than that of an uppermost surface of the gate line 160. A height of an uppermost surface of the second segment S2 may be the same as or different from that of the uppermost surface of the gate line 160. For example, a height of the uppermost surface of the second segment S2 may be lower or higher than that of the uppermost surface of the gate line 160. Each of the plurality of source/drain via contacts 192 may contact a top surface of the first segment S1 of the source/drain contact 174.

A top surface of the second segment S2 of the source/drain contact 174 may be covered by a buried insulation layer 176. The buried insulation layer 176 may fill an upper space of the second segment S2 of the source/drain contact 174. A top surface of the buried insulation layer 176 and a top surface of the capping insulation pattern 164 may be covered by the insulation structure 190. The buried insulation layer 176 may include silicon oxide, SiOC, SiOCN, SiON, SiCN, SiN, or a combination thereof, but is not limited thereto.

In the integrated circuit device 100 illustrated in FIGS. 1 and 2A to 2D, the connection protrusion portion 160P including the protrusion top surface 160U at the first vertical level LV1, which is relatively high, may be included in a portion, connected to the gate contact 184, of the gate line 160, and another portion, which is near the connection protrusion portion 160P, of the gate line 160 may include the recess top surface 160L at the second vertical level LV2, which is lower than the first vertical level LV1. Therefore, in the integrated circuit device 100, an undesired parasitic capacitance between conductive regions (i.e., a gate and a source/drain contact) adjacent to each other may be reduced. Further, a parasitic capacitance occurring due to different nodes adjacent to each other may be reduced. Also, a height difference in the vertical direction (the Z direction) between the protrusion top surface 160U at the first vertical level LV1 and the recess top surface 160L at the second vertical level LV2 may be variously adjusted, and thus, a work function for transistors including the gate line 160 may be easily controlled. Therefore, by using the gate line 160 including the protrusion top surface 160U and the recess top surface 160L, which are at various vertical levels, and have various sizes on the basis of a desired condition, the reliability of an integrated circuit device may be enhanced by a relatively simple method.

Figure 3:
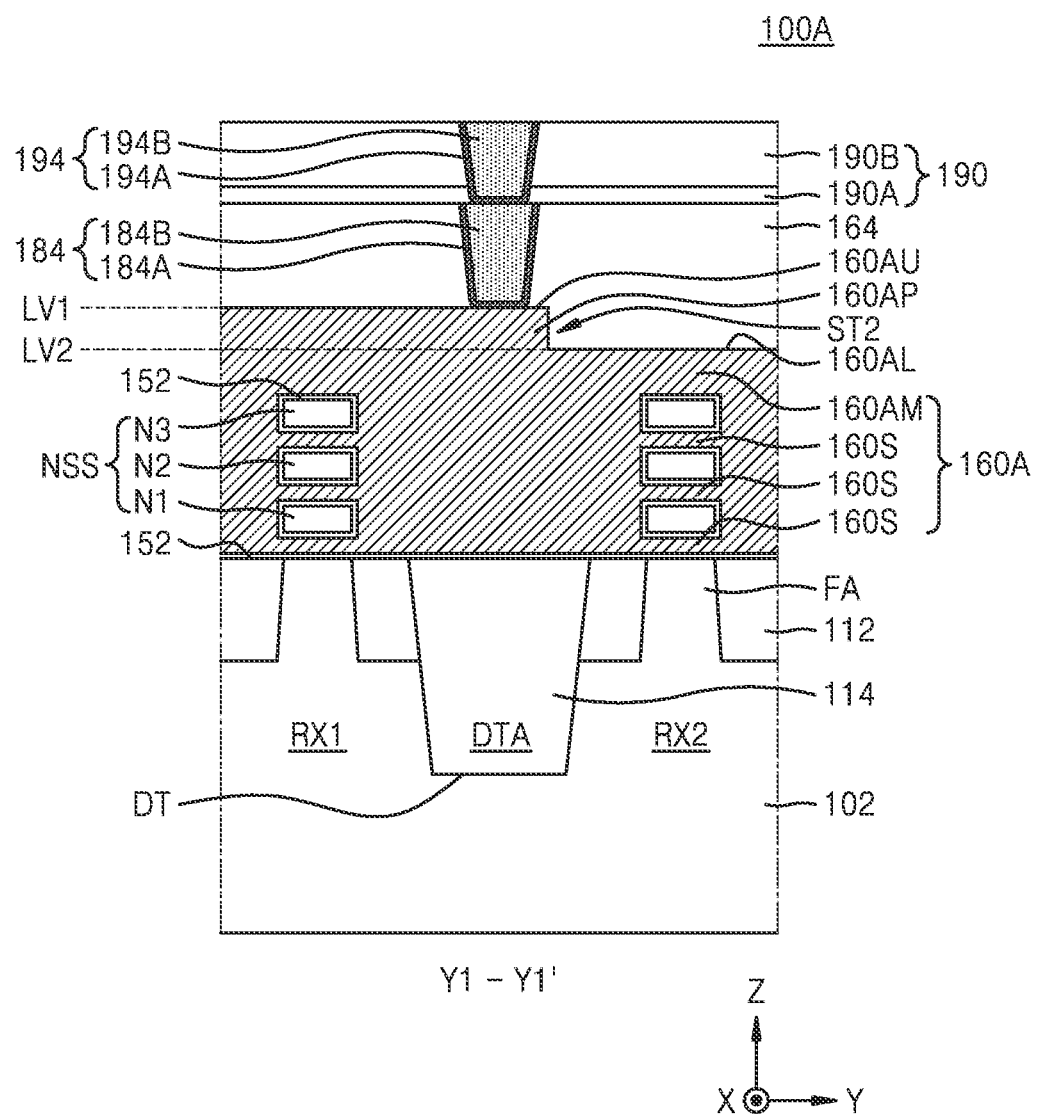
FIG. 3 is a cross-sectional view for describing an integrated circuit device according to other embodiments.

FIG. 3 is a cross-sectional view for describing an integrated circuit device 100A according to other embodiments. In FIG. 3, some elements of a portion corresponding to a cross-sectional surface taken along line Y1-Y1' of FIG. 1 is illustrated.

Referring to FIG. 3, the integrated circuit device 100A may have substantially the same configuration as that of the integrated circuit device 100 described above with reference to FIGS. 1 and 2A to 2D. The integrated circuit device 100A may include a gate line 160A instead of the gate line 160 of the integrated circuit device 100.

The gate line 160A may have substantially the same configuration as that of the gate line 160 described above with reference to FIGS. 2A to 2C. A main gate portion 160AM of the gate line 160A may include a connection protrusion portion 160AP, which includes a protrusion top surface 160AU extending long in a second horizontal direction (a Y direction) at a first vertical level LV1 on a substrate 102, and a recess top surface 160AL, which extends long in the second horizontal direction (the Y direction) from the connection protrusion portion 160AP at a second vertical level LV2, which is lower than the first vertical level LV1. The connection protrusion portion 160AP of the main gate portion 160AM may be disposed in only the first device region RX1 among the first device region RX1 and the second device region RX2 and may not be disposed in the second device region RX2. The recess top surface 160AL of the main gate portion 160AM may be disposed in only the second device region RX2 among the first device region RX1 and the second device region RX2 and may not be disposed in the first device region RX1. A stepped portion ST2 between the connection protrusion portion 160AP and the recess top surface 160AL of the main gate portion 160AM may overlap an inter-device isolation layer 114 in a vertical direction (a Z direction) in an inter-device isolation region DTA.

The connection protrusion portion 160AP of the main gate portion 160AM may overlap a plurality of fin-type active regions FA and a plurality of nanosheet stacks NSS in the vertical direction (the Z direction) in the first device region RX1. The recess top surface 160AL of the main gate portion 160AM may overlap a plurality of fin-type active regions FA and a plurality of nanosheet stacks NSS in the vertical direction (the Z direction) in the second device region RX2.

Figure 4A:
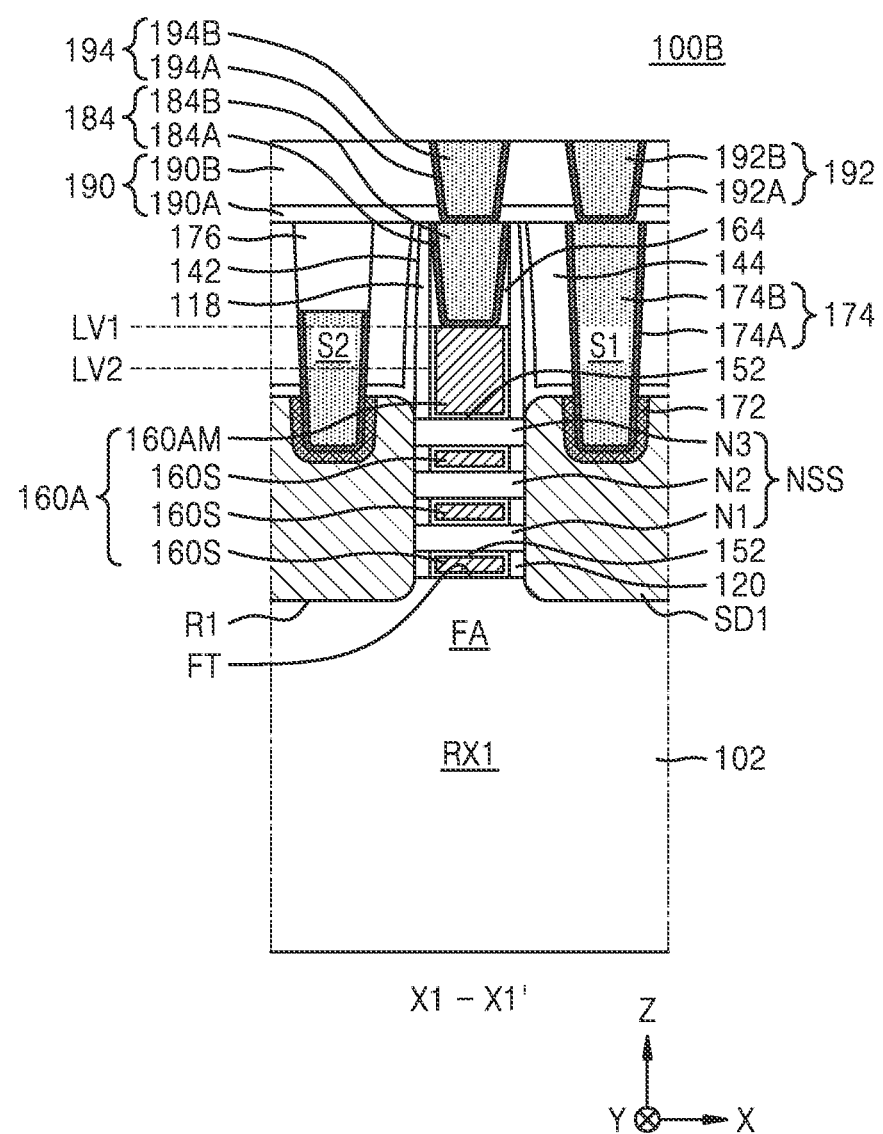
FIGS. 4A and 4B are cross-sectional views for describing an integrated circuit device according to other embodiments.
Figure 4B:
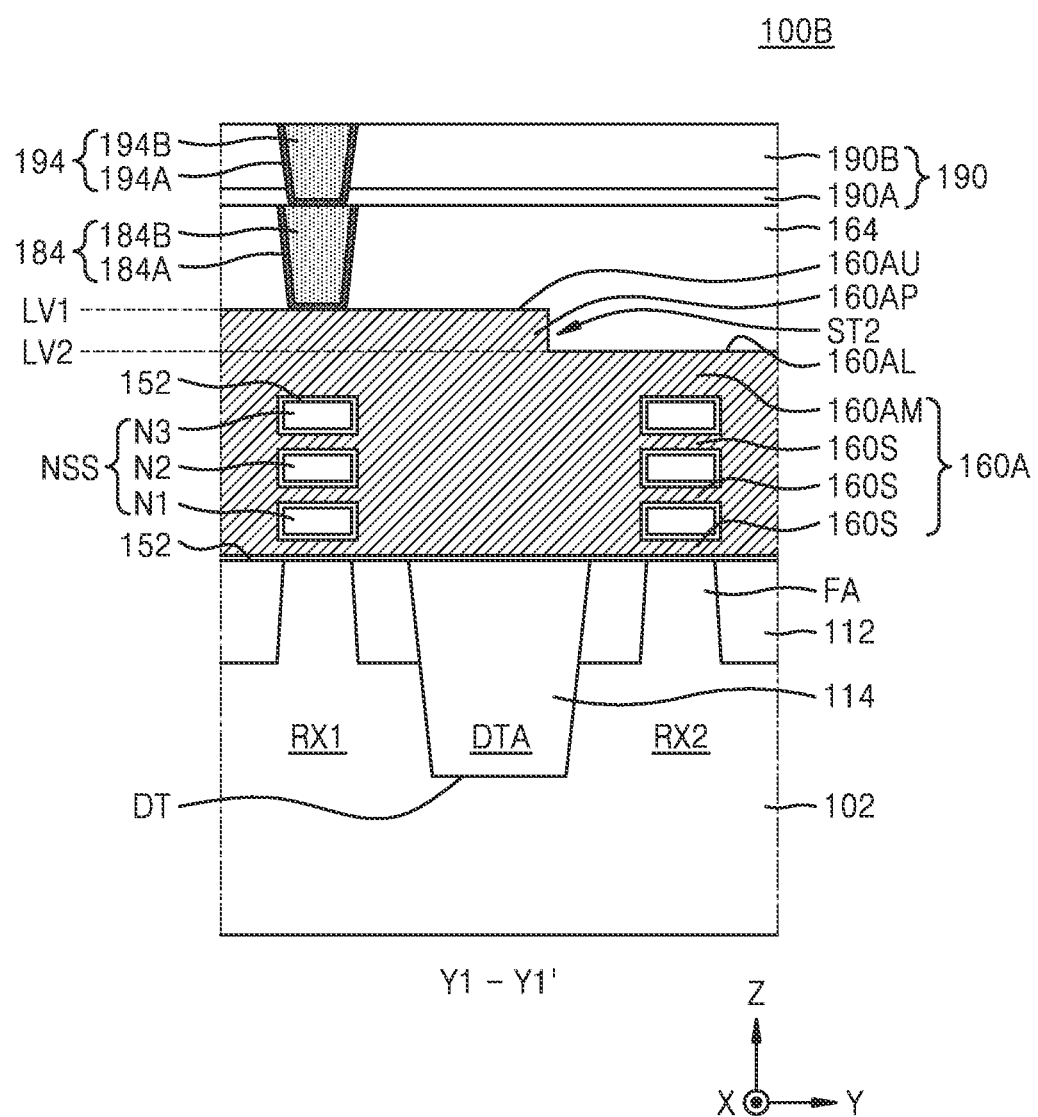

FIGS. 4A and 4B are cross-sectional views for describing an integrated circuit device 100B according to other embodiments. In FIG. 4A, some elements of a portion corresponding to a cross-sectional surface taken along line X1-X1' of FIG. 1 is illustrated. In FIG. 4B, some elements of a portion corresponding to a cross-sectional surface taken along line Y1-Y1' of FIG. 1 is illustrated.

Referring to FIGS. 4A and 4B, the integrated circuit device 100B may have substantially the same configuration as that of the integrated circuit device 100A described above with reference to FIG. 3. In the integrated circuit device 100B, a stack structure of a gate contact 184 and a gate via contact 194 each connected to a gate line 160A may be disposed in a first device region RX1. The gate contact 184 may contact a protrusion top surface 160AU of a connection protrusion portion 160AP included in a main gate portion 160AM in the first device region RX1. The stack structure of the gate contact 184 and the gate via contact 194 each connected to the gate line 160A may overlap a plurality of fin-type active regions FA and a plurality of nanosheet stacks NSS in a vertical direction (a Z direction) in the first device region RX1.

As illustrated in FIG. 4A, the stack structure of the gate contact 184 and the gate via contact 194 each disposed on the gate line 160A and a stack structure of a source/drain contact 174 and a source/drain via contact 192 each disposed on a first source/drain region SD1 disposed adjacent to the gate line 160A may be disposed on a straight line in a first horizontal direction (an X direction).

Figure 5:
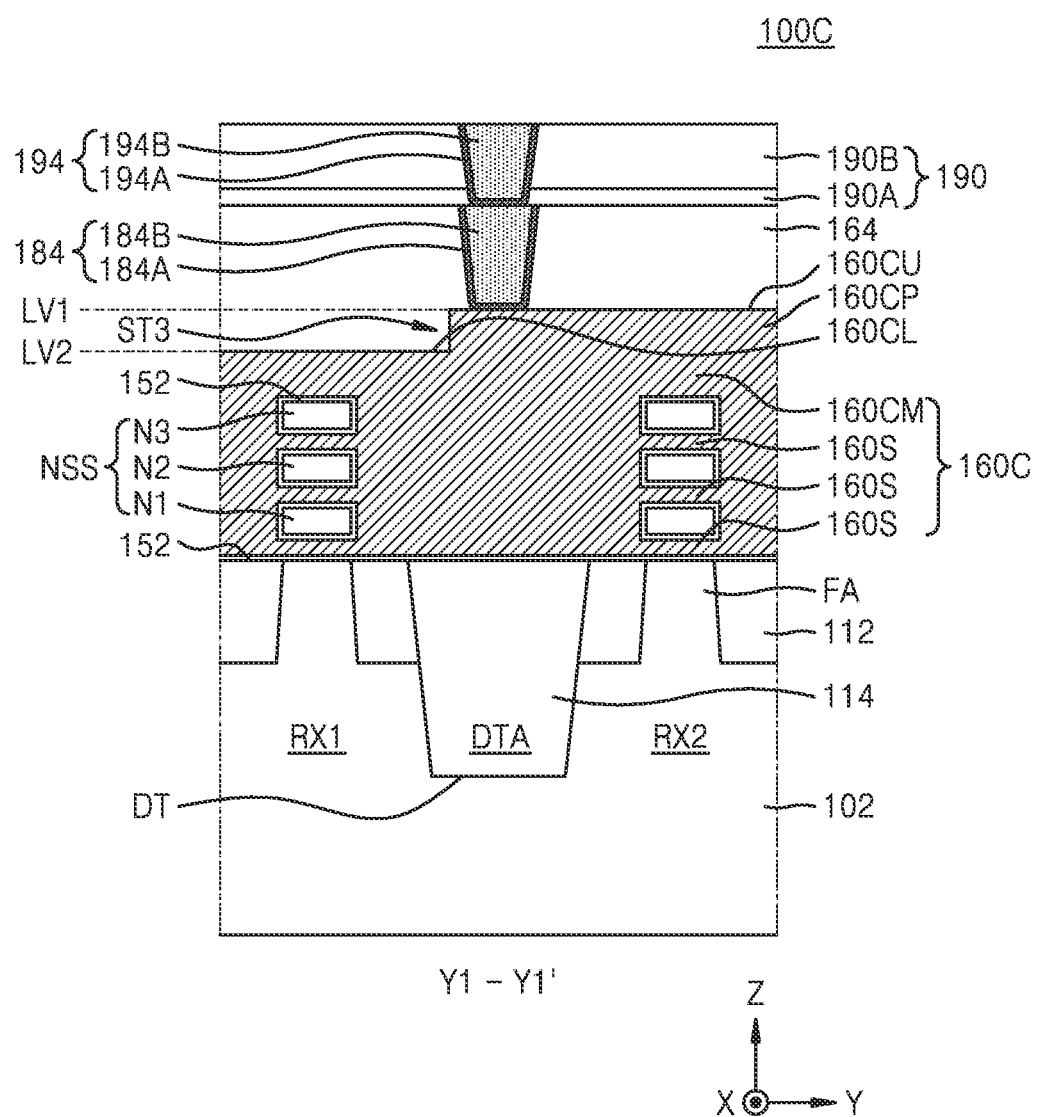
FIG. 5 is a cross-sectional view for describing an integrated circuit device according to other embodiments.

FIG. 5 is a cross-sectional view for describing an integrated circuit device 100C according to other embodiments. In FIG. 5, some elements of a portion corresponding to a cross-sectional surface taken along line Y1-Y1' of FIG. 1 is illustrated.

Referring to FIG. 5, the integrated circuit device 100C may have substantially the same configuration as that of the integrated circuit device 100 described above with reference to FIGS. 1 and 2A to 2D. The integrated circuit device 100C may include a gate line 160C instead of the gate line 160 of the integrated circuit device 100.

The gate line 160C may have substantially the same configuration as that of the gate line 160 described above with reference to FIGS. 2A to 2C. A main gate portion 160CM of the gate line 160C may include a connection protrusion portion 160CP, which includes a protrusion top surface 160CU extending long in a second horizontal direction (a Y direction) at a first vertical level LV1 on a substrate 102, and a recess top surface 160CL, which extends long in the second horizontal direction (the Y direction) from the connection protrusion portion 160CP at a second vertical level LV2, which is lower than the first vertical level LV1. The connection protrusion portion 160CP of the main gate portion 160CM may be disposed in only a second device region RX2 among a first device region RX1 and the second device region RX2 and may not be disposed in the first device region RX1. The recess top surface 160CL of the main gate portion 160CM may be disposed in only the first device region RX1 among the first device region RX1 and the second device region RX2 and may not be disposed in the second device region RX2. A stepped portion ST3 between the connection protrusion portion 160CP and the recess top surface 160CL of the main gate portion 160CM may overlap an inter-device isolation layer 114 in a vertical direction (a Z direction) in an inter-device isolation region DTA.

The connection protrusion portion 160CP of the main gate portion 160CM may overlap a plurality of fin-type active regions FA and a plurality of nanosheet stacks NSS in the vertical direction (the Z direction) in the second device region RX2. The recess top surface 160CL of the main gate portion 160CM may overlap a plurality of fin-type active regions FA and a plurality of nanosheet stacks NSS in the vertical direction (the Z direction) in the first device region RX1.

Figure 6A:
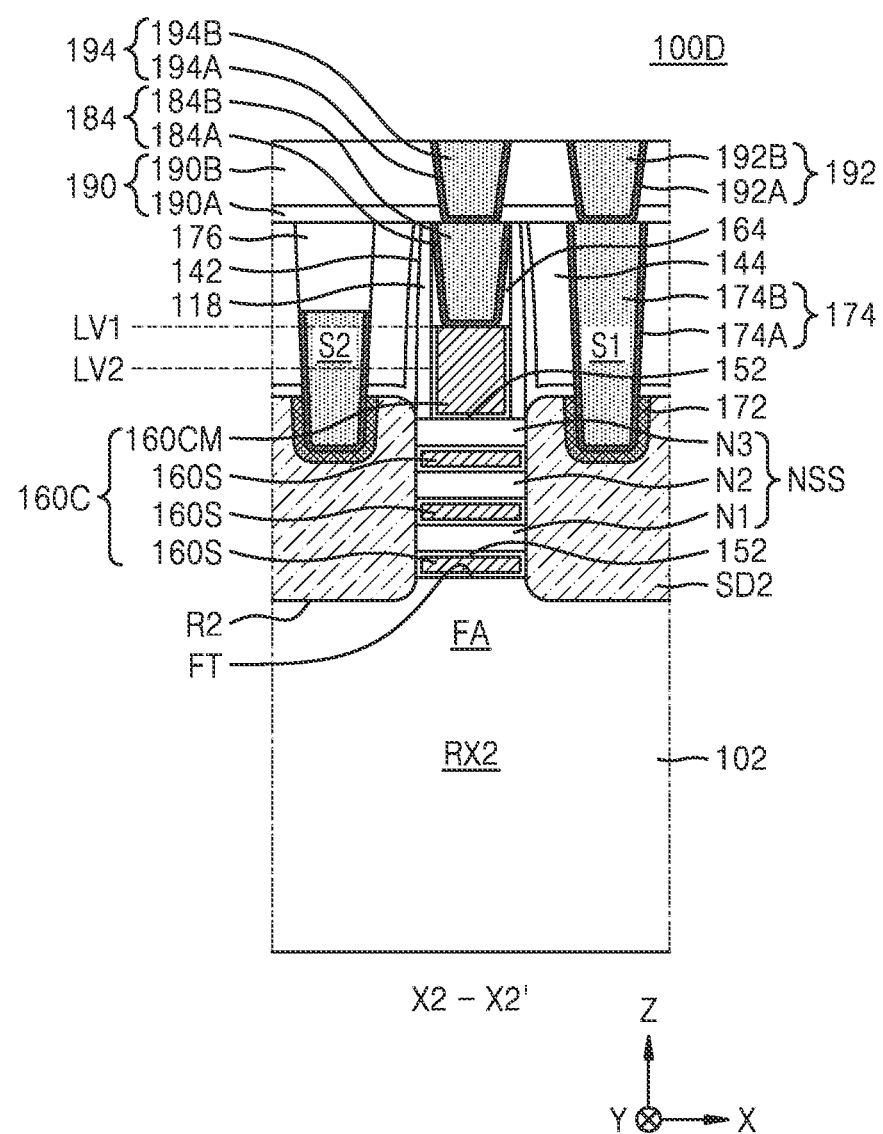
FIGS. 6A and 6B are cross-sectional views for describing an integrated circuit device according to other embodiments.
Figure 6B:
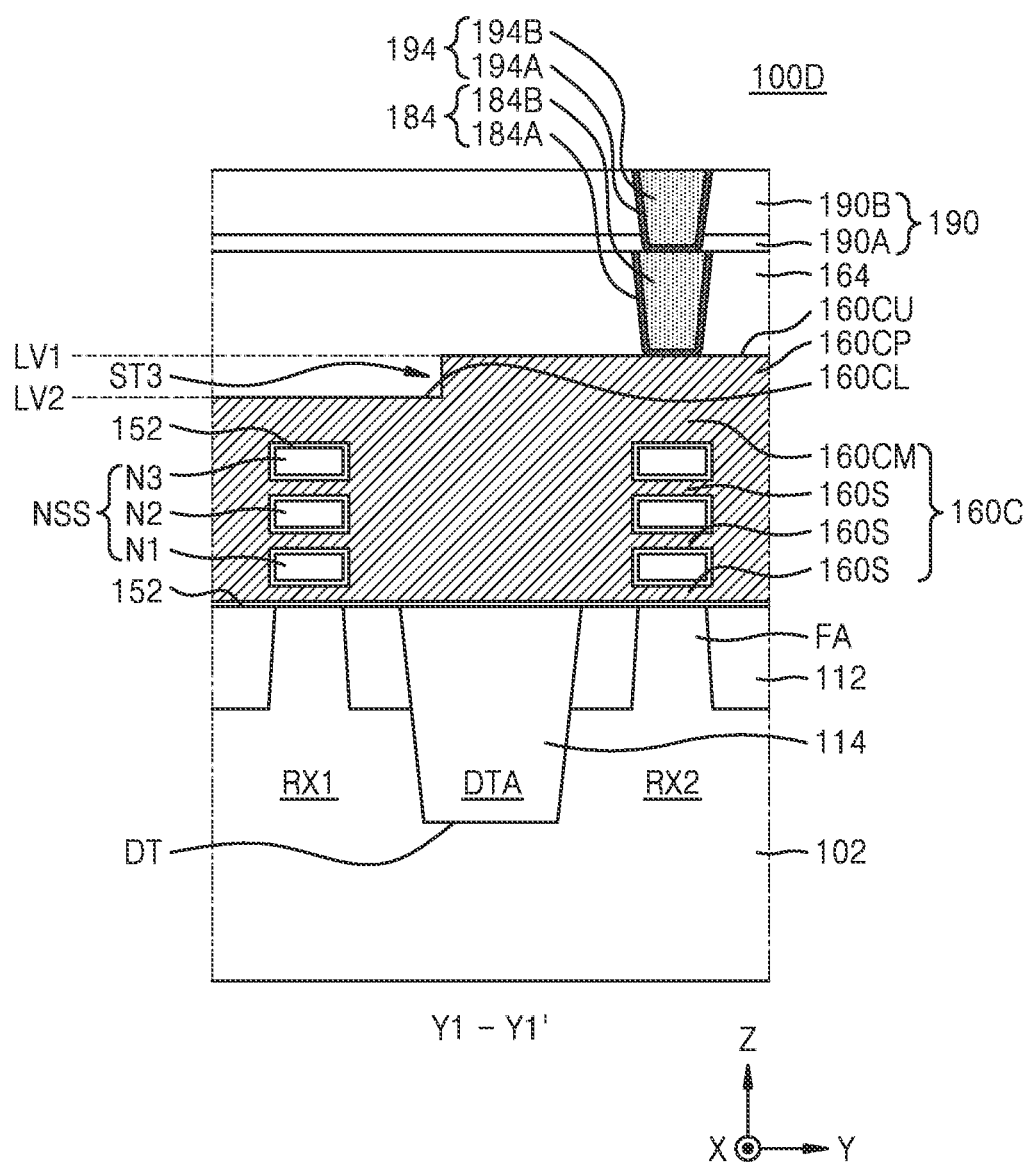

FIGS. 6A and 6B are cross-sectional views for describing an integrated circuit device 100D according to other embodiments. In FIG. 6A, some elements of a portion corresponding to a cross-sectional surface taken along line X2-X2' of FIG. 1 is illustrated. In FIG. 6B, some elements of a portion corresponding to a cross-sectional surface taken along line Y1-Y1' of FIG. 1 is illustrated.

Referring to FIGS. 6A and 6B, the integrated circuit device 100D may have substantially the same configuration as that of the integrated circuit device 100C described above with reference to FIG. 5. In the integrated circuit device 100D, a stack structure of a gate contact 184 and a gate via contact 194 each connected to a gate line 160C may be disposed in a second device region RX2. The gate contact 184 may contact a connection protrusion portion 160CP of a protrusion top surface 160CU included in a main gate portion 160CM in the second device region RX2. The stack structure of the gate contact 184 and the gate via contact 194 each connected to the gate line 160C may overlap a plurality of fin-type active regions FA and a plurality of nanosheet stacks NSS in a vertical direction (a Z direction) in the second device region RX2.

As illustrated in FIG. 6A, the stack structure of the gate contact 184 and the gate via contact 194 each disposed on the gate line 160C and a stack structure of a source/drain contact 174 and a source/drain via contact 192 each disposed on a second source/drain region SD2 disposed adjacent to the gate line 160C may be disposed on a straight line in a first horizontal direction (an X direction).

Figure 7:
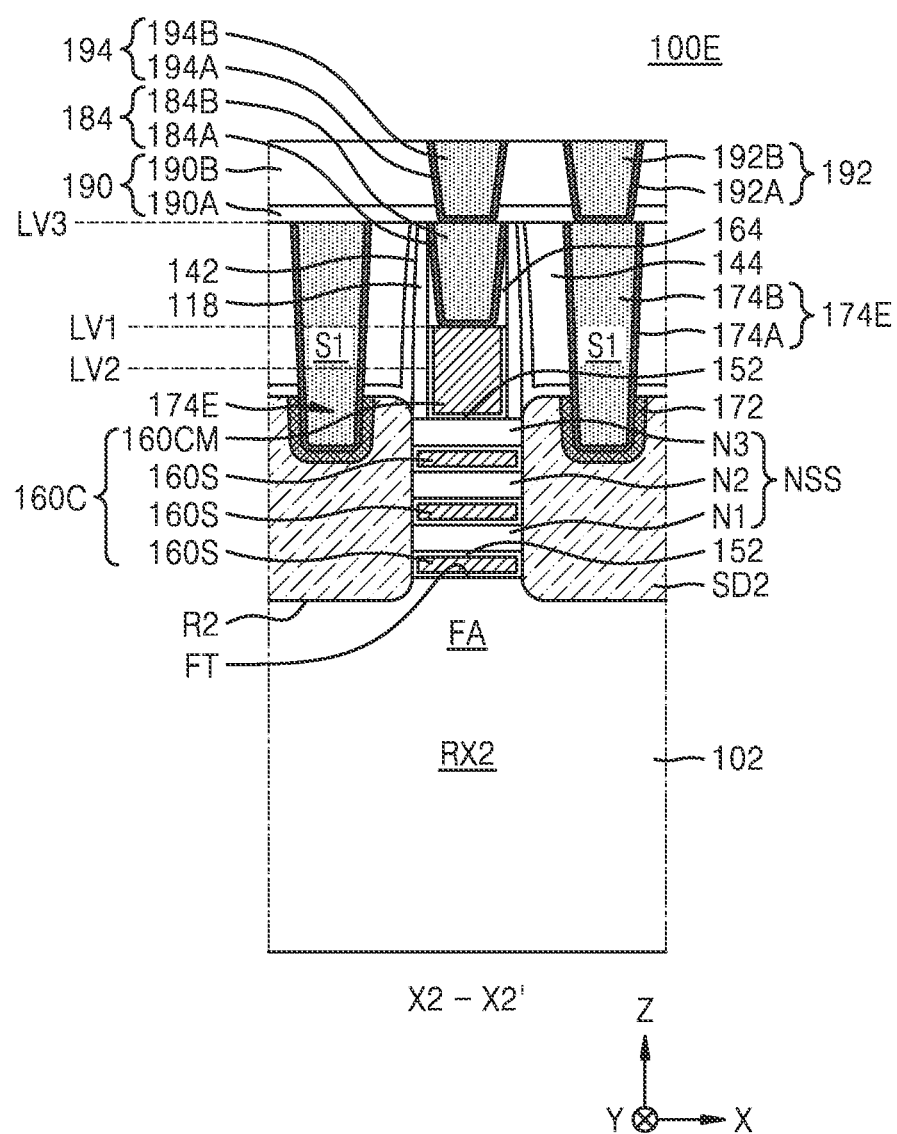
FIG. 7 is a cross-sectional view for describing an integrated circuit device according to other embodiments.

FIG. 7 is a cross-sectional view for describing an integrated circuit device 100E according to other embodiments. In FIG. 7, some elements of a portion corresponding to a cross-sectional surface taken along line X2-X2' of FIG. 1 is illustrated.

Referring to FIG. 7, the integrated circuit device 100E may have substantially the same configuration as that of the integrated circuit device 100D described above with reference to FIGS. 6A and 6B. The integrated circuit device 100E may include a source/drain contact 174E instead of the source/drain contact 174 of the integrated circuit device 100D.

The source/drain contact 174E may have substantially the same configuration as that of the source/drain contact 174 described above with reference to FIGS. 2A to 2D. The source/drain contact 174E may not include a second segment S2 of the source/drain contact 174. A height of a top surface of the source/drain contact 174E may be approximately constant. The top surface of the source/drain contact 174E may extend to be flat at a third vertical level LV3.

A stack structure of a gate contact 184 and a gate via contact 194 each disposed on a gate line 160C and a pair of source/drain contacts 174E disposed on a pair of second source/drain regions SD2 disposed adjacent to the gate line 160C at both sides of the gate line 160C may be disposed on a straight line in a first horizontal direction (an X direction).

Figure 8:
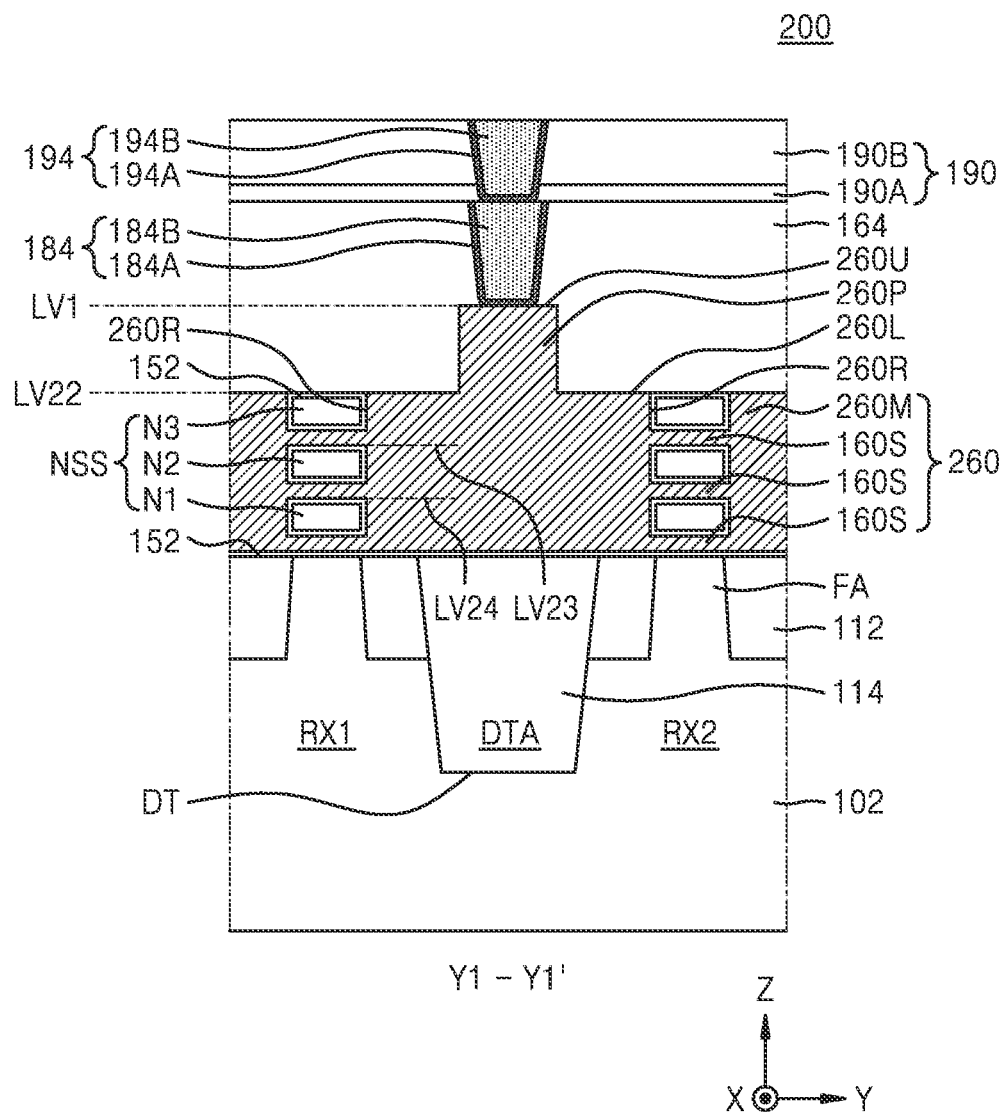
FIG. 8 is a cross-sectional view for describing an integrated circuit device according to other embodiments.

FIG. 8 is a cross-sectional view for describing an integrated circuit device 200 according to other embodiments. In FIG. 8, some elements of a portion corresponding to a cross-sectional surface taken along line Y1-Y1' of FIG. 1 is illustrated.

Referring to FIG. 8, the integrated circuit device 200 may have substantially the same configuration as that of the integrated circuit device 100 described above with reference to FIGS. 1 and 2A to 2D. The integrated circuit device 200 may include a gate line 260 instead of the gate line 160 of the integrated circuit device 100.

The gate line 260 may have substantially the same configuration as that of the gate line 160 described above with reference to FIGS. 2A to 2C. A main gate portion 260M of the gate line 260 may include a connection protrusion portion 260P, which includes a protrusion top surface 260U at a first vertical level LV1 on a substrate 102, and a recess top surface 260L, which extends long in a second horizontal direction (a Y direction) from the connection protrusion portion 260P at a second vertical level LV2, which is lower than the first vertical level LV1. In embodiments, a height difference between the first vertical level LV1 and the second vertical level LV22 may be about 2 nm to about 20 nm, but is not limited thereto.

The recess top surface 260L of the main gate portion 260M in a vertical direction (a Z direction) may be higher than an uppermost surface of a nanosheet stack NSS, namely, an uppermost surface of a third nanosheet N3. A vertical level of the recess top surface 260L of the main gate portion 260M may be the same as or similar to a vertical level of a top surface of a portion, covering an uppermost surface of the third nanosheet N3, of a gate dielectric layer 152. A top surface of the gate dielectric layer 152 at the same vertical level as the recess top surface 260L of the main gate portion 260M may include an interface layer or a high-k dielectric layer configuring the gate dielectric layer 152. Detailed descriptions of the interface layer and the high-k dielectric layer each configuring the gate dielectric layer 152 will be described below with reference to FIGS. 2A to 2C.

The recess top surface 260L of the main gate portion 260M may include a recess portion 260R at a position overlapping a fin-type active region FA and a nanosheet stack NSS in a vertical direction (a Z direction) in a first device region RX1 and a second device region RX2. The recess portion 260R may be filled with the third nanosheet N3 and a gate dielectric layer 152 covering a side surface, a bottom surface, and a top surface of the third nanosheet N3. In embodiments, the gate dielectric layer 152 filling the recess portion 260R may contact a capping insulation pattern 164 at the second vertical level LV22, and the third nanosheet N3 may be apart from the capping insulation pattern 164 with the gate dielectric layer 152 therebetween. A portion, contacting the capping insulation pattern 164, of the gate dielectric layer 152 filling the recess portion 260R may include the interface layer or the high-k dielectric layer configuring the gate dielectric layer 152.

In FIG. 8, a structure is illustrated in which the main gate portion 260M of the gate line 260 includes the recess top surface 260L which extends long in the second horizontal direction (the Y direction) at the same second vertical level LV22 as a top level of the gate dielectric layer 152 covering an uppermost surface of the third nanosheet N3, but the inventive concept is not limited thereto. In other embodiments, the main gate portion 260M of the gate line 260 may include a recess top surface which extends long in the second horizontal direction (the Y direction) at the same third vertical level LV23 as the top level of the gate dielectric layer 152 covering an uppermost surface of the second nanosheet N2 instead of the recess top surface 260L. In this case, the third nanosheet N3 illustrated in FIG. 8 may be omitted. In other embodiments, the main gate portion 260M of the gate line 260 may include a recess top surface which extends long in the second horizontal direction (the Y direction) at the same fourth vertical level LV24 as the top level of the gate dielectric layer 152 covering an uppermost surface of the first nanosheet N1 instead of the recess top surface 260L. In this case, the second and third nanosheets N2 and N3 illustrated in FIG. 8 may be omitted.

In the integrated circuit device 200, regardless of a vertical level of the recess top surface 260L included in the main gate portion 260M of the gate line 260, the number of nanosheets included in the nanosheet stack NSS in the first device region RX1 may be the same as the number of nanosheets included in the nanosheet stack NSS in the second device region RX2.

Figure 9:
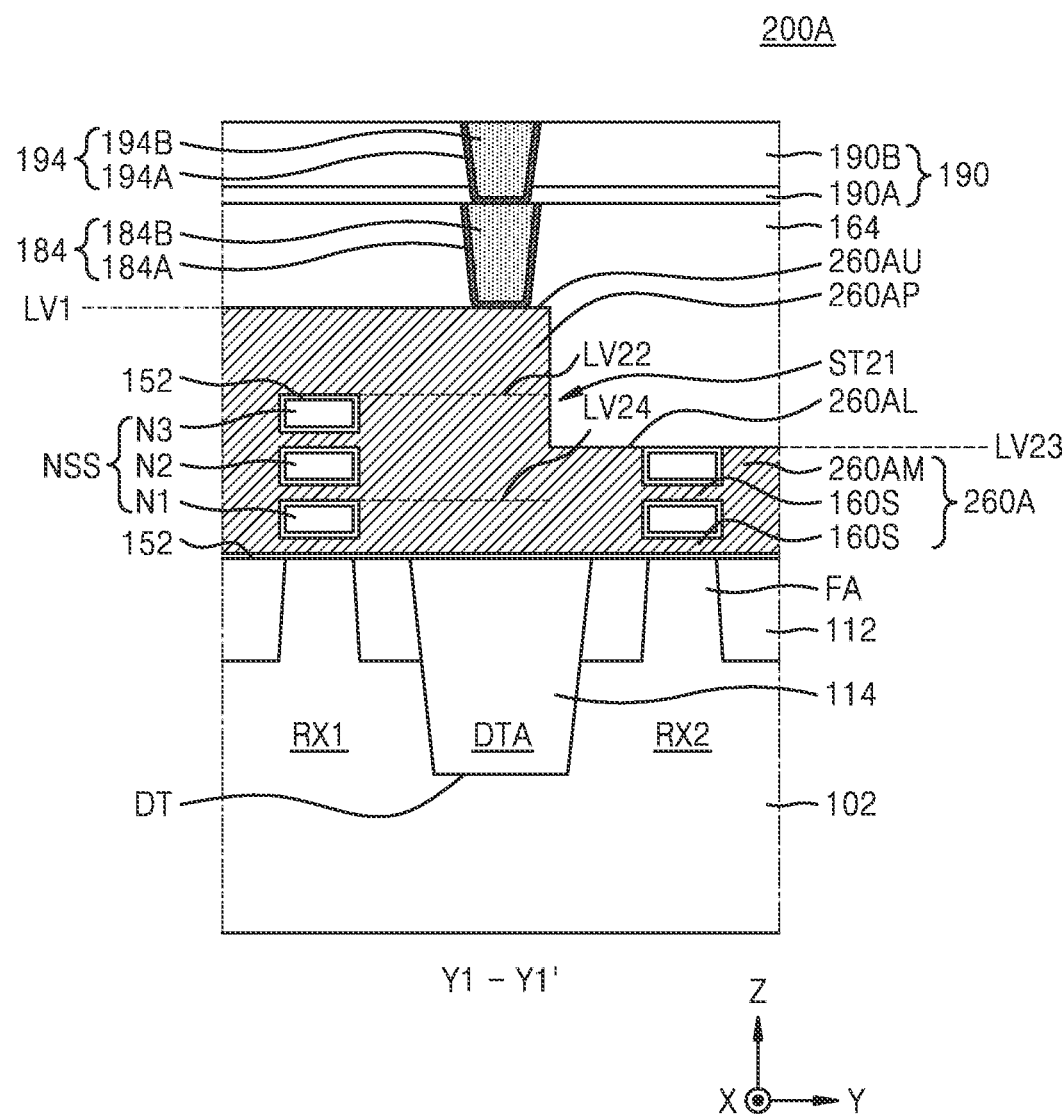
FIG. 9 is a cross-sectional view for describing an integrated circuit device according to other embodiments.

FIG. 9 is a cross-sectional view for describing an integrated circuit device 200A according to other embodiments. In FIG. 9, some elements of a portion corresponding to a cross-sectional surface taken along line Y1-Y1' of FIG. 1 is illustrated.

Referring to FIG. 9, the integrated circuit device 200A may have substantially the same configuration as that of the integrated circuit device 200 described above with reference to FIG. 8. The integrated circuit device 200A may include a gate line 260A instead of the gate line 260 of the integrated circuit device 200.

The gate line 260A may have substantially the same configuration as that of the gate line 260 described above with reference to FIG. 8. A main gate portion 260AM of the gate line 260A may include a connection protrusion portion 260AP, which includes a protrusion top surface 260AU extending long in a second horizontal direction (a Y direction) at a first vertical level LV1 on a substrate 102, and a recess top surface 260AL which extends long in the second horizontal direction (the Y direction) from the connection protrusion portion 260AP at a third vertical level LV23, which is lower than the first vertical level LV1. The connection protrusion portion 260AP of the main gate portion 260AM may be disposed in only a first device region RX1 among the first device region RX1 and a second device region RX2 and may not be disposed in the second device region RX2. The recess top surface 260AL of the main gate portion 260AM may be disposed in only the second device region RX2 among the first device region RX1 and the second device region RX2 and may not be disposed in the first device region RX1. A stepped portion ST21 between the connection protrusion portion 260AP and the recess top surface 260AL of the main gate portion 260AM may overlap an inter-device isolation layer 114 in a vertical direction (a Z direction) in an inter-device isolation region DTA.

The third vertical level LV23 of the recess top surface 260AL of the main gate portion 260AM may be lower than a vertical level of a top surface of a third nanosheet N3, which is a nanosheet of an uppermost layer among a plurality of nanosheets N1 to N3 included in a plurality of nanosheet stacks NSS in the first device region RX1.

The connection protrusion portion 260AP of the main gate portion 260AM may overlap a plurality of fin-type active regions FA and a plurality of nanosheet stacks NSS in the vertical direction (the Z direction) in the first device region RX1. The recess top surface 260AL of the main gate portion 260AM may overlap a plurality of fin-type active regions FA and a plurality of nanosheet stacks NSS in the vertical direction (the Z direction) in the second device region RX2. In the integrated circuit device 200A, the number of nanosheets included in a nanosheet stack NSS in the second device region RX2 may be less than the number of nanosheets included in a nanosheet stack NSS in the first device region RX1.

In FIG. 9, for example, a structure is illustrated in which the main gate portion 260AM of the gate line 260A includes the recess top surface 260AL extending long in the second horizontal direction (the Y direction) at the third vertical level LV23, which is the same as a top level of the gate dielectric layer 152 covering an uppermost surface of the second nanosheet N2, but the inventive concept is not limited thereto. In other embodiments, the main gate portion 260AM of the gate line 260A may include a recess top surface extending long in the second horizontal direction (the Y direction) at the second vertical level LV22 or a recess top surface extending long in the second horizontal direction (the Y direction) at the fourth vertical level LV24, instead of the recess top surface 260AL.

Figure 10:
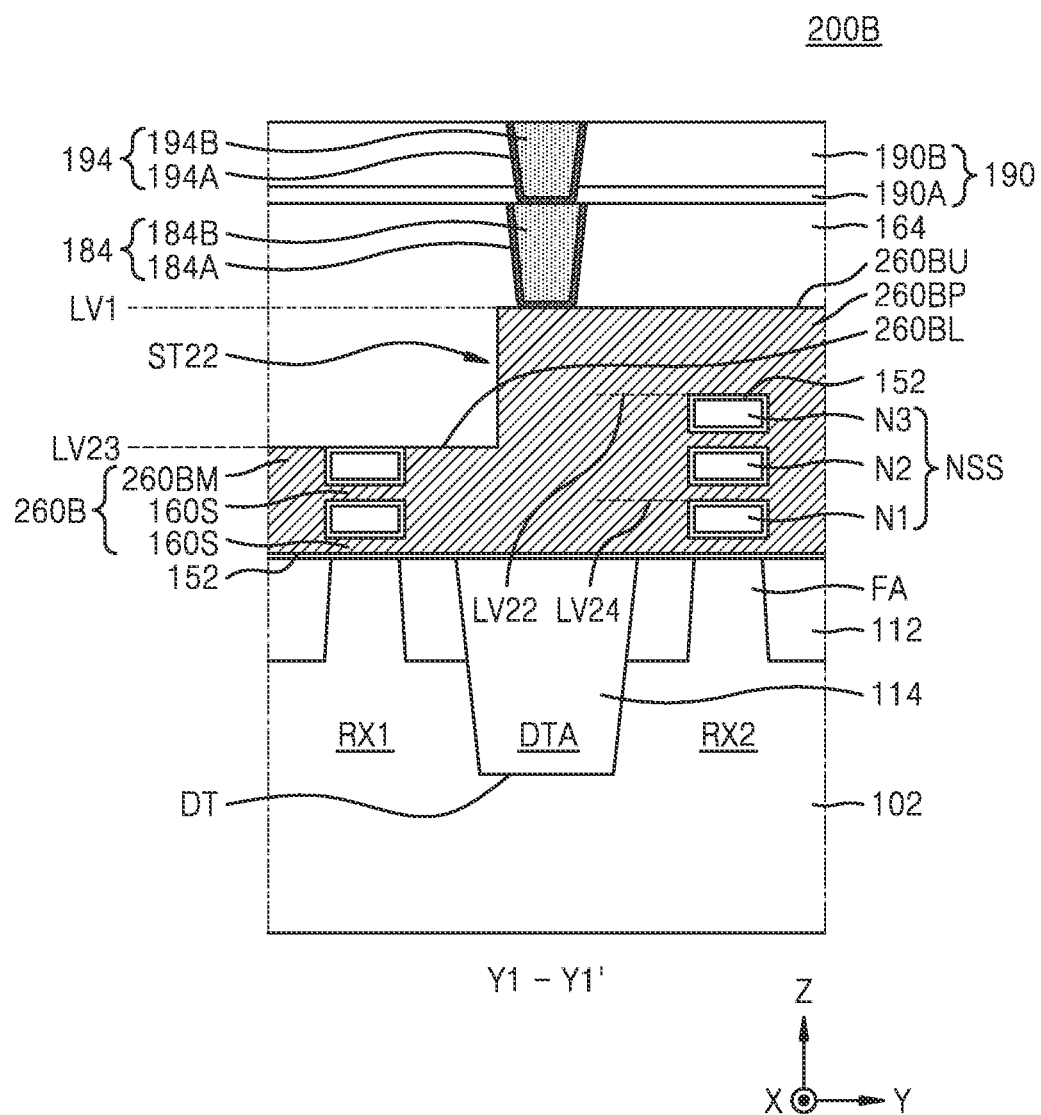
FIG. 10 is a cross-sectional view for describing an integrated circuit device according to other embodiments.

FIG. 10 is a cross-sectional view for describing an integrated circuit device 200B according to other embodiments. In FIG. 10, some elements of a portion corresponding to a cross-sectional surface taken along line Y1-Y1' of FIG. 1 is illustrated.

Referring to FIG. 10, the integrated circuit device 200B may have substantially the same configuration as that of the integrated circuit device 200 described above with reference to FIG. 8. The integrated circuit device 200B may include a gate line 260B instead of the gate line 260 of the integrated circuit device 200.

The gate line 260B may have substantially the same configuration as that of the gate line 260 described above with reference to FIG. 8. A main gate portion 260BM of the gate line 260B may include a connection protrusion portion 260BP, which includes a protrusion top surface 260BU extending long in a second horizontal direction (a Y direction) at a first vertical level LV1 on a substrate 102, and a recess top surface 260BL, which extends long in the second horizontal direction (the Y direction) from the connection protrusion portion 260BP at a third vertical level LV23, which is lower than the first vertical level LV1. The connection protrusion portion 260BP of the main gate portion 260BM may be disposed in only a second device region RX2 among a first device region RX1 and the second device region RX2 and may not be disposed in the first device region RX1. The recess top surface 260BL of the main gate portion 260BM may be disposed in only the first device region RX1 among the first device region RX1 and the second device region RX2 and may not be disposed in the second device region RX2. A stepped portion ST22 between the connection protrusion portion 260BP and the recess top surface 260BL of the main gate portion 260BM may overlap an inter-device isolation layer 114 in a vertical direction (a Z direction) in an inter-device isolation region DTA.

The third vertical level LV23 of the recess top surface 260BL of the main gate portion 260BM may be lower than a vertical level of a top surface of a third nanosheet N3, which is a nanosheet of an uppermost layer among a plurality of nanosheets N1 to N3 included in a plurality of nanosheet stacks NSS in the second device region RX2.

The connection protrusion portion 260BP of the main gate portion 260BM may overlap a plurality of fin-type active regions FA and a plurality of nanosheet stacks NSS in the vertical direction (the Z direction) in the second device region RX2. The recess top surface 260BL of the main gate portion 260BM may overlap a plurality of fin-type active regions FA and a plurality of nanosheet stacks NSS in the vertical direction (the Z direction) in the first device region RX1. In the integrated circuit device 200B, the number of nanosheets included in a nanosheet stack NSS in the first device region RX1 may be less than the number of nanosheets included in a nanosheet stack NSS in the second device region RX2.

In FIG. 10, for example, a structure is illustrated in which the main gate portion 260BM of the gate line 260B includes the recess top surface 260BL extending long in the second horizontal direction (the Y direction) at the third vertical level LV23, which is the same as a top level of the gate dielectric layer 152 covering an uppermost surface of the second nanosheet N2, but the inventive concept is not limited thereto. In other embodiments, the main gate portion 260BM of the gate line 260B may include a recess top surface extending long in the second horizontal direction (the Y direction) at the second vertical level LV22 or a recess top surface extending long in the second horizontal direction (the Y direction) at the fourth vertical level LV24, instead of the recess top surface 260BL.

Figure 11:
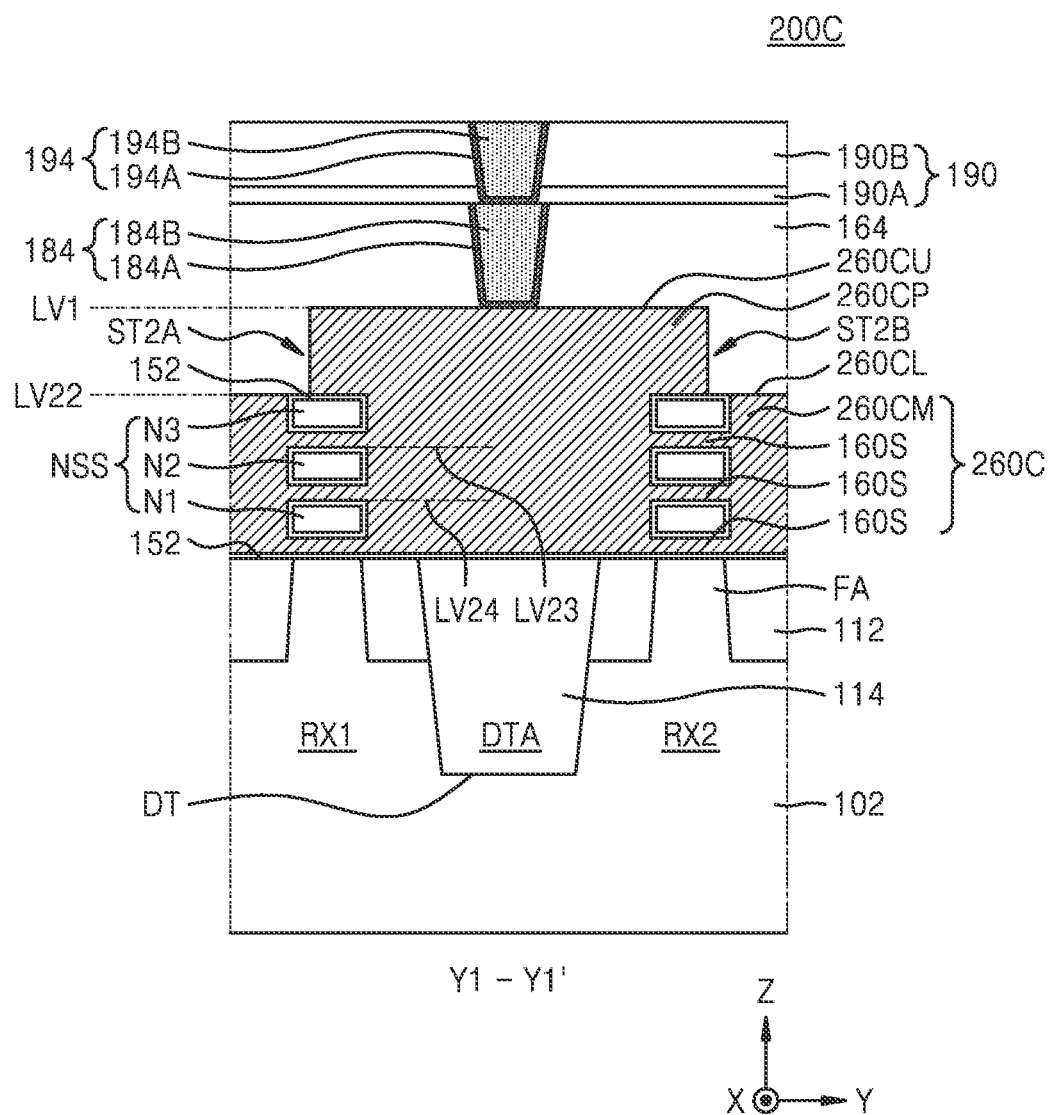
FIG. 11 is a cross-sectional view for describing an integrated circuit device according to other embodiments.

FIG. 11 is a cross-sectional view for describing an integrated circuit device 200C according to other embodiments. In FIG. 11, some elements of a portion corresponding to a cross-sectional surface taken along line Y1-Y1' of FIG. 1 is illustrated.

Referring to FIG. 11, the integrated circuit device 200C may have substantially the same configuration as that of the integrated circuit device 200 described above with reference to FIG. 8. The integrated circuit device 200C may include a gate line 260C instead of the gate line 260 of the integrated circuit device 200.

The gate line 260C may have substantially the same configuration as that of the gate line 260 described above with reference to FIG. 8. A main gate portion 260CM of the gate line 260C may include a connection protrusion portion 260CP, which includes a protrusion top surface 260CU extending long in a second horizontal direction (a Y direction) at a first vertical level LV1 on a substrate 102, and a recess top surface 260CL, which extends long in the second horizontal direction (the Y direction) from the connection protrusion portion 260CP at a second vertical level LV22, which is lower than the first vertical level LV1.

The connection protrusion portion 260CP of the main gate portion 260CM may extend long in the second horizontal direction (the Y direction) in a portion of the first device region RX1, an inter-device isolation region DTA, and a portion of the second device region RX2. A first stepped portion ST2A between one end of the connection protrusion portion 260CP and the recess top surface 260CL may overlap a plurality of fin-type active regions FA and a plurality of nanosheet stacks NSS in a vertical direction (a Z direction) in the first device region RX1, and a second stepped portion ST2B between the other end of the connection protrusion portion 260CP and the recess top surface 260CL may overlap a plurality of fin-type active regions FA and a plurality of nanosheet stacks NSS in the vertical direction (the Z direction) in the second device region RX2.

In FIG. 11, for example, a structure is illustrated in which the main gate portion 260CM of the gate line 260C includes the recess top surface 260CL extending long in the second horizontal direction (the Y direction) at the second vertical level LV22 which is the same as a top level of the gate dielectric layer 152 covering an uppermost surface of the third nanosheet N3, but the inventive concept is not limited thereto. In other embodiments, the main gate portion 260CM of the gate line 260C may include a recess top surface extending long in the second horizontal direction (the Y direction) at the third vertical level LV23 or a recess top surface extending long in the second horizontal direction (the Y direction) at the fourth vertical level LV24, instead of the recess top surface 260CL.

Figure 12:
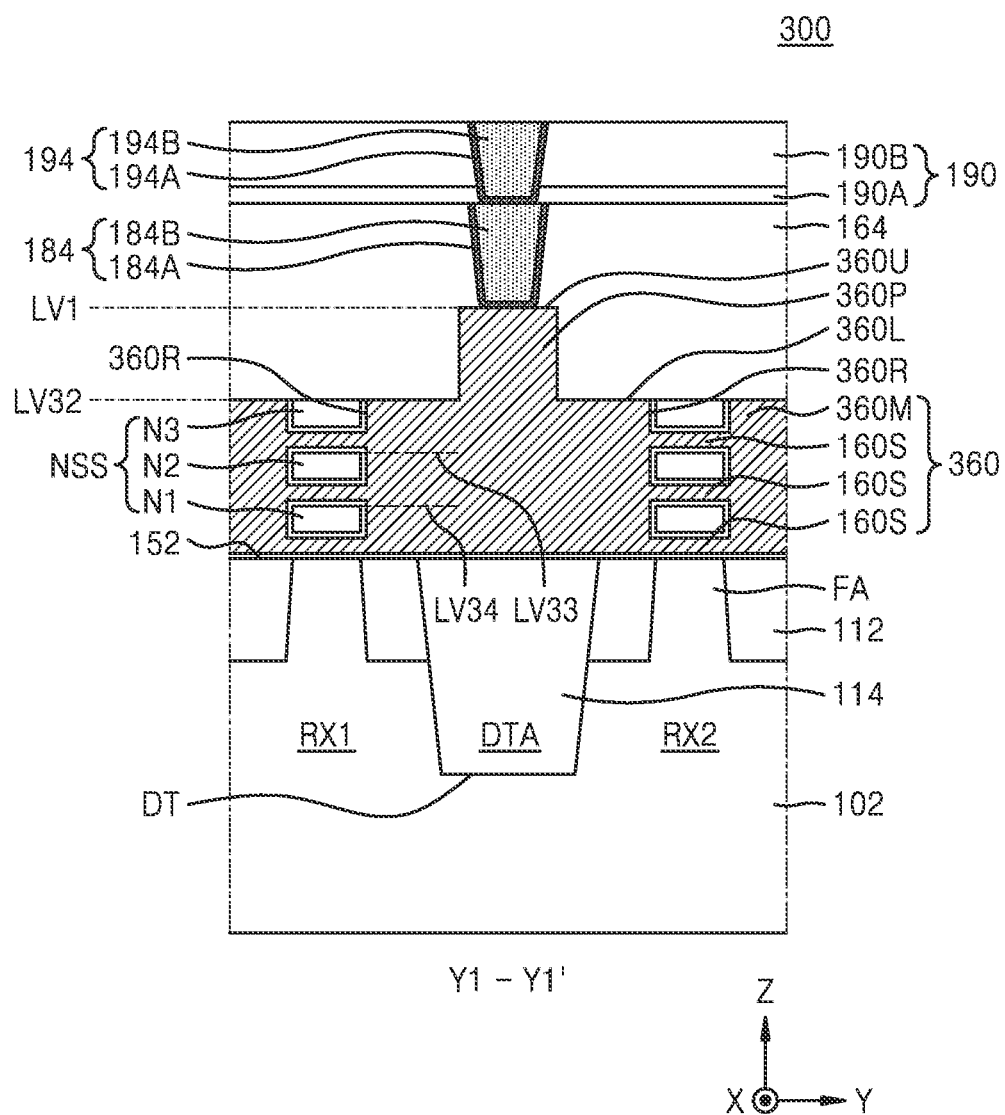
FIG. 12 is a cross-sectional view for describing an integrated circuit device according to other embodiments.

FIG. 12 is a cross-sectional view for describing an integrated circuit device 300 according to other embodiments. In FIG. 12, some elements of a portion corresponding to a cross-sectional surface taken along line Y1-Y1' of FIG. 1 is illustrated.

Referring to FIG. 12, the integrated circuit device 300 may have substantially the same configuration as that of the integrated circuit device 100 described above with reference to FIGS. 1 and 2A to 2D. The integrated circuit device 300 may include a gate line 360 instead of the gate line 160 of the integrated circuit device 100.

The gate line 360 may have substantially the same configuration as that of the gate line 160 described above with reference to FIGS. 2A to 2C. A main gate portion 360M of the gate line 360 may include a connection protrusion portion 360P, which includes a protrusion top surface 360U at a first vertical level LV1 on a substrate 102, and a recess top surface 360L which extends long in a second horizontal direction (a Y direction) from the connection protrusion portion 360P at a second vertical level LV32 which is lower than the first vertical level LV1. In embodiments, a height difference between the first vertical level LV1 and the second vertical level LV32 may be about 2 nm to about 20 nm, but is not limited thereto. A vertical level of the recess top surface 360L of the main gate portion 360M may be the same as or similar to a vertical level of an uppermost surface of a nanosheet stack NSS, namely, an uppermost surface of a third nanosheet N3.

The recess top surface 360L of the main gate portion 360M may include a recess portion 360R formed at a position overlapping a fin-type active region FA and a nanosheet stack NSS in a vertical direction (a Z direction) in a first device region RX1 and a second device region RX2. The recess portion 360R may be filled with the third nanosheet N3 and a gate dielectric layer 152 covering a side surface and a bottom surface of the third nanosheet N3. In embodiments, the gate dielectric layer 152 filling the recess portion 360R may contact a capping insulation pattern 164 at the second vertical level LV32.

In FIG. 12, a structure is illustrated in which the main gate portion 360M of the gate line 360 includes the recess top surface 360L which extends long in the second horizontal direction (the Y direction) at the same second vertical level LV32 as a vertical level of an uppermost surface of the third nanosheet N3, but the inventive concept is not limited thereto. In other embodiments, the main gate portion 360M of the gate line 360 may include a recess top surface which extends long in the second horizontal direction (the Y direction) at the same third vertical level LV33 as a level of an uppermost surface of the second nanosheet N2 instead of the recess top surface 360L. In this case, the third nanosheet N3 illustrated in FIG. 12 may be omitted. In other embodiments, the main gate portion 360M of the gate line 360 may include a recess top surface which extends long in the second horizontal direction (the Y direction) at the same fourth vertical level LV34 as a level of an uppermost surface of the first nanosheet N1 instead of the recess top surface 360L. In this case, the second and third nanosheets N2 and N3 illustrated in FIG. 12 may be omitted.

In the integrated circuit device 300, regardless of a vertical level of the recess top surface 360L included in the main gate portion 360M of the gate line 360, the number of nanosheets included in the nanosheet stack NSS in the first device region RX1 may be the same as the number of nanosheets included in the nanosheet stack NSS in the second device region RX2.

In embodiments, a process of manufacturing the integrated circuit device 300 may include a process of oxidizing the third nanosheet N3 filling the recess portion 360R. In this case, the integrated circuit device 300 illustrated in FIG. 12 may include a semiconductor oxide piece having a configuration similar to that of a semiconductor oxide piece 420B which will be described below with reference to FIG. 15, instead of the third nanosheet N3.

Figure 13A:
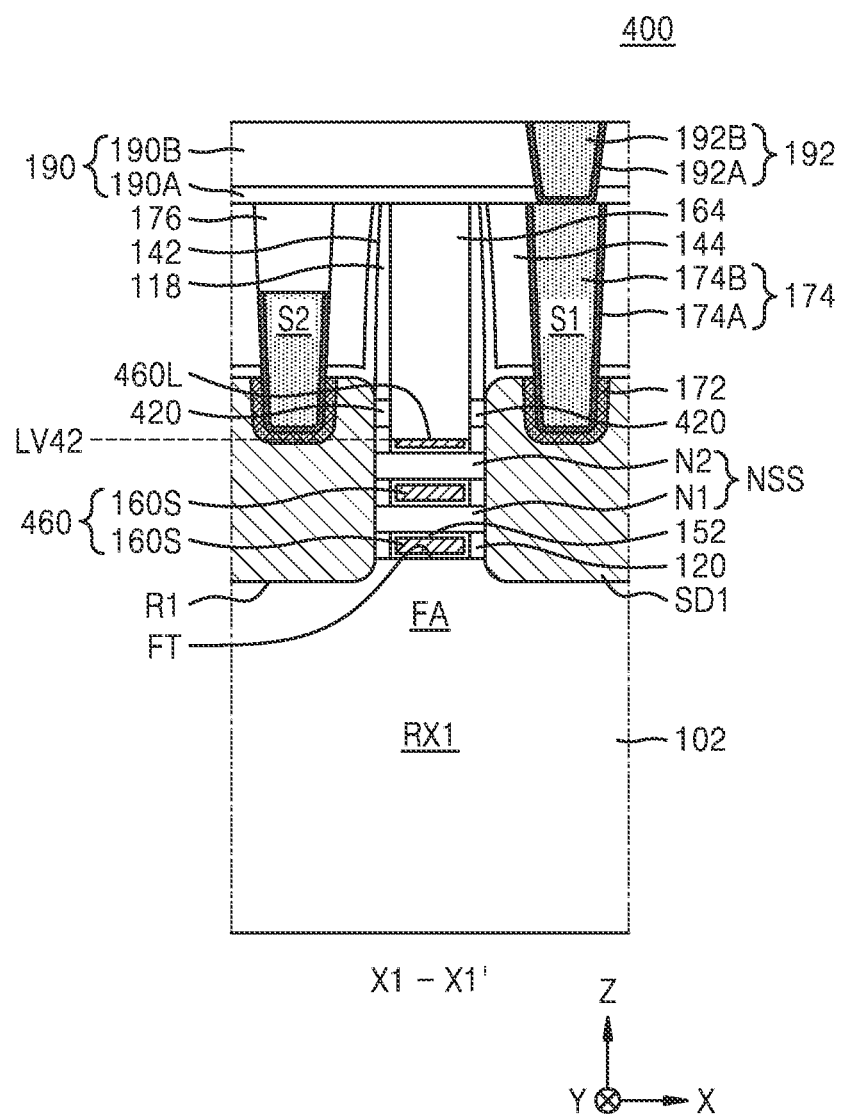
FIGS. 13A, 13B and 13C are cross-sectional views for describing an integrated circuit device according to other embodiments.
Figure 13B:
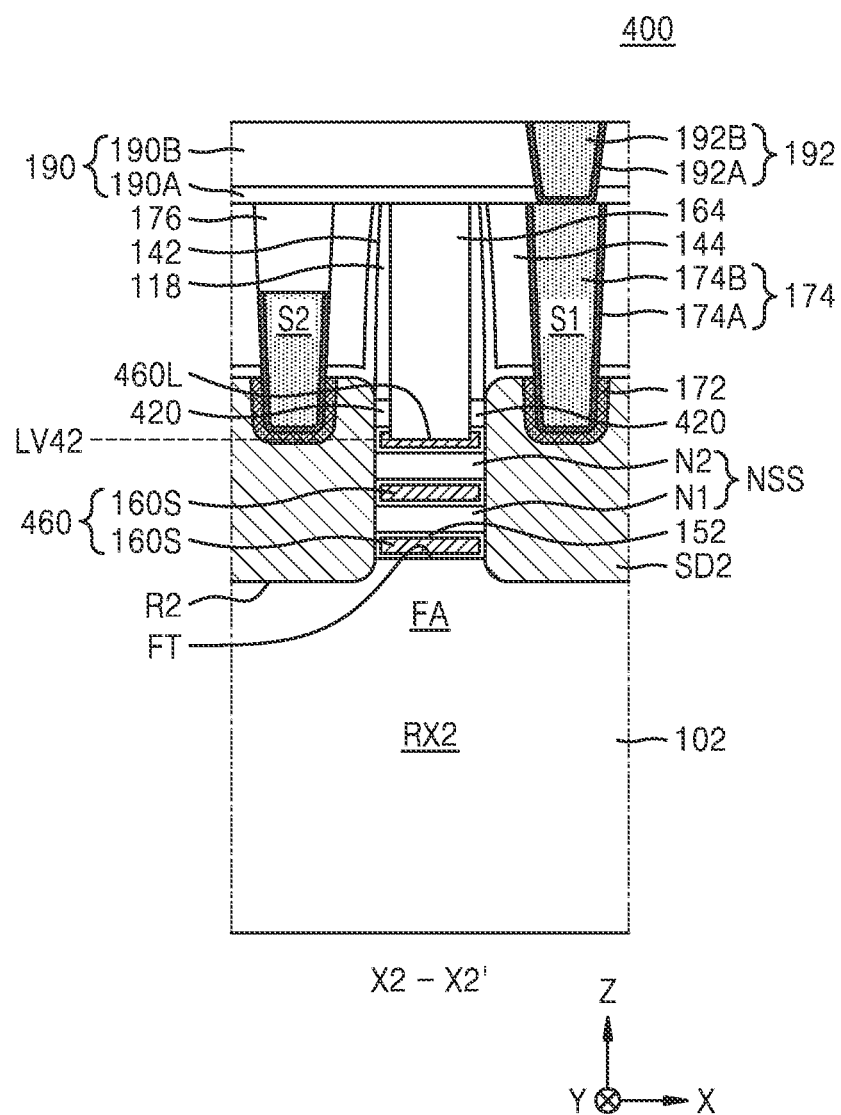
Figure 13C:
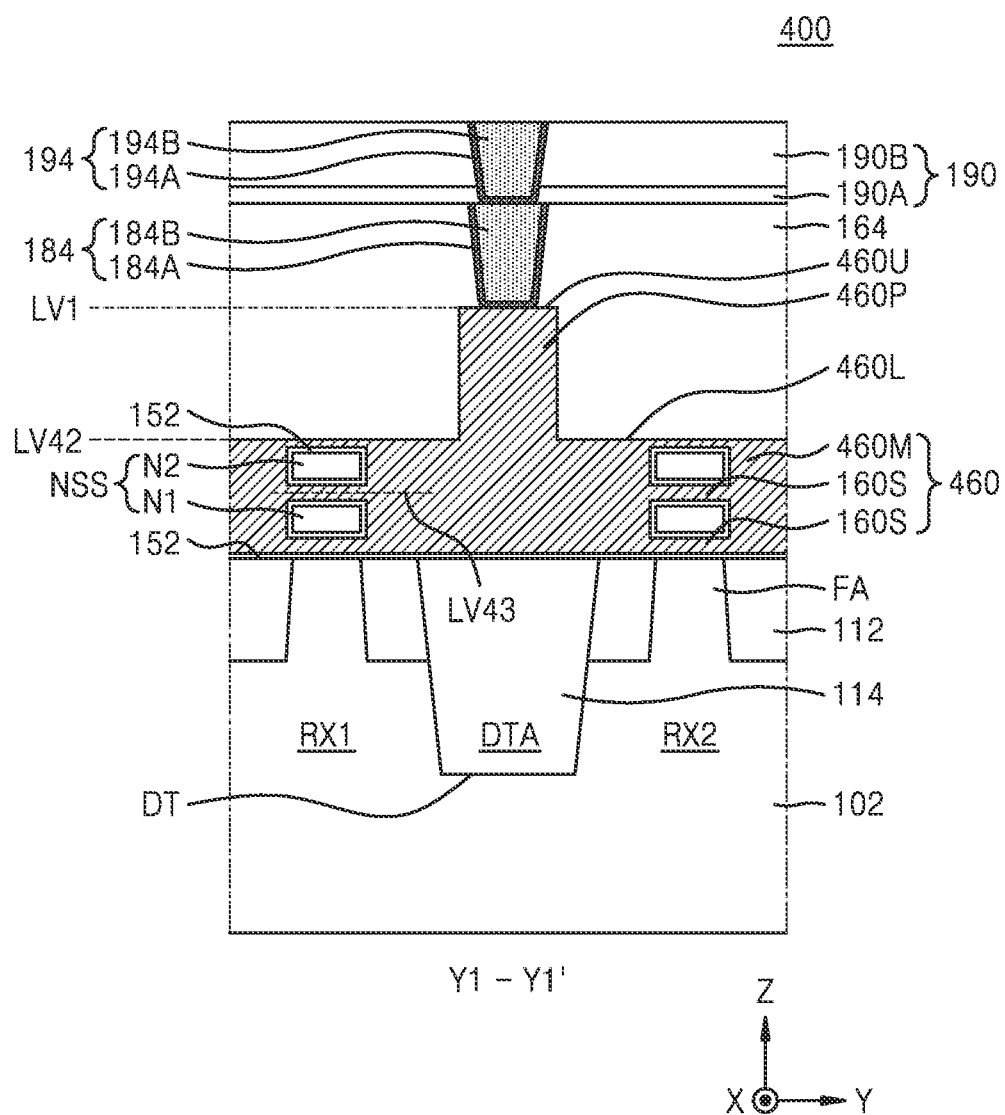

FIGS. 13A, 13B and 13C are cross-sectional views for describing an integrated circuit device 400 according to other embodiments. In FIG. 13A, some elements of a portion corresponding to a cross-sectional surface taken along line X1-X1' of FIG. 1 is illustrated. In FIG. 13B, some elements of a portion corresponding to a cross-sectional surface taken along line X2-X2' of FIG. 1 is illustrated. In FIG. 13C, some elements of a portion corresponding to a cross-sectional surface taken along line Y1-Y1' of FIG. 1 is illustrated.

Referring to FIGS. 13A to 13C, the integrated circuit device 400 may have substantially the same configuration as that of the integrated circuit device 100 described above with reference to FIGS. 1 and 2A to 2D. The integrated circuit device 400 may include a gate line 460 instead of the gate line 160 of the integrated circuit device 100.

The gate line 460 may have substantially the same configuration as that of the gate line 160 described above with reference to FIGS. 2A to 2C. A main gate portion 460M of the gate line 460 may include a connection protrusion portion 460P, which includes a protrusion top surface 460U at a first vertical level LV1 on a substrate 102, and a recess top surface 460L which extends long in a second horizontal direction (a Y direction) from the connection protrusion portion 460P at a second vertical level LV42 which is lower than a first vertical level LV1.

Each of a plurality of nanosheet stacks NSS covered by the gate line 460 may include two nanosheets N1 and N2 (for example, a first nanosheet N1 and a second nanosheet N2), in a first device region RX1 and a second device region RX2. The recess top surface 460L of the main gate portion 460M may be higher than an uppermost surface of the second nanosheet N2 of the nanosheet stack NSS, in a vertical direction (a Z direction). An uppermost surface of each of the nanosheet stack NSS and a gate dielectric layer 152 covering the nanosheet stack NSS may be at a vertical level which is lower than a second vertical level LV42 of the recess top surface 460L of the main gate portion 460M.

As illustrated in FIGS. 13A and 13B, a plurality of semiconductor oxide pieces 420 may be disposed at a position overlapping the nanosheet stack NSS in the vertical direction (the Z direction), in the first device region RX1 and the second device region RX2. A top surface of the semiconductor oxide piece 420 may contact an outer insulation spacer 118.

The plurality of semiconductor oxide pieces 420 may each be disposed between a first source/drain region SD1 and a capping insulation pattern 164, in the first device region RX1. The plurality of semiconductor oxide pieces 420 may each include a portion contacting the first source/drain region SD1 and a portion contacting the capping insulation pattern 164. The plurality of semiconductor oxide pieces 420 may each be disposed between a second source/drain region SD2 and the capping insulation pattern 164, in the second device region RX2. The plurality of semiconductor oxide pieces 420 may each include a portion contacting the second source/drain region SD2 and a portion contacting the capping insulation pattern 164.

The plurality of semiconductor oxide pieces 420 may include the same semiconductor material as a semiconductor material included in the first and second nanosheets N1 and N2 included in the nanosheet stack NSS. In embodiments, the plurality of semiconductor oxide pieces 420 may each include silicon oxide. In embodiments, a semiconductor oxide piece 420 disposed in the first device region RX1 among the plurality of semiconductor oxide pieces 420 may include silicon oxide including an n-type dopant, and a semiconductor oxide piece 420 disposed in the second device region RX2 among the plurality of semiconductor oxide pieces 420 may include silicon oxide including a p-type dopant. The n-type dopant may be selected from among P, As, and Sb, and the p-type dopant may be selected from among B and Ga.

In embodiments, a portion of a third nanosheet N3 which is an uppermost nanosheet of the plurality of nanosheets N1 to N3 may be removed in an etching process included in a process of forming a connection protrusion portion 460P in a process of manufacturing the integrated circuit device 400. Each of the plurality of semiconductor oxide pieces 420 may be a resultant material which is obtained by oxidizing a remaining portion of the third nanosheet N3 from which a portion thereof is removed in a process of forming the connection protrusion portion 460P.

In FIGS. 13A to 13C, a structure is illustrated in which the main gate portion 460M of the gate line 460 includes a recess top surface 460L extending long in a second horizontal direction (a Y direction) at a second vertical level LV42, but the inventive concept is not limited thereto. In other embodiments, the main gate portion 460M of the gate line 460 may include a recess top surface extending long in the second horizontal direction (the Y direction) at a third vertical level LV43 which is a vertical level between the first nanosheet N1 and the second nanosheet N2, instead of the recess top surface 460L. In this case, the second nanosheet N2 illustrated in FIGS. 13A to 13C may be omitted.

In the integrated circuit device 400, regardless of a vertical level of the recess top surface 460L included in the main gate portion 460M of the gate line 460, the number of nanosheets included in the nanosheet stack NSS in the first device region RX1 may be the same as the number of nanosheets included in the nanosheet stack NSS in the second device region RX2. In other embodiments, like the integrated circuit device 200A or 200B described above with reference to FIG. 9 or 10, the connection protrusion portion 460P may be formed in one of the first device region RX1 and the second device region RX2. In this case, the number of nanosheets included in the nanosheet stack NSS in the first device region RX1 may differ from the number of nanosheets included in the nanosheet stack NSS in the second device region RX2.

Figure 14:
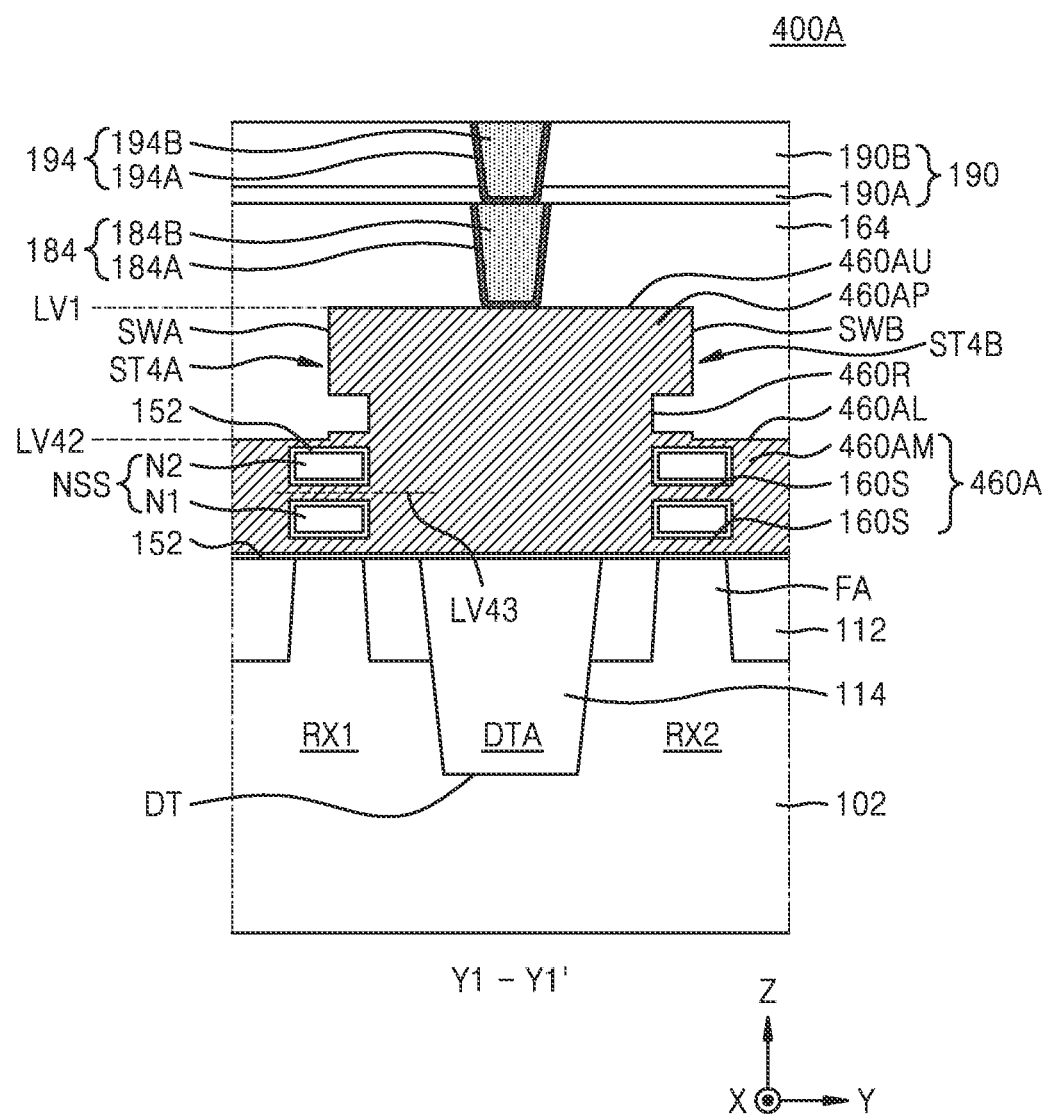
FIG. 14 is a cross-sectional view for describing an integrated circuit device according to other embodiments.

FIG. 14 is a cross-sectional view for describing an integrated circuit device 400A according to other embodiments. In FIG. 14, some elements of a portion corresponding to a cross-sectional surface taken along line Y1-Y1' of FIG. 1 is illustrated.

Referring to FIG. 14, the integrated circuit device 400A may have substantially the same configuration as that of the integrated circuit device 400 described above with reference to FIGS. 13A to 13C. The integrated circuit device 400A may include a gate line 460A instead of the gate line 460 of the integrated circuit device 400.

The gate line 460A may have substantially the same configuration as that of the gate line 460 described above with reference to FIGS. 13A to 13C. A main gate portion 460AM of the gate line 460A may include a connection protrusion portion 460AP, which includes a protrusion top surface 460AU extending long in a second horizontal direction (a Y direction) at a first vertical level LV1 on a substrate 102, and a recess top surface 460AL which extends long in the second horizontal direction (the Y direction) from the connection protrusion portion 460AP at a second vertical level LV42 which is lower than the first vertical level LV1.

The connection protrusion portion 460AP of the main gate portion 460AM may extend long in the second horizontal direction (the Y direction) in a portion of the first device region RX1, an inter-device isolation region DTA, and a portion of the second device region RX2. A first stepped portion ST4A between one end of the connection protrusion portion 460AP and the recess top surface 460AL may overlap a plurality of fin-type active regions FA and a plurality of nanosheet stacks NSS in a vertical direction (a Z direction) in the first device region RX1, and a second stepped portion ST4B between the other end of the connection protrusion portion 460AP and the recess top surface 460AL may overlap a plurality of fin-type active regions FA and a plurality of nanosheet stacks NSS in the vertical direction (the Z direction) in the second device region RX2.

A lateral recess portion 460R, which is locally recessed in a first horizontal direction (an X direction) at a position overlapping a plurality of nanosheets N1 and N2 included in each of the nanosheet stacks NSS in the vertical direction (the Z direction), may be formed in each of a protrusion sidewall SWA at one end of the connection protrusion portion 460AP and a protrusion sidewall SWB at the other end of the connection protrusion portion 460AP.

In FIG. 14, a configuration is illustrated in which the lateral recess portion 460R is formed in each of the protrusion sidewall SWA at the one end of the connection protrusion portion 460AP and the protrusion sidewall SWB at the other end of the connection protrusion portion 460AP, but the inventive concept is not limited thereto. In other embodiments, only one of the protrusion sidewalls SWA and SWB respectively disposed at the one end and the other end of the connection protrusion portion 460AP may overlap the plurality of nanosheets N1 and N2 included in each nanosheet stack NSS in the vertical direction (the Z direction), and the lateral recess portion 460R may be formed in only one of the protrusion sidewalls SWA and SWB.

In FIG. 14, a structure is illustrated in which the main gate portion 460AM of the gate line 460A includes a recess top surface 460AL extending in the second horizontal direction (the Y direction) at the second vertical level LV42, but the inventive concept is not limited thereto. In other embodiments, the main gate portion 460AM of the gate line 460A may include a recess top surface which extends in the second horizontal direction (the Y direction) at the third vertical level LV43, instead of the recess top surface 460AL. In this case, in the integrated circuit device 400A, the nanosheet stack NSS covered by the gate line 460A may include only one nanosheet (for example, the first nanosheet N1), and two lateral recess portions 460R, which are apart from each other in the vertical direction (the Z direction) at a position overlapping the first nanosheet N1 in the vertical direction (the Z direction), may be respectively formed in the protrusion sidewalls SWA and SWB respectively disposed at the one end and the other end of the connection protrusion portion 460AP.

Figure 15:
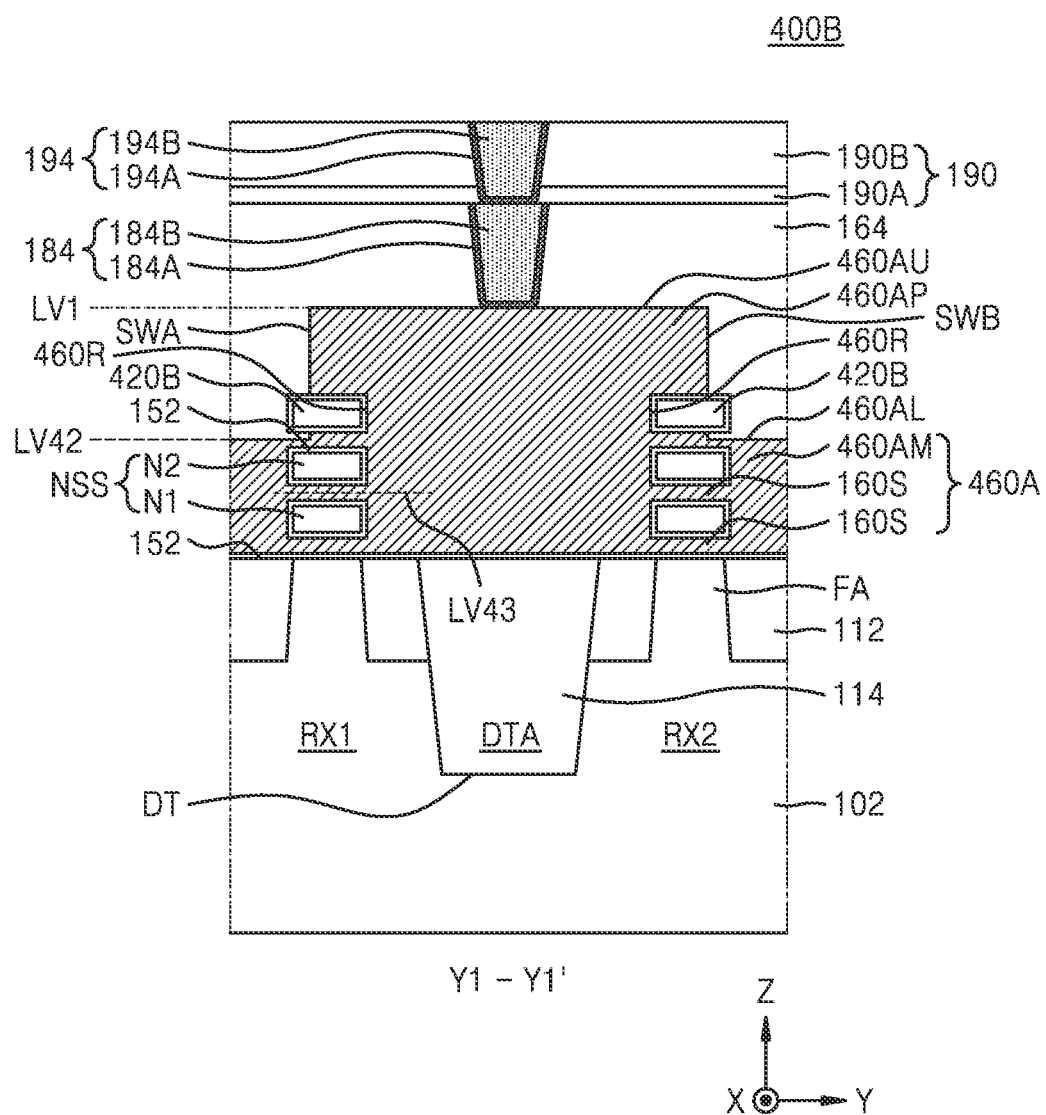
FIG. 15 is a cross-sectional view for describing an integrated circuit device according to other embodiments.

FIG. 15 is a cross-sectional view for describing an integrated circuit device 400B according to other embodiments. In FIG. 15, some elements of a portion corresponding to a cross-sectional surface taken along line Y1-Y1' of FIG. 1 is illustrated.

Referring to FIG. 15, the integrated circuit device 400B may have substantially the same configuration as that of the integrated circuit device 400A described above with reference to FIG. 14. The integrated circuit device 400B may include a plurality of semiconductor oxide pieces 420B.

Each of the plurality of semiconductor oxide pieces 420B may include a portion, which is buried into the lateral recess portion 460R formed in each of protrusion sidewalls SWA and SWB of a connection protrusion portion 460AP, and a portion which protrudes in a second horizontal direction (a Y direction) from the protrusion sidewalls SWA and SWB. Each of the plurality of semiconductor oxide pieces 420B may include a gate dielectric layer 152. The plurality of semiconductor oxide pieces 420B may be respectively disposed at positions which overlap a plurality of nanosheets N1 and N2 included in a nanosheet stack NSS in a vertical direction (a Z direction). A material of each of the plurality of semiconductor oxide pieces 420B may be substantially the same as that of the semiconductor oxide piece 420 described above with reference to FIGS. 13A to 13C.

In FIG. 15, a configuration is illustrated in which the semiconductor oxide pieces 420B are respectively disposed at positions adjacent to the protrusion sidewalls SWA and SWB at the one end and the other end of the connection protrusion portion 460AP, but the inventive concept is not limited thereto. In embodiments, only one of the protrusion sidewalls SWA and SWB of the one end and the other end of the connection protrusion portion 460AP may overlap the plurality of nanosheets N1 and N2 included in the nanosheet stack NSS in the vertical direction (the Z direction), and the semiconductor oxide piece 420B may be formed at only a position adjacent to a protrusion sidewall, overlapping the plurality of nanosheets N1 and N2 in the vertical direction (the Z direction), of the protrusion sidewalls SWA and SWB.

In FIG. 15, a structure is illustrated in which a main gate portion 460AM of the gate line 460A includes a recess top surface 460AL extending in a second horizontal direction (a Y direction) at a second vertical level LV42, but the inventive concept is not limited thereto. In other embodiments, the main gate portion 460AM of the gate line 460A may include a recess top surface which extends in the second horizontal direction (the Y direction) at a third vertical level LV43, instead of the recess top surface 460AL. In this case, in the integrated circuit device 400B, the nanosheet stack NSS covered by the gate line 460A may include only one nanosheet (for example, a first nanosheet N1), and two semiconductor oxide pieces 420B apart from each other in the vertical direction (the Z direction) may be formed at positions adjacent to the protrusion sidewalls SWA and SWB of the one end and the other end of the connection protrusion portion 460AP.

Figure 16:
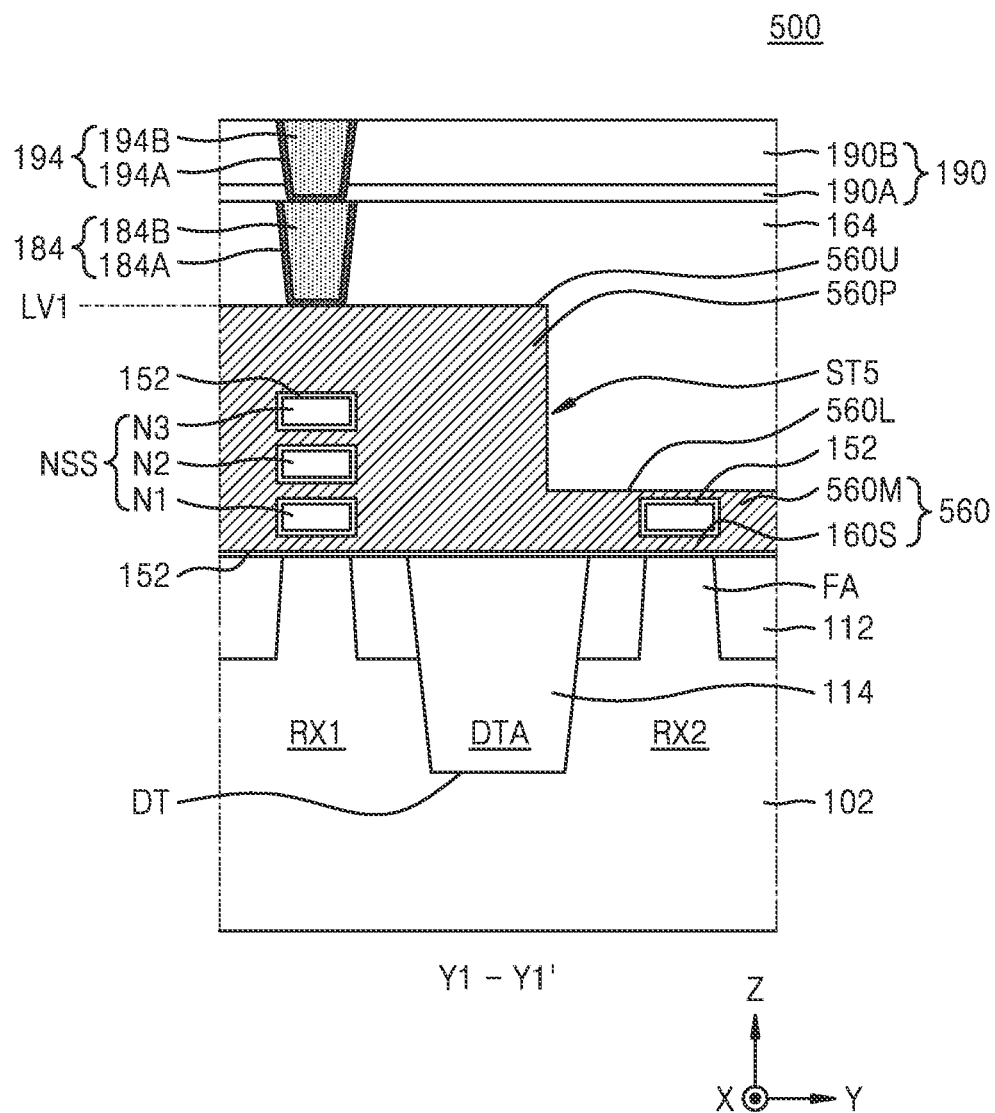
FIG. 16 is a cross-sectional view for describing an integrated circuit device according to other embodiments.

FIG. 16 is a cross-sectional view for describing an integrated circuit device 500 according to other embodiments. In FIG. 16, some elements of a portion corresponding to a cross-sectional surface taken along line Y1-Y1' of FIG. 1 is illustrated.

Referring to FIG. 16, the integrated circuit device 500 may have substantially the same configuration as that of the integrated circuit device 100 described above with reference to FIGS. 1 and 2A to 2D. The integrated circuit device 500 may include a gate line 560 instead of the gate line 160 of the integrated circuit device 100.

The gate line 560 may have substantially the same configuration as that of the gate line 160 described above with reference to FIGS. 2A to 2C. A main gate portion 560AM of the gate line 560 may include a connection protrusion portion 560P, which includes a protrusion top surface 160U at a first vertical level LV1 on a substrate 102, and a recess top surface 160L which extends long in a second horizontal direction (a Y direction) from the connection protrusion portion 560P at a second vertical level LV52 which is lower than the first vertical level LV1.

The connection protrusion portion 560P of the main gate portion 560M may be disposed in only a first device region RX1 among the first device region RX1 and a second device region RX2 and may not be disposed in the second device region RX2. The recess top surface 560L of the main gate portion 560M may be disposed in only the second device region RX2 among the first device region RX1 and the second device region RX2 and may not be disposed in the first device region RX1. A stepped portion ST5 between the connection protrusion portion 560P and the recess top surface 560L of the main gate portion 560M may overlap an inter-device isolation layer 114 in a vertical direction (a Z direction) in an inter-device isolation region DTA.

The connection protrusion portion 560P of the main gate portion 560M may overlap a plurality of fin-type active regions FA and a plurality of nanosheet stacks NSS in the vertical direction (the Z direction) in the first device region RX1. The recess top surface 560L of the main gate portion 560M may overlap a plurality of fin-type active regions FA and a first nanosheet N1 in the vertical direction (the Z direction) in the second device region RX2.

In the integrated circuit device 500, a stack structure of a gate contact 184 and a gate via contact 194 each connected to a gate line 560 may be disposed in the first device region RX1. The gate contact 184 may contact the protrusion top surface 560U of the connection protrusion portion 560P included in the main gate portion 560M in the first device region RX1. A stack structure of the gate contact 184 and the gate via contact 194 each connected to the gate line 560 may overlap a plurality of fin-type active regions FA and a plurality of nanosheet stacks NSS in the vertical direction (the Z direction) in the first device region RX1. In the integrated circuit device 600, the number of nanosheets included in the nanosheet stack NSS in the second device region RX2 may be less than the number of nanosheets included in the nanosheet stack NSS in the first device region RX1. In FIG. 16, an example in which only the first nanosheet NS is included in the nanosheet stack NSS in the second device region RX2 is illustrated, but the inventive concept is not limited thereto. For example, the recess top surface 560L of the main gate portion 560M may extend in the second horizontal direction (the Y direction) which is lower than the first vertical level LV1 and is higher than a second vertical level LV52, and the nanosheet stack NSS in the second device region RX2 may include a plurality of nanosheets including at least one first nanosheet NS.

In FIG. 16, an example in which the connection protrusion portion 560P is in the first device region RX1 and the recess top surface 560L is in the second device region RX2 is illustrated, but the inventive concept is not limited thereto. For example, like the integrated circuit devices 100C, 100D, and 200B illustrated in FIGS. 5, 6A, 6B, and 10, the connection protrusion portion 560P may be in the second device region RX2, and the recess top surface 560L may be in the first device region RX1. In this case, the number of nanosheets included in the nanosheet stack NSS in the first device region RX1 may be less than the number of nanosheets included in the nanosheet stack NSS in the second device region RX2.

Figure 17A:
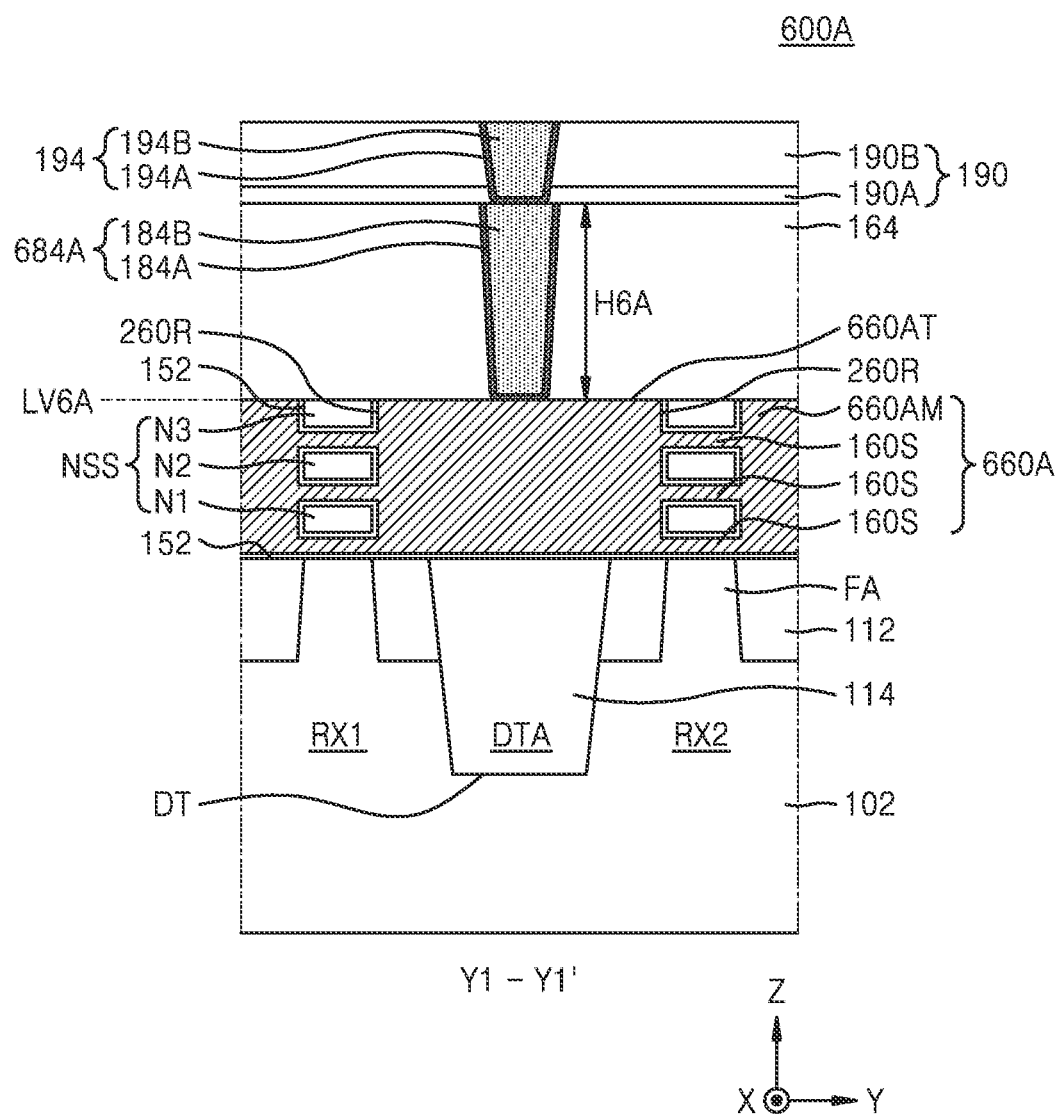
FIGS. 17A, 17B and 17C are cross-sectional views for describing an integrated circuit device according to other embodiments.
Figure 17B:
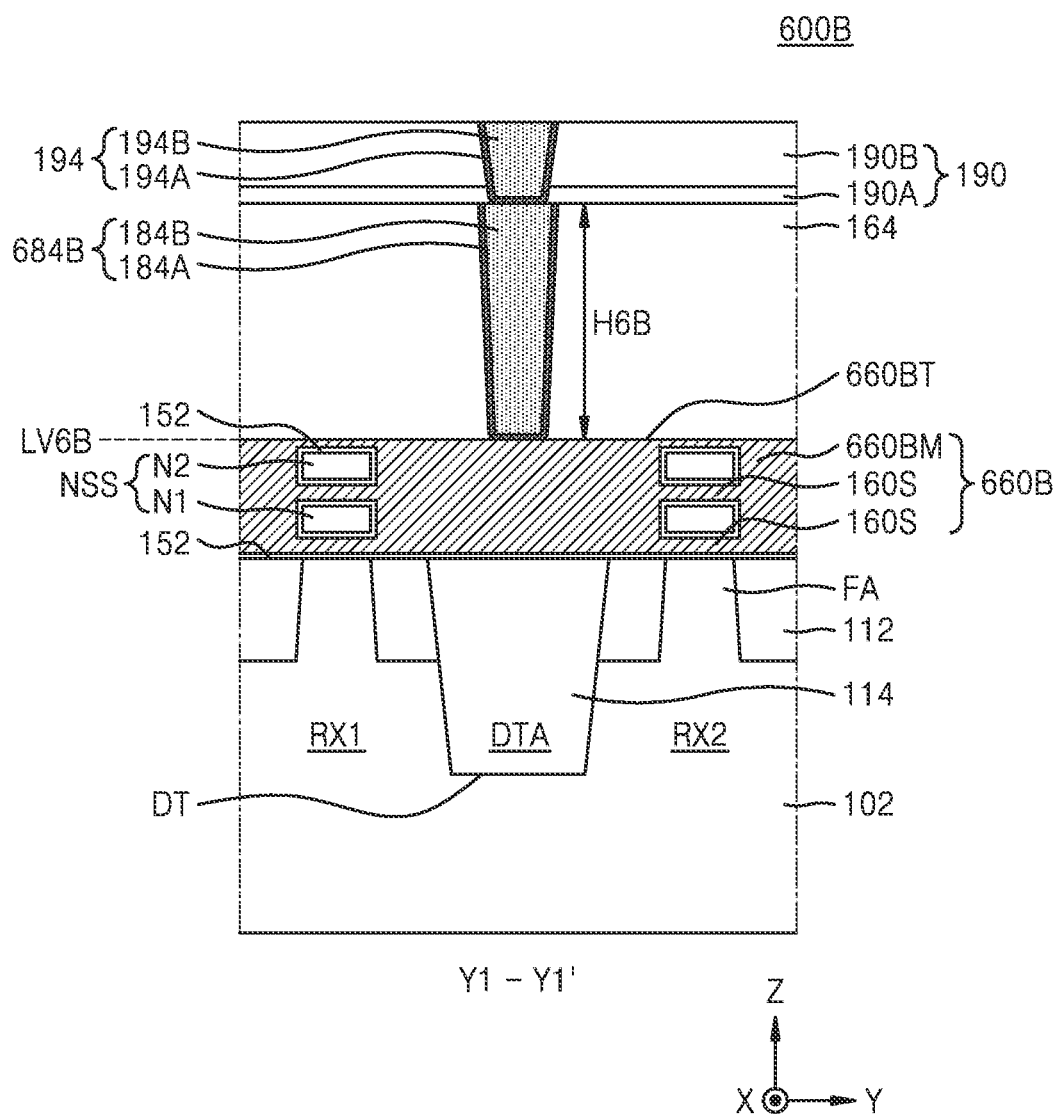
Figure 17C:
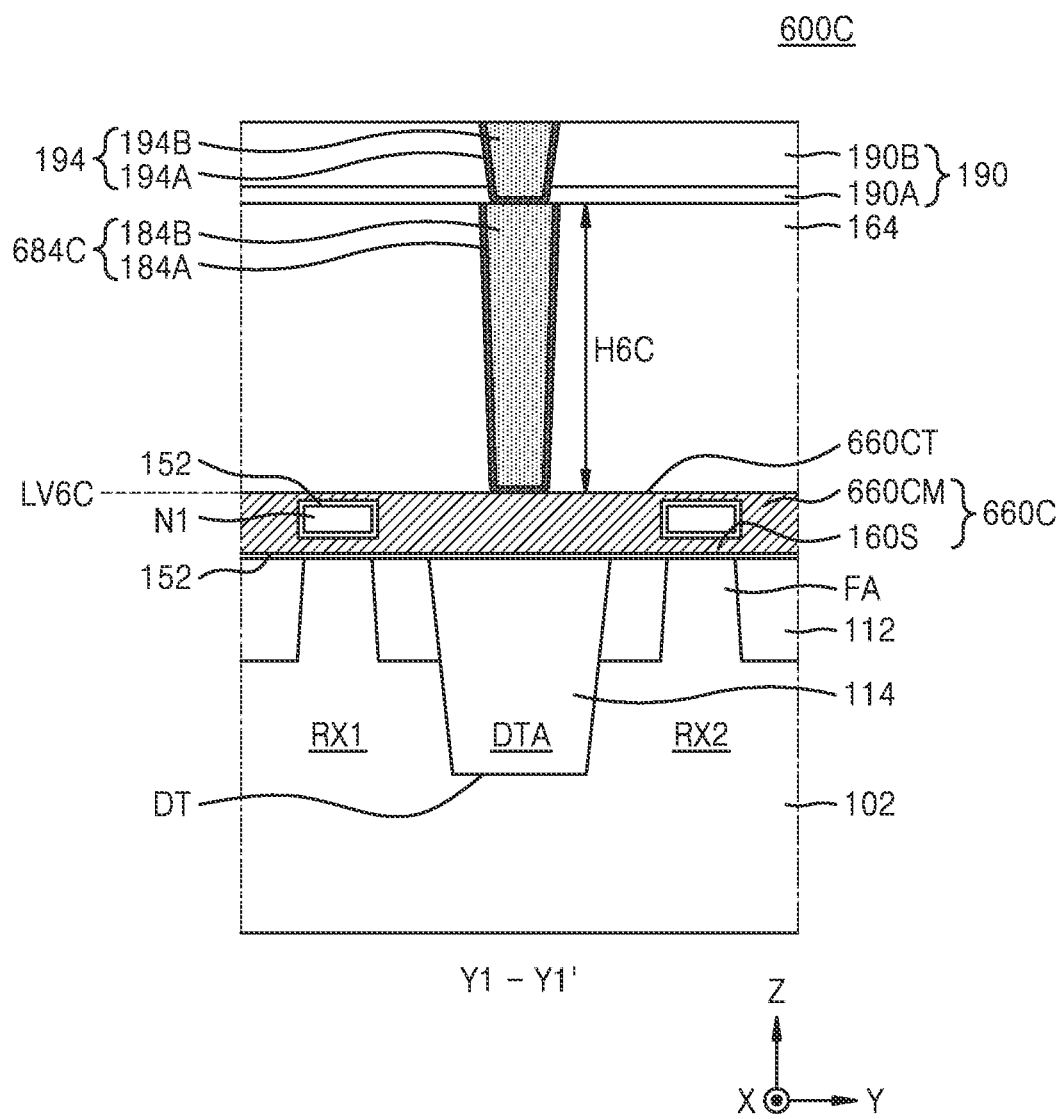

FIGS. 17A, 17B and 17C are cross-sectional views for describing an integrated circuit device 600A, 600B or 600C according to other embodiments. In FIG. 17A, some elements of a portion corresponding to a cross-sectional surface taken along line Y1-Y1' of FIG. 1 is illustrated.

Referring to FIG. 17A, the integrated circuit device 600A may have substantially the same configuration as that of the integrated circuit device 200 described above with reference to FIG. 8. The integrated circuit device 600A may include a gate line 660A instead of the gate line 260 of the integrated circuit device 200.

The gate line 660A may have substantially the same configuration as that of the gate line 260 described above with reference to FIG. 8. A main gate portion 660AM of the gate line 660A may not include a connection protrusion portion 260P. The main gate portion 660AM may include a recess top surface 660AT which extends to be flat in a second horizontal direction (a Y direction) at a second vertical level LV6A which is lower than the first vertical level LV1 illustrated in FIG. 8. The recess top surface 660AT may extend to be fat over a total length of the gate line 660A in the second horizontal direction (the Y direction).

The recess top surface 660AT of the main gate portion 660AM, like the description of the recess top surface 260L of the main gate portion 260M described above with reference to FIG. 8, may include a recess portion 260R which is formed at a position overlapping a fin-type active region FA and a nanosheet stack NSS in a vertical direction (a Z direction) in a first device region RX1 and a second device region RX2. The recess portion 260R may be filled with a third nanosheet N3 and a gate dielectric layer 152 which covers a side surface, a bottom surface, and a top surface of the third nanosheet N3.

In embodiments, a process of manufacturing the integrated circuit device 600A may include a process of oxidizing the third nanosheet N3 filling the recess portion 260R. In this case, the integrated circuit device 600A illustrated in FIG. 17A may include a semiconductor oxide piece having a configuration similar to that of the semiconductor oxide piece 420B illustrated in FIG. 15, instead of the third nanosheet N3.

In FIG. 17A, a structure in which the main gate portion 660AM of the gate line 660A includes the recess top surface 660AT extending long in in the second horizontal direction (the Y direction) at a second vertical level LV6A, but the inventive concept is not limited thereto. In other embodiments, the gate line 660A may include a recess top surface which extends long in the second horizontal direction (the Y direction) at the third vertical level LV23 or the fourth vertical level LV24 illustrated in FIG. 8, instead of the recess top surface 660AT. In this case, either one or both of the second and third nanosheets N2 and N3 illustrated in FIG. 17A may be omitted.

In the integrated circuit device 600A, a stack structure of a gate contact 684A and a gate via contact 194 each connected to the gate line 660A may be disposed in an inter-device isolation region DTA. In other embodiments, the stack structure of the gate contact 684A and the gate via contact 194 may be disposed in one of the first device region RX1 and the second device region RX2. A vertical length H6A (i.e., a height in a vertical direction (a Z direction)) of the gate contact 684A may be greater than a vertical length of the gate contact 184 illustrated in FIG. 8.

In FIG. 17B, some elements of a portion corresponding to a cross-sectional surface taken along line Y1-Y1' of FIG. 1 is illustrated.

Referring to FIG. 17B, the integrated circuit device 600B may have substantially the same configuration as that of the integrated circuit device 400 described above with reference to FIGS. 13A to 13C. The integrated circuit device 600B may include a gate line 660B instead of the gate line 460 of the integrated circuit device 400.

The gate line 660B may have substantially the same configuration as that of the gate line 460 described above with reference to FIGS. 13A to 13C. A main gate portion 660BM of the gate line 660B may not include a connection protrusion portion 460P. The main gate portion 660BM may include a recess top surface 660BT which extends to be flat in a second horizontal direction (a Y direction) at a second vertical level LV6B which is lower than the first vertical level LV1 illustrated in FIG. 13C. The recess top surface 660BT may extend to be fat over a total length of the gate line 660B in the second horizontal direction (the Y direction).

Descriptions of the recess top surface 660BT of the main gate portion 660BM and peripheral elements thereof may be substantially the same as the descriptions of the recess top surface 460L and the peripheral elements thereof described above with reference to FIG. 13C.

In the integrated circuit device 600B, a stack structure of a gate contact 684B and a gate via contact 194 each connected to the gate line 660B may be disposed in an inter-device isolation region DTA. In other embodiments, the stack structure of the gate contact 684B and the gate via contact 194 may be disposed in one of the first device region RX1 and the second device region RX2. A vertical length H6B (i.e., a height in a vertical direction (a Z direction)) of the gate contact 684B may be greater than a vertical length of the gate contact 184 illustrated in FIG. 13C.

In FIG. 17C, some elements of a portion corresponding to a cross-sectional surface taken along line Y1-Y1' of FIG. 1 is illustrated.

Referring to FIG. 17C, the integrated circuit device 600C may have substantially the same configuration as that of the integrated circuit device 500 described above with reference to FIG. 16. The integrated circuit device 600C may include a gate line 660C instead of the gate line 560 of the integrated circuit device 500.

The gate line 660C may have substantially the same configuration as that of the gate line 560 described above with reference to FIG. 16. A main gate portion 660CM of the gate line 660C may not include a connection protrusion portion 560P. The main gate portion 660CM may include a recess top surface 660CT which extends to be flat in a second horizontal direction (a Y direction) at a second vertical level LV6C which is lower than the first vertical level LV1 illustrated in FIG. 16. The recess top surface 660CT may extend to be fat over a total length of the gate line 660C in the second horizontal direction (the Y direction).

Descriptions of the recess top surface 660CT of the main gate portion 660CM and peripheral elements thereof may be substantially the same as the descriptions of the recess top surface 560L and the peripheral elements thereof described above with reference to FIG. 16.

In the integrated circuit device 600C, a stack structure of a gate contact 684C and a gate via contact 194 each connected to the gate line 660C may be disposed in an inter-device isolation region DTA. In other embodiments, the stack structure of the gate contact 684C and the gate via contact 194 may be disposed in one of the first device region RX1 and the second device region RX2. A vertical length H6C (i.e., a height in a vertical direction (a Z direction)) of the gate contact 684C may be greater than a vertical length of the gate contact 184 illustrated in FIG. 16.

Figure 18:
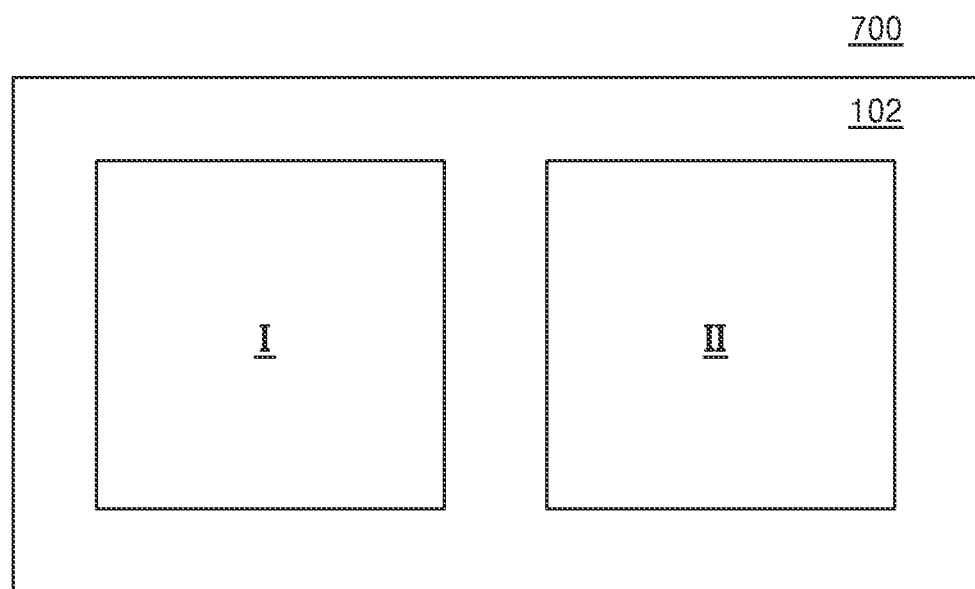
FIG. 18 is a block diagram of an integrated circuit device according to embodiments.

FIG. 18 is a block diagram of an integrated circuit device 700 according to embodiments.

Referring to FIG. 18, the integrated circuit device 700 may include a substrate including a first region I and a second region II. The first region I and the second region II of the substrate 102 may denote different regions and may be regions for performing different operations on the substrate 102. The first region I and the second region II may be regions which are apart from each other, or may be regions connected to each other.

In some embodiments, each of the first region I and the second region II may be a region selected from among a memory region and a non-memory region. The memory region may be a region configuring a volatile memory device, such as dynamic random access memory (DRAM) or static random access memory (SRAM), or a non-volatile memory device such as read only memory (ROM), mask ROM (MROM), programmable ROM (PROM), erasable ROM (EPROM), electrically erasable ROM (EEPROM), ferromagnetic ROM (FRAM), phase change RAM (PRAM), magnetic RAM (MRAM), resistive RAM (RRAM), or flash memory. The non-memory region may include a logic region. The logic region may include a plurality of standard cells, performing a desired logical function, such as a counter and a buffer. The standard cells may include various kinds of logic cells including a plurality of circuit elements such as a transistor and a register. The logic cells may configure, for example, an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FIL), and a multiplexer (MXT/MXIT). The logic cells may configure OR/AND/INVERTER (OAD, AND/OR (AO), AND/OR/INVERTER (AOI), a D flip-flop, a reset flip-flop, a master-slave flip-flop, and a latch.

Figure 19A:
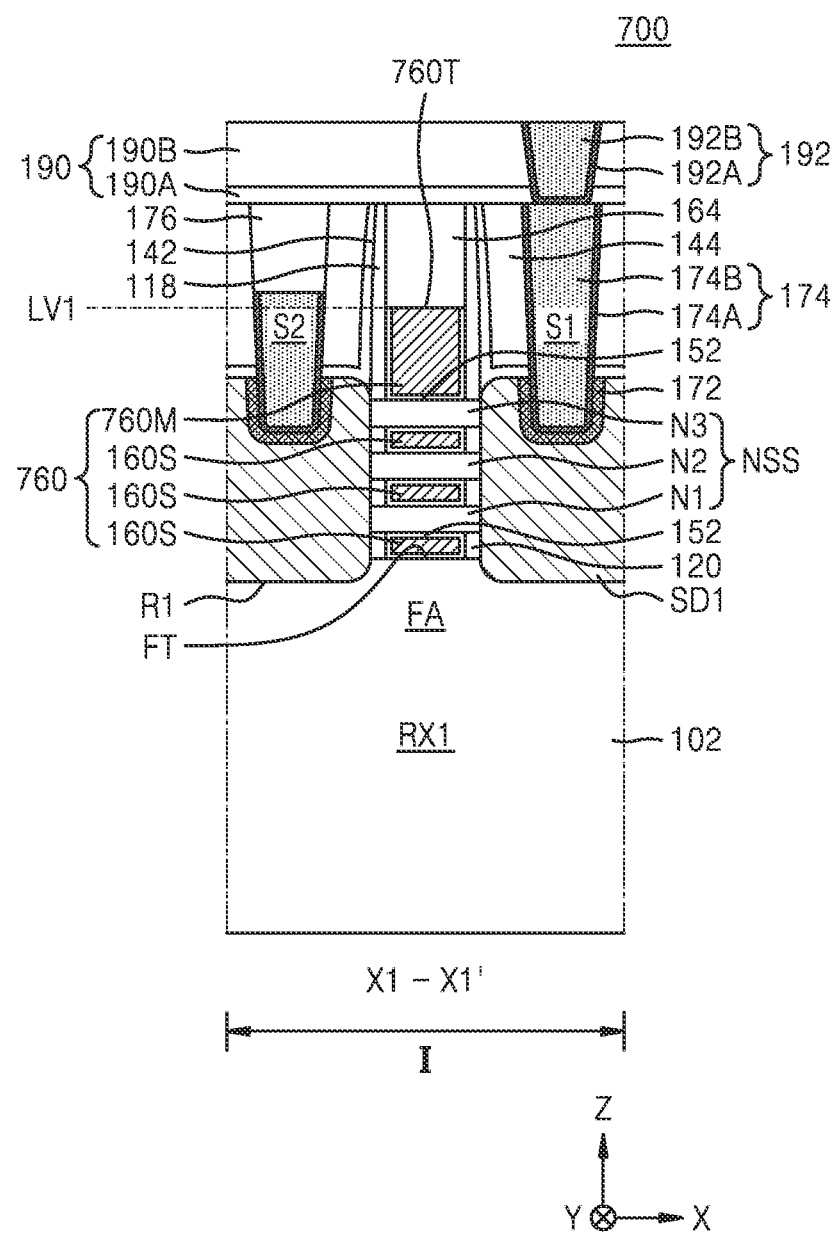
FIGS. 19A, 19B and 19C are cross-sectional views for describing some elements of a first region of the integrated circuit device illustrated in FIG. 18.
Figure 19B:
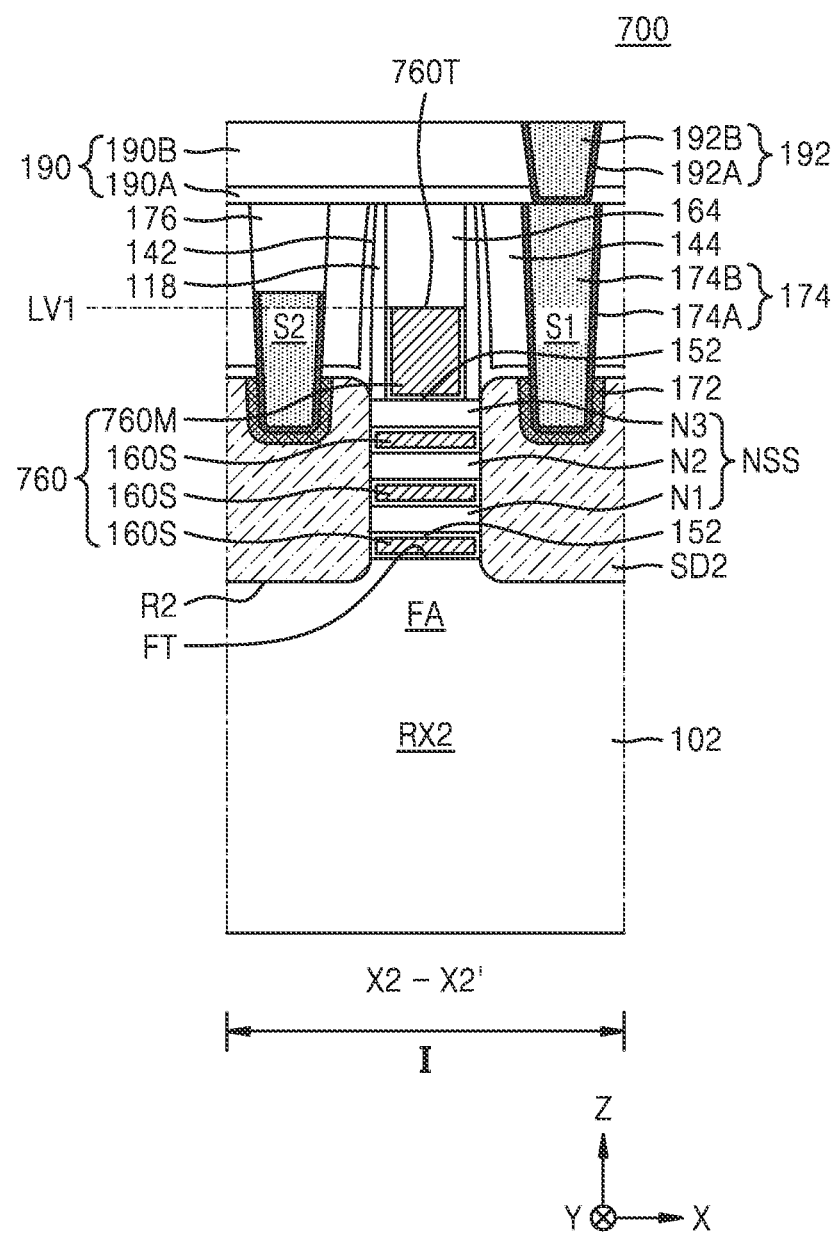
Figure 19C:
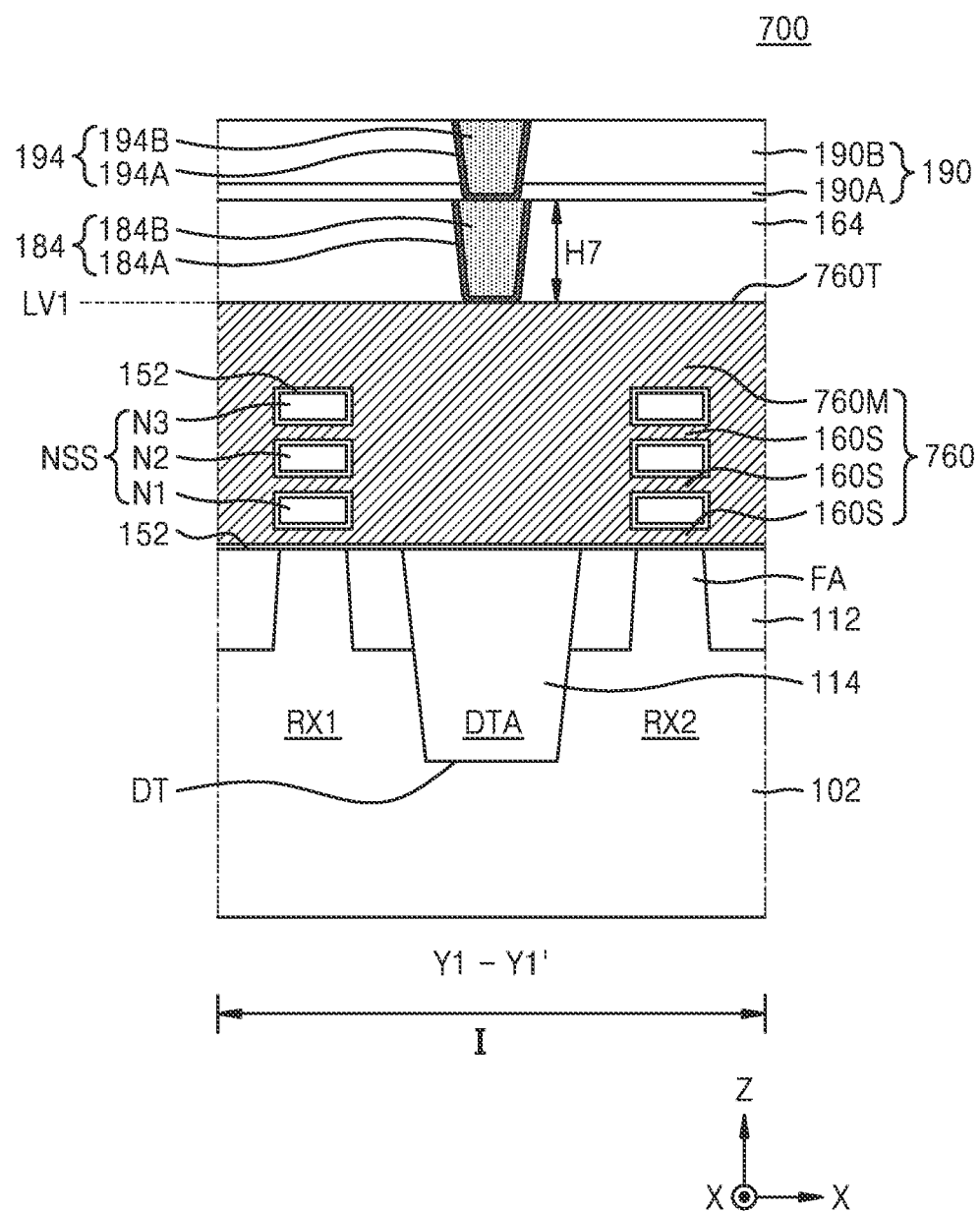

FIGS. 19A, 19B and 19C are cross-sectional views for describing some elements of a first region I of the integrated circuit device 700 illustrated in FIG. 18. In FIG. 19A, some elements of a portion corresponding to a cross-sectional surface taken along line X1-X1' of FIG. 1 is illustrated. In FIG. 19B, some elements of a portion corresponding to a cross-sectional surface taken along line X2-X2' of FIG. 1 is illustrated. In FIG. 19C, some elements of a portion corresponding to a cross-sectional surface taken along line Y1-Y1' of FIG. 1 is illustrated.

Referring to FIGS. 19A to 19C, in the first region I of the integrated circuit device 700, a substrate 102 may have substantially the same structure as that of the integrated circuit device 100 described above with reference to FIGS. 1 and 2A to 2D. A gate line 760, instead of the gate line 160, may be formed on the substrate 102 in the first region I of the integrated circuit device 700.

The gate line 760 may have substantially the same configuration as that of the gate line 160 described above with reference to FIGS. 1 and 2A to 2D. The gate line 760 may include a main gate portion 760M including a top surface 760T which extends to be flat in a second horizontal direction (a Y direction) at a first vertical level LV1. The top surface 760T of the main gate portion 760M included in the gate line 760 may extend to be flat over a total length of the gate line 760 in the second horizontal direction (the Y direction). A protrusion portion may not be formed in the top surface 760T of the gate line 760.

In the first region I of the integrated circuit device 700, a stack structure of a gate contact 184 and a gate via contact 194 each connected to the gate line 760 may be disposed in an inter-device isolation region DTA. In other embodiments, the stack structure of the gate contact 184 and the gate via contact 194 may be disposed in one of a first device region RX1 and a second device region RX2.

In embodiments, a vertical length H7 (i.e., a height in a vertical direction (a Z direction)) of the gate contact 184 may be the same as or similar to a vertical length of the gate contact 184 illustrated in FIG. 2C. In other embodiments, a vertical length H7 of the gate contact 184 may be less than vertical lengths H6A, H6B, and H6C of the gate contacts 684A, 684B, and 684C illustrated in FIGS. 17A to 17C.

Referring again to FIG. 18, in the second region II of the integrated circuit device 700, the substrate 102 may include at least one structure selected from among the structures of the integrated circuit devices 100, 100A, 100B, 100C, 100D, 100E, 200, 200A, 200B, 200C, 300, 400, 400A, 400B, 500, 600A, 600B, and 600C described above with reference to FIGS. 2A to 17. In embodiments, the first region I of the integrated circuit device 700 may include a nanosheet stack NSS including at least one nanosheet surrounded by the gate line 760 described above with reference to FIGS. 19A to 19C, and the second region II may include a nanosheet stack NSS including at least one nanosheet surrounded by one of the gate lines 260A, 260B, 460, 460A, 560, 660B, and 660C described above with reference to FIGS. 9, 10, 13A to 13C, 14, 15, 16, 17B, and 17C. Also, the number of nanosheets included in a nanosheet stack NSS in the second region II may be less than the number of nanosheets included in a nanosheet stack NSS in the first region I.

In the integrated circuit device 700 described above with reference to FIGS. 18 and 19A to 19C, at least a portion of a gate line disposed in the second region II may include a recess top surface which is lower than a top surface of the gate line 760 disposed in the first region I. Therefore, in the second region II of the integrated circuit device 700, an undesired parasitic capacitance between conductive regions adjacent to each other may be reduced, and a work function for transistors including a gate line including the recess top surface may be easily controlled.

In the integrated circuit devices described above with reference to FIGS. 1 to 19C, a configuration in which any one or any combination of the plurality of nanosheets N1 to N3 is provided on the fin-type active region FA has been described for example, but the inventive concept is not limited thereto. For example, in the integrated circuit devices described above with reference to FIGS. 1 to 19C, a semiconductor body having a nanowire shape instead of a nanosheet may be formed on the fin-type active region FA.

Figure 20A:
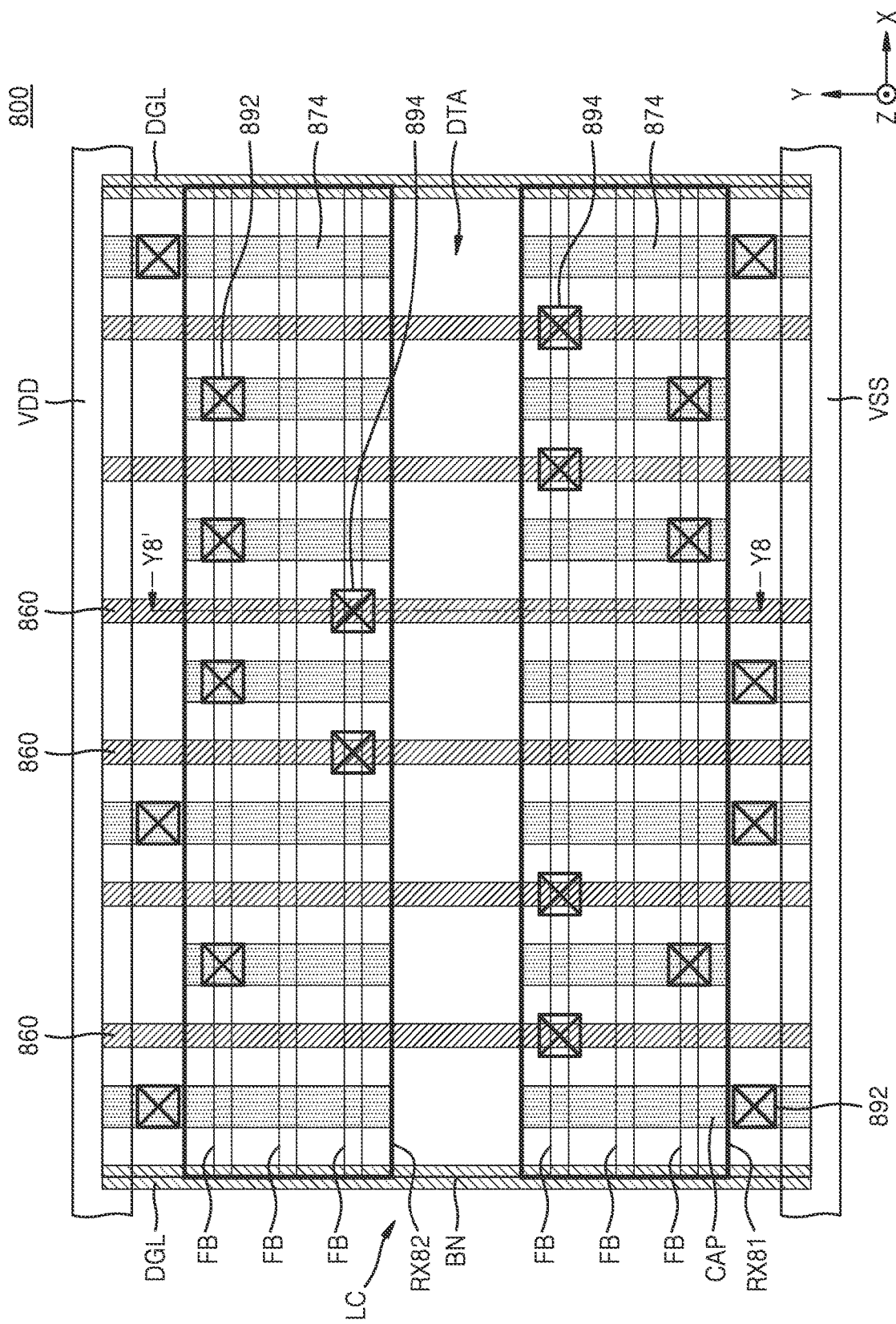
FIG. 20A is a plan layout diagram for describing an integrated circuit device according to embodiments.

FIG. 20A is a plan layout diagram for describing an integrated circuit device 800 according to embodiments. FIG. 20B is a cross-sectional view illustrating some elements of a cross-sectional surface taken along line Y8-Y8' of FIG. 20A.

Referring to FIGS. 20A and 20B, the integrated circuit device 800 may configure a logic cell including a fin field effect transistor (FinFET). The integrated circuit device 800 may include a logic cell LC which is formed in a region limited by a cell boundary BN on a substrate 802. A more detailed description of the substrate 802 may be substantially the same as the description of the substrate 102 given above with reference to FIGS. 2A to 2D.

The logic cell LC may include a first device region RX81 and a second device region RX82. A plurality of fin-type active regions FB protruding from the substrate 802 may be formed in each of the first device region RX81 and the second device region RX82. An inter-device isolation region DTA8 may be disposed between the first device region RX81 and the second device region RX82.

The plurality of fin-type active regions FB may extend in parallel in a width direction of the logic cell LC (i.e., a first horizontal direction (an X direction)). An isolation layer 812 may be formed on the substrate 802 between two adjacent fin-type active regions FB of the plurality of fin-type active regions FB, and an inter-device isolation layer 814 may be formed on the substrate 802 in the inter-device isolation region DTA8. The isolation layer 812 and the inter-device isolation layer 814 may respectively have substantially the same configurations as those of the isolation layer 812 and the inter-device isolation layer 814 described above with reference to FIGS. 2A to 2D. The plurality of fin-type active regions FB may protrude to a portion on the isolation layer 812 in a fin shape, in the first device region RX81 and the second device region RX82.

A plurality of gate dielectric layers 832 and a plurality of gate lines 860 may extend in a height direction (i.e., a second horizontal direction (a Y direction)) of the logic cell LC on the substrate 802. The plurality of gate dielectric layers 832 and the plurality of gate lines 860 may cover a top surface and both sidewalls of each of the plurality of fin-type active regions FB, a top surface of the isolation layer 812, and a top surface of the inter-device isolation layer 814. A plurality of MOS transistors may be formed along the plurality of gate lines 860 in the first device region RX81 and the second device region RX82. Each of the plurality of MOS transistors may be an MOS transistor having a three-dimensional (3D) structure in which a channel is formed at each of the top surfaces and the both sidewalls of the plurality of fin-type active regions FB.

A dummy gate line DGL may extend along a cell boundary BN extending in the second horizontal direction (the Y direction). The dummy gate line DGL may include the same material as that of each of the plurality of gate lines 860. The dummy gate line DGL may maintain an electric floating state while an operation of the integrated circuit device 800 is operating, and thus, may function as an electrical isolation region between the logic cell LC and another peripheral logic cell thereof. The plurality of gate lines 860 and the plurality of dummy gate lines DGL may each have the same width in the first horizontal direction (the X direction) and may be arranged at a pitch in the first horizontal direction (the X direction).

The plurality of gate dielectric layers 832 may have the same configuration as that of the gate dielectric layer 152 described above with reference to FIGS. 2A to 2D. The plurality of gate lines 860 and the plurality of dummy gate lines DGL may each have the same configuration as that of the gate line 160 described above with reference to FIGS. 2A to 2D.

The gate line 860 may include a connection protrusion portion 860P, which includes a protrusion top surface 860U at a first vertical level LV81 on a substrate 802, and a recess top surface 860L which extends long in the second horizontal direction (the Y direction) from the connection protrusion portion 860P at a second vertical level LV82 which is lower than the first vertical level LV81. The gate line 860 may extend long in the second horizontal direction (the Y direction) in the first device region RX81, the inter-device isolation region DTA8, and the second device region RX82. The recess top surface 860L of the gate line 860 may be higher than an uppermost surface of the fin-type active region FB in a vertical direction (a Z direction). A top surface of the gate line 860 may be covered by an insulation capping line 864. The insulation capping line 864 may contact the protrusion top surface 860U and the recess top surface 860L. A plurality of insulation capping lines 864 may include silicon nitride.

A plurality of source/drain regions may be formed at both sides of each of the gate lines 860, on top surfaces of the plurality of fin-type active regions FB. In embodiments, the first device region RX81 may be an NMOS transistor region, and the second device region RX82 may be a PMOS transistor region. In this case, a plurality of source/drain regions in the first device region RX81 may have substantially the same configuration as that of the first source/drain region SD1 described above with reference to FIGS. 2A to 2D, and a plurality of source/drain regions in the second device region RX82 may have substantially the same configuration as that of the second source/drain region SD2 described above with reference to FIGS. 2A to 2D.

A plurality of source/drain contacts 874 may be formed on the plurality of source/drain regions, in the first device region RX81 and the second device region RX82. A plurality of source/drain via contacts 892 may be formed on the plurality of source/drain contacts 874. The plurality of source/drain contacts 874 and the plurality of source/drain via contacts 892 may respectively have the same configurations as those of the source/drain contact 174 and the source/drain via contact 192 described above with reference to FIGS. 2A to 2D.

An insulation structure 890 may be formed on the insulation capping line 864. The insulation structure 890 may include an etch stop layer 890A and an interlayer insulation layer 890B, which are sequentially stacked on the insulation capping line 864.

A gate contact 884 and a gate via contact 894 may be formed on the gate line 860. The gate line 860 may be connected to an upper conductive line through the gate contact 884 and the gate via contact 894. The gate contact 884 and the gate via contact 894 may be configured to be connected to the connection protrusion portion 860P in the inter-device isolation region DTA8. The gate contact 884 may pass through the capping insulation pattern 164 in the vertical direction (the Z direction) and may contact a top surface of the connection protrusion portion 860P of the gate line 860. The gate via contact 894 may pass through the insulation structure 890 in the vertical direction (the Z direction) and may contact a top surface of the gate contact 884. A vertical level of an uppermost surface of the gate contact 884 may be the same as or similar to a vertical level of an uppermost surface of each of the plurality of source/drain contacts 874. The gate contact 884 and the gate via contact 894 may respectively have the same configurations as those of the gate contact 184 and the gate via contact 194 described above with reference to FIGS. 2A to 2D.

The connection protrusion portion 860P of the gate line 860 and a stack structure of the gate contact 884 and the gate via contact 894 each disposed on the gate line 860 may be disposed in the second device region RX2. However, the inventive concept is not limited to the illustrations of FIGS. 20A and 20B. For example, the connection protrusion portion 860P of the gate line 860 and the stack structure of the gate contact 884 and the gate via contact 894 each disposed on the gate line 860 may be disposed in the inter-device isolation region DTA or the first device region RX81.

In the logic cell LC, a ground line VSS may be connected to a fin-type active region FB, disposed in the first device region RX81, through some of the plurality of source/drain contacts 874, and a power line VDD may be connected to a fin-type active region FB, disposed in the second device region RX82, through the other source/drain contacts 874 of the plurality of source/drain contacts 874. The ground line VSS and the power line VDD may be formed at a level which is higher than a top surface of each of the plurality of source/drain contacts 874 and the plurality of gate contacts 894. The ground line VSS and the power line VDD may respectively include a conductive barrier layer and a wiring conductive layer. The conductive barrier layer may include Ti, Ta, TiN, TaN, or a combination thereof. The wiring conductive layer may include Co, Cu, W, an alloy thereof, or a combination thereof.

In the integrated circuit device 800 illustrated in FIGS. 20A and 2B, the connection protrusion portion 860P including the protrusion top surface 860U at the first vertical level LV81 which is relatively high may be included in a portion, connected to the gate contact 884, of the gate line 860, and another portion, which is near the connection protrusion portion 860P, of the gate line 860 may include the recess top surface 860L at the second vertical level LV82 which is lower than the first vertical level LV81. Therefore, in the integrated circuit device 800, an undesired parasitic capacitance between conductive regions adjacent to each other may be reduced. Also, a height difference in the vertical direction (the Z direction) between the protrusion top surface 860U at the first vertical level LV81 and the recess top surface 860L at the second vertical level LV82 may be variously adjusted, and thus, a work function for transistors including the gate line 860 may be easily controlled. Therefore, by using the gate line 860 including the protrusion top surface 860U and the recess top surface 860L which are at various vertical levels and have various sizes on the basis of a desired condition, the reliability of an integrated circuit device may be enhanced by a relatively simple method.

Figure 21A:
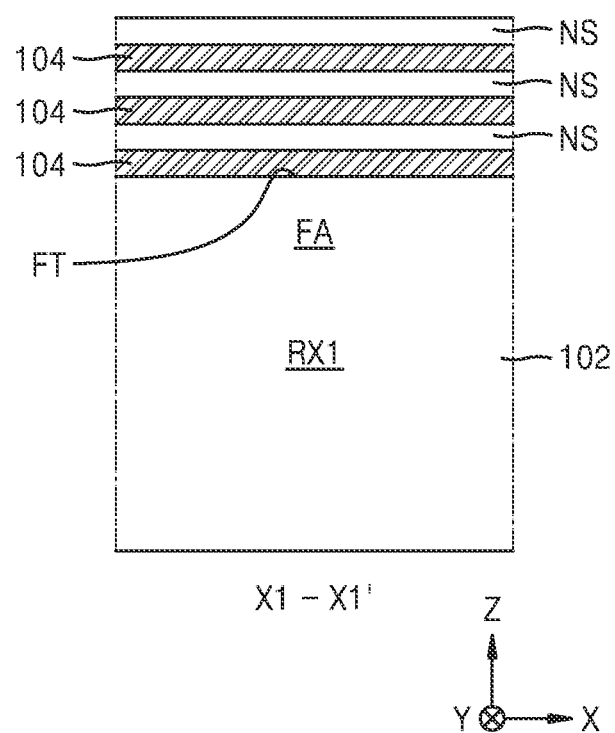
FIGS. 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B and 31C are cross-sectional views illustrating a method of manufacturing an integrated circuit device in a process sequence, according to embodiments.
Figure 21B:
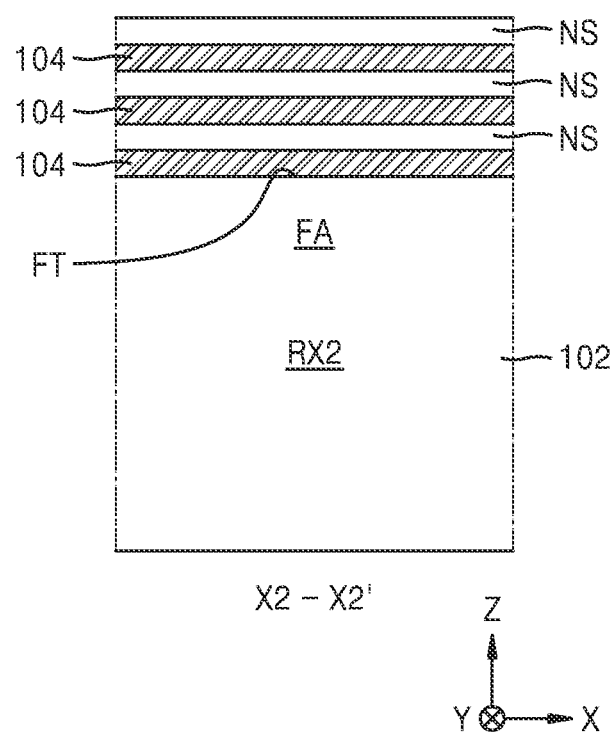
Figure 21C:
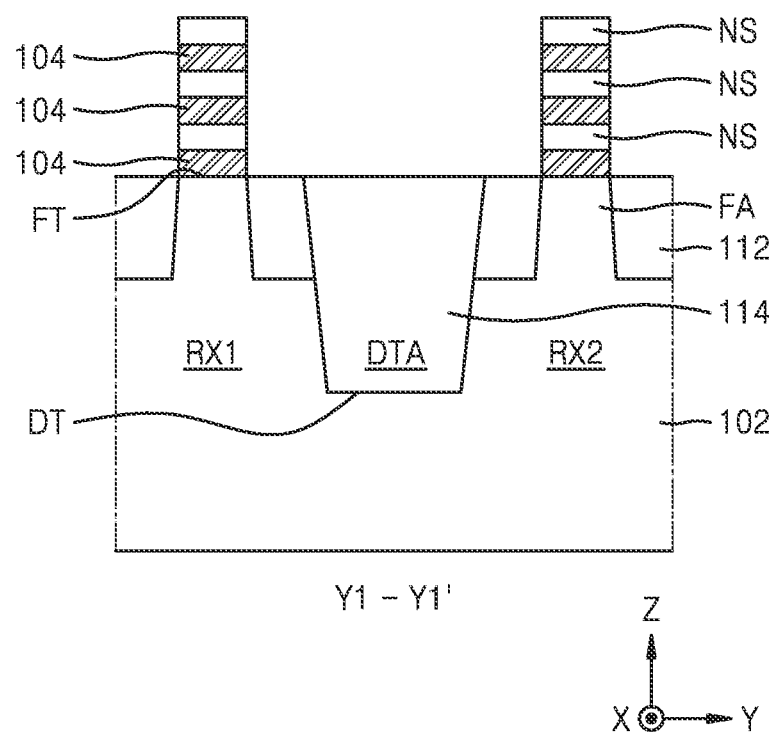
Figure 22A:
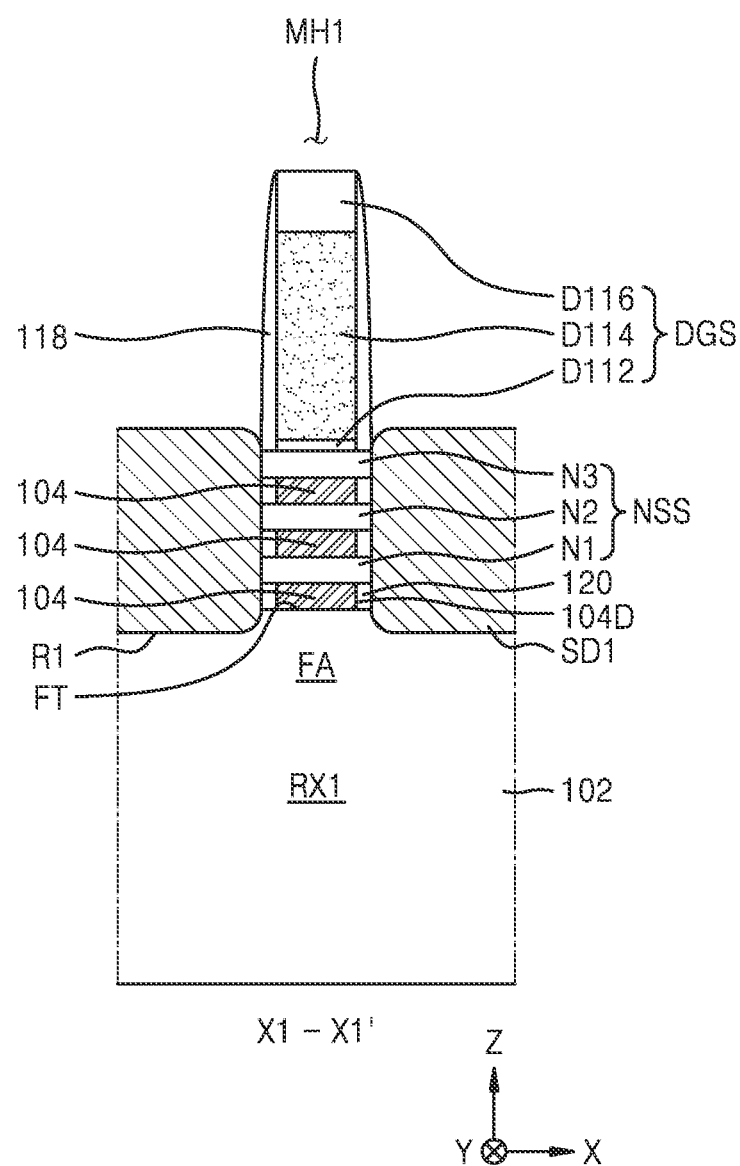
Figure 22B:
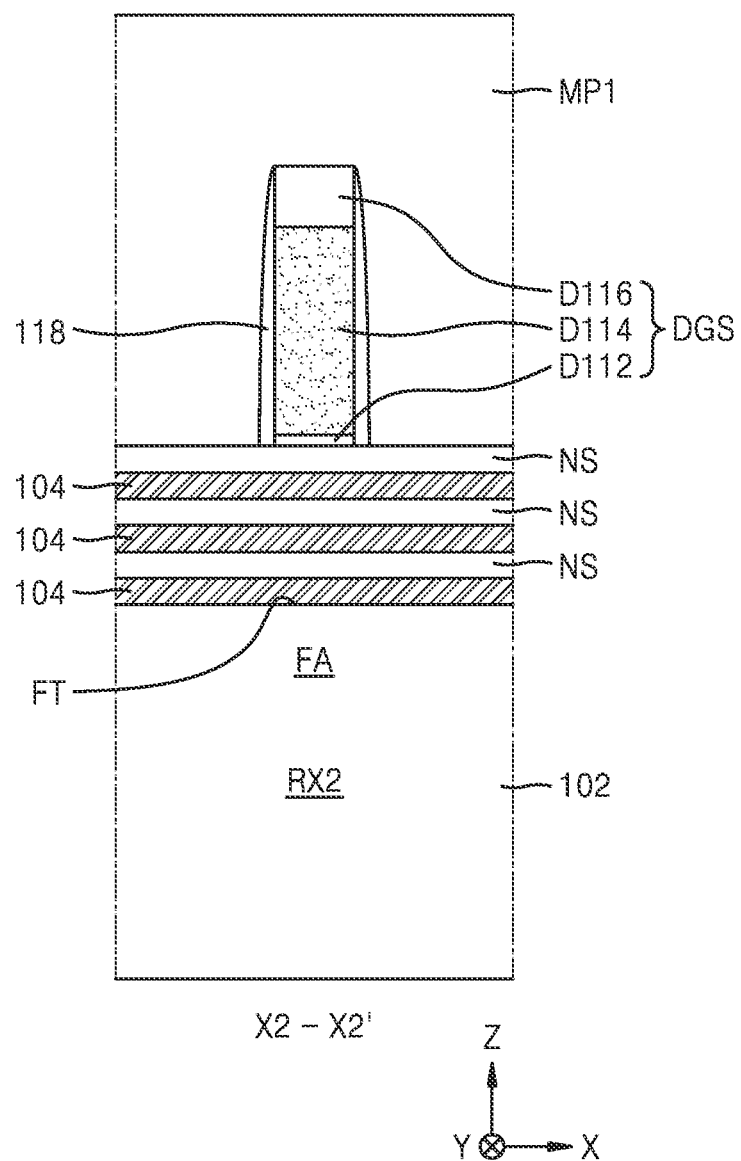
Figure 22C:
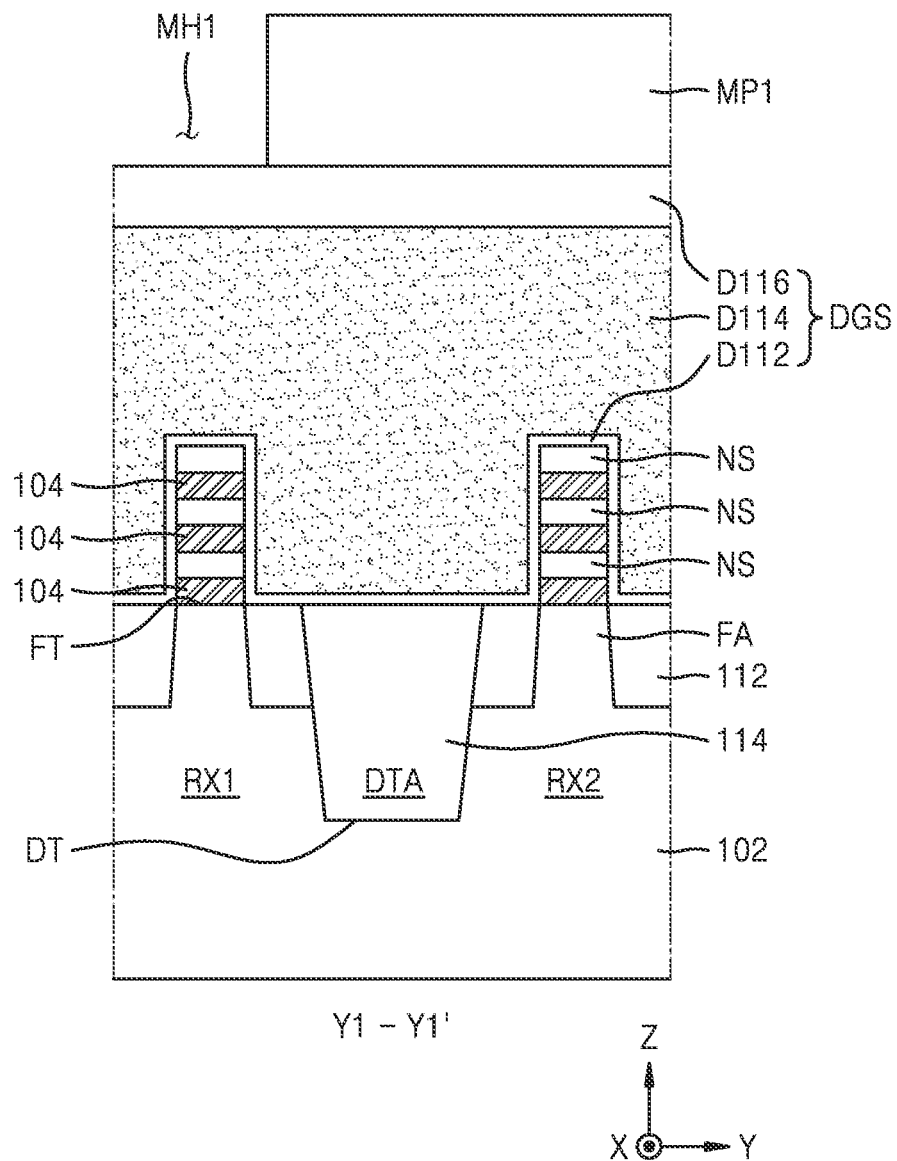

FIGS. 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B and 31C are cross-sectional views illustrating a method of manufacturing an integrated circuit device in a process sequence, according to embodiments. FIGS. 21A, 22A, ..., and 31A are cross-sectional views illustrating some elements, based on a process sequence, of a portion corresponding to a cross-sectional surface taken along line X1-X1' of FIG. 1. FIGS. 21B, 22B, ..., and 31B are cross-sectional views illustrating some elements, based on a process sequence, of a portion corresponding to a cross-sectional surface taken along line X2-X2' of FIG. 1. FIGS. 21C, 22C, ..., and 31C are cross-sectional views illustrating some elements, based on a process sequence, of a portion corresponding to a cross-sectional surface taken along line Y1-Y1' of FIG. 1. A method of manufacturing the integrated circuit device 100 illustrated in FIGS. 1 and 2A to 2D will be described below with reference to FIGS. 21A to 31C. In FIGS. 21A to 31C, the same reference numerals as FIGS. 1 and 2A to 2D refer to like elements, and their detailed descriptions may be omitted.

Referring to FIGS. 21A to 21C, a plurality of sacrificial semiconductor layers 104 and a plurality of nanosheet semiconductor layers NS may be alternately stacked on a substrate 102, and then, a plurality of fin-type active regions FA which protrude upward in a vertical direction (a Z direction) from the substrate 102 and extend in parallel in a first horizontal direction (an X direction) may be formed by etching the plurality of sacrificial semiconductor layers 104, the plurality of nanosheet semiconductor layers NS, and a portion of the substrate 102, in the first device region RX1 and the second device region RX2, and an isolation layer 112 covering lower both sidewalls of each of the plurality of fin-type active regions FA may be formed. A deep trench DT defining the first device region RX1 and the second device region RX2 may be formed by etching a portion of the isolation layer 112 and a portion of the substrate 102, and the deep trench DT may be filled with an inter-device isolation layer 114. A top surface of the isolation layer 112 and a top surface of the inter-device isolation layer 114 may be approximately equal or similar to a fin top surface FT of each of the plurality of fin-type active regions FA.

A stack structure of the plurality of sacrificial semiconductor layers 104 and the plurality of nanosheet semiconductor layers NS may remain on the fin top surface FT of each of the plurality of fin-type active regions FA, in the first device region RX1 and the second device region RX2.

The plurality of sacrificial semiconductor layers 104 and the plurality of nanosheet semiconductor layers NS may include semiconductor materials having different etch selectivity. In embodiments, the plurality of nanosheet semiconductor layers NS may include a Si layer, and the plurality of sacrificial semiconductor layers 104 may include a SiGe layer. In embodiments, a Ge content may be constant in the plurality of sacrificial semiconductor layers 104. The SiGe layer configuring the plurality of sacrificial semiconductor layers 104 may have a constant Ge content which is selected within a range of about 5 at. % to about 60 at. % (for example, about 10 at. % to about 40 at. %). A Ge content of the SiGe layer configuring the plurality of sacrificial semiconductor layers 104 may be variously selected depending on the case.

Referring to FIGS. 22A to 22C, a dummy gate structure DGS and an outer insulation spacer 118 covering both sidewalls of the dummy gate structure DGS may be formed on a stack structure of a plurality of sacrificial semiconductor layers 104 and a plurality of nanosheet semiconductor layers NS.

The dummy gate structure DGS may extend long in a second horizontal direction (a Y direction) intersecting with a fin-type active region FA, on a substrate 102. The dummy gate structure DGS may have a structure in which an oxide layer D112, a dummy gate layer D114, and a capping layer D116 are sequentially stacked. In embodiments, the dummy gate layer D114 may include polysilicon, and the capping layer D116 may include silicon nitride.

Subsequently, a first mask pattern MP1 including a first opening MH1 exposing a first device region RX1 may be formed on a resultant material in which the dummy gate structure DGS and the outer insulation spacer 118 are formed, and then, in a state in which a second device region RX2 is covered by the first mask pattern MP1, a portion of each of the plurality of sacrificial semiconductor layers 104 and the plurality of nanosheet semiconductor layers NS may be removed by using the dummy gate structure DGS and the outer insulation spacer 118 as an etch mask in the first device region RX1 and thus the plurality of nanosheet semiconductor layers NS may be divided into a plurality of nanosheet stacks NSS. Each of the plurality of nanosheet stacks NSS may include first to third nanosheets N1 to N3. A plurality of first recesses R1 may be formed on the fin-type active region FA by etching the fin-type active region FA exposed between two adjacent nanosheet stacks NSS of the plurality of nanosheet stacks NSS, in the first device region RX1. To form the plurality of first recesses R1, the fin-type active region FA may be etched by using a dry etching process, a wet etching process, or a combination thereof.

Subsequently, by selectively removing a portion of each of the plurality of sacrificial semiconductor layers 104 exposed at both sides of each of the plurality of nanosheet stacks NSS through the plurality of first recesses R1, a plurality of intent regions 104D may be formed between the first to third nanosheets N1 to N3 and between the first nanosheet N1 and the fin-type active region FA, and then, a plurality of inner insulation spacers 120 filling the plurality of intent regions 104D may be formed. To form the plurality of intent regions 104D, a portion of each of the plurality of sacrificial semiconductor layers 104 may be selectively etched by using an etch selectivity difference between the plurality of sacrificial semiconductor layers 104 and the first to third nanosheets N1 to N3. An atomic layer deposition (ALD) process, a chemical vapor deposition (CVD) process, an oxidization process, or a combination thereof may be used for forming a plurality of inner insulation spacers 120.

Subsequently, a plurality of first source/drain regions SD1 may be formed on the fin-type active region FA at both sides of each of the plurality of nanosheet stacks NSS. A semiconductor material may be epitaxially grown from a surface of the fin-type active region FA exposed at a bottom surface of each of the plurality of first recesses R1 and a sidewall of each of the first to third nanosheets N1 to N3, to form the plurality of first source/drain regions SD1. In embodiments, to form the plurality of first source/drain regions SD1, a low-pressure chemical vapor deposition (LPCVD) process, a selective epitaxial growth (SEG) process, or a cyclic deposition and etching (CDE) process may be performed by using source materials including an element semiconductor precursor. In embodiments, the plurality of first source/drain regions SD1 may include a Si layer doped with an n-type dopant. Silane ($SiH_4$), disilane ($Si_2H_6$), trisilane ($Si_3H_8$), and dichlorosilane ($SiH_2Cl_2$) may be used as a Si source, to form the plurality of first source/drain regions SD1. The n-type dopant may be selected from among P, As, and Sb.

Figure 23A:
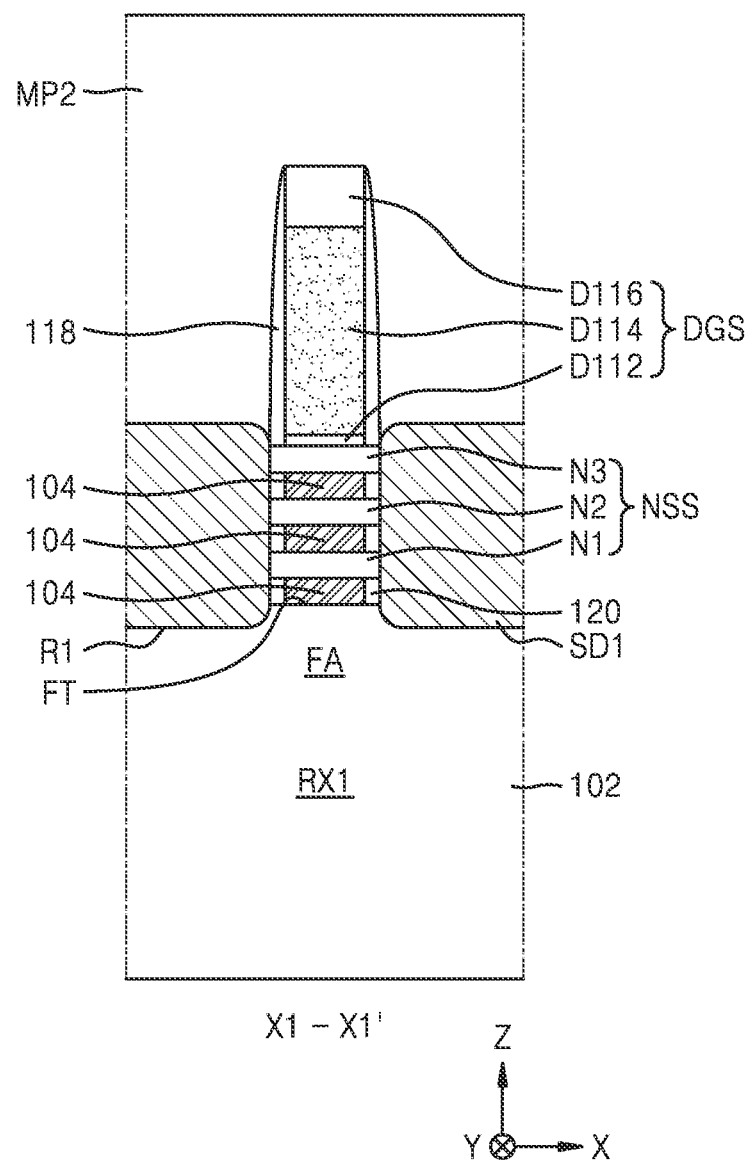
Figure 23B:
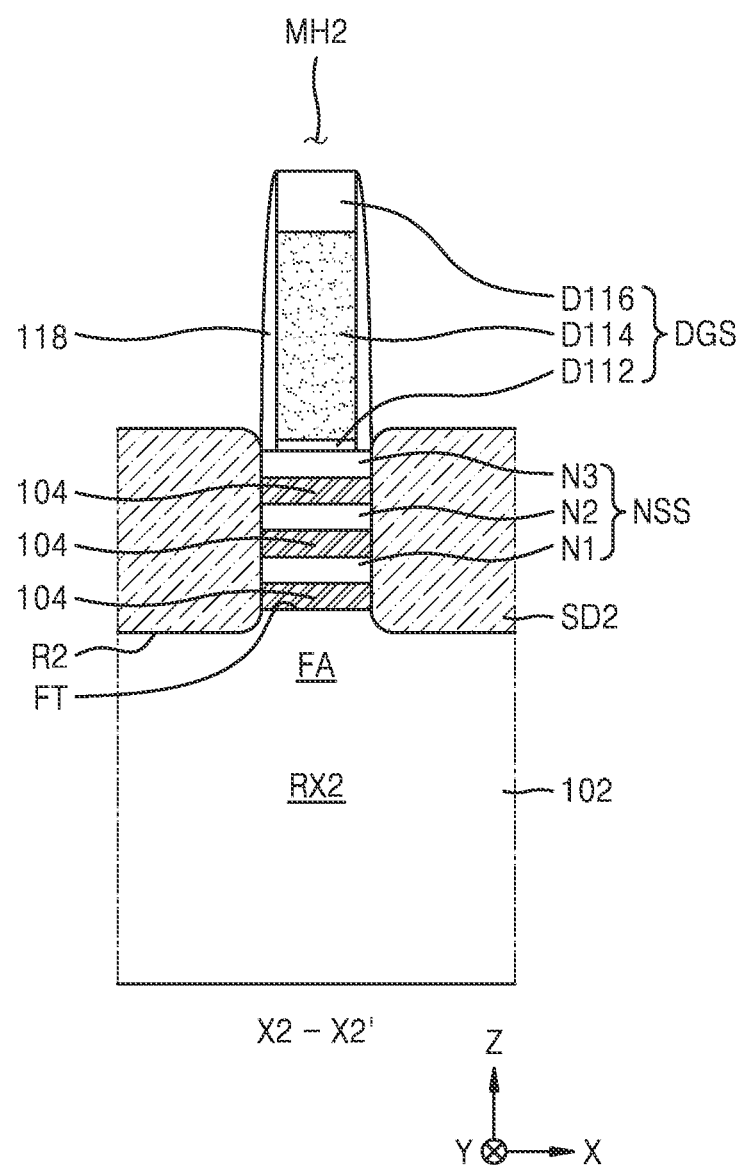
Figure 23C:
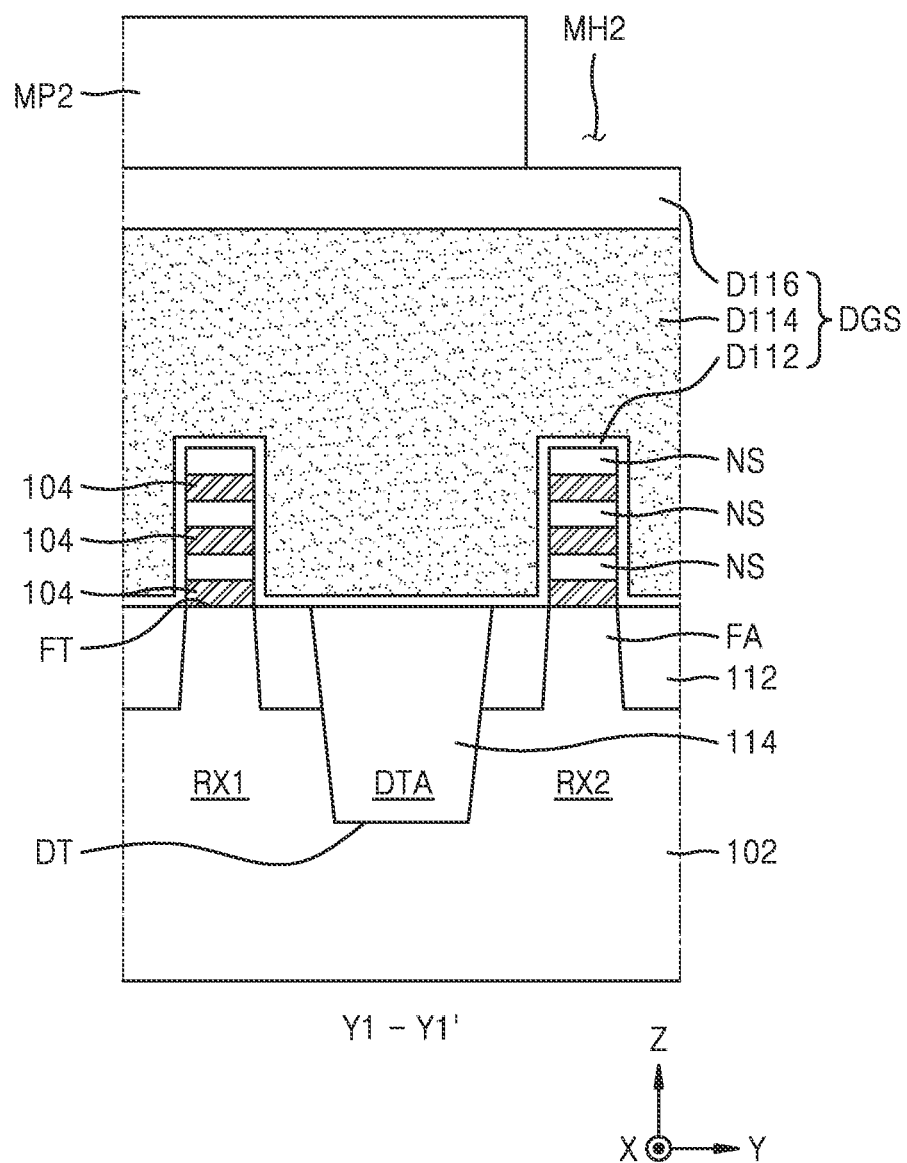

Referring to FIGS. 23A to 23C, a first mask pattern MP1 may be removed from a resultant material of FIGS. 22A to 22C, and then, a second mask pattern MP2 including a second opening MH2 exposing a second device region RX2 may be formed. In a state in which a first device region RX1 is covered by the second mask pattern MP2, a portion of each of a plurality of sacrificial semiconductor layers 104 and the plurality of nanosheet semiconductor layers NS may be removed by using a dummy gate structure DGS and an outer insulation spacer 118 as an etch mask in the second device region RX2 and thus the plurality of nanosheet semiconductor layers NS may be divided into a plurality of nanosheet stacks NSS. Each of the plurality of nanosheet stacks NSS may include first to third nanosheets N1 to N3. A plurality of second recesses R2 may be formed on a fin-type active region FA by etching the fin-type active region FA exposed between two adjacent nanosheet stacks NSS of the plurality of nanosheet stacks NSS, in the second device region RX2. A method of forming the plurality of recesses R2 may be the same as a method of forming the plurality of first recesses R1 described above with reference to FIGS. 22A to 22C.

Subsequently, a plurality of second source/drain regions SD2 may be formed on the fin-type active region FA at both sides of each of the plurality of nanosheet stacks NSS. Like the plurality of first source/drain regions SD1 described above with reference to FIGS. 22A to 22C, a semiconductor material may be epitaxially grown from a surface of the fin-type active region FA exposed at a bottom surface of each of the plurality of second recesses R2 and a sidewall of each of the first to third nanosheets N1 to N3, to form the plurality of second source/drain regions SD2. In embodiments, the plurality of second source/drain regions SD2 may include a SiGe layer doped with a p-type dopant. A Si source and a Ge source may be used for forming the plurality of second source/drain regions SD2. Silane (SiH4), desilane (Si2H6), trisilane (Si3H8), and dichlorosilane (SiH2Cl2) may be used as the Si source. Germanium (GeH4), degermanium (Ge2H6), trigermanium (Ge3H8), tetragermanium (Ge4H10), and dichlorogermanium (Ge2H2Cl2) may be used as the Ge source. The p-type dopant may be selected from among B and Ga.

Figure 24A:
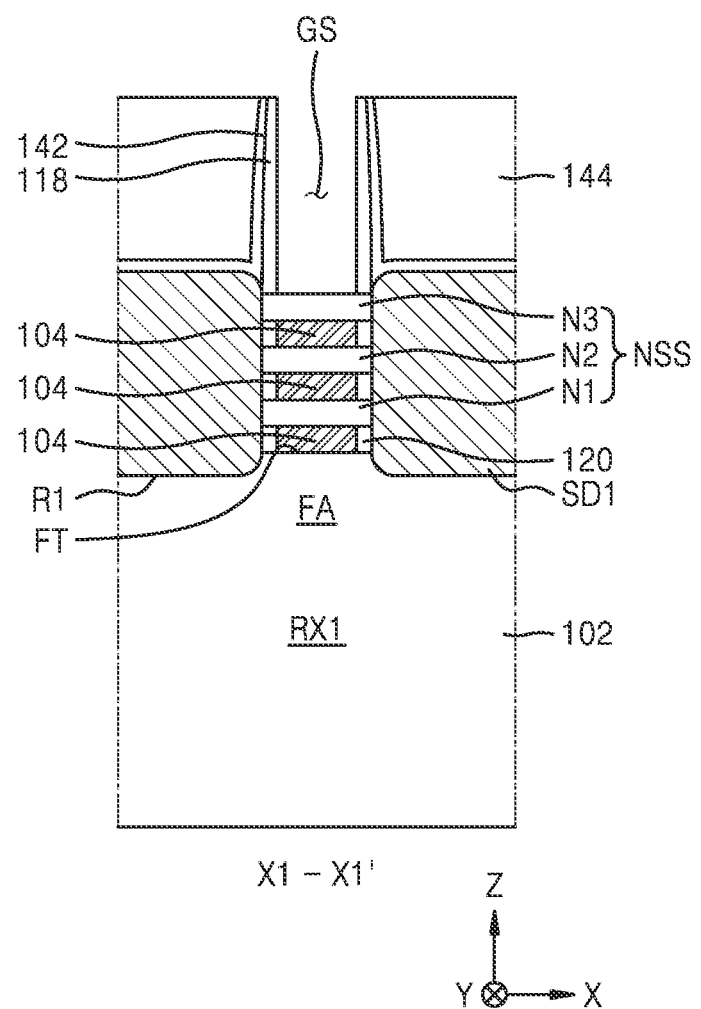
Figure 24B:
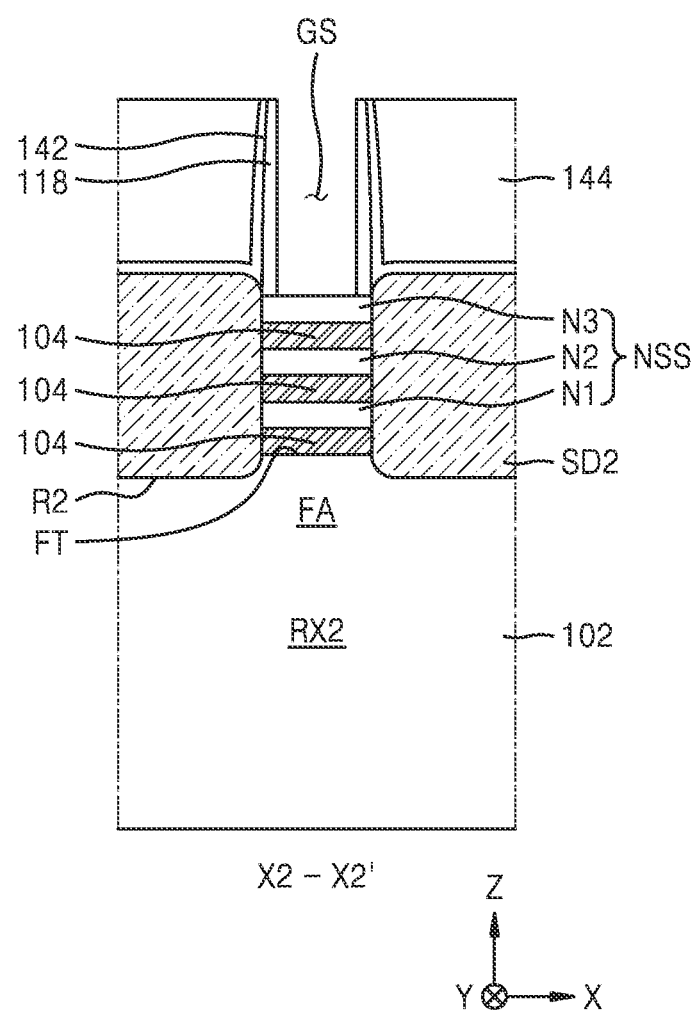
Figure 24C:
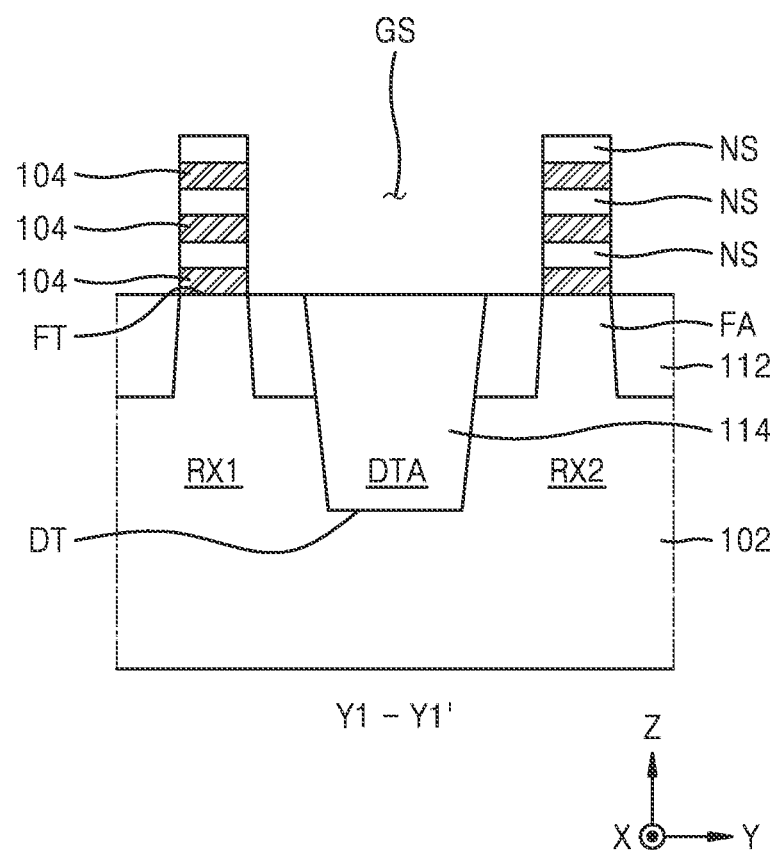

Referring to FIGS. 24A to 24C, a second mask pattern MP2 may be removed from a resultant material of FIGS. 23A to 23C, an insulation liner 142 covering a resultant material in which a plurality of first and second source/drain regions SD1 and SD2 are exposed may be formed subsequently, an inter-gate insulation layer 144 may be formed on the insulation liner 142 subsequently, the insulation liner 142 and the inter-gate insulation layer 144 may be planarized subsequently, and a top surface of the dummy gate layer D114 may be exposed by removing the capping layer D116. Subsequently, a gate space GS may be formed on the nanosheet stack NSS by removing the dummy gate layer D114 and the oxide layer D112 thereunder.

Figure 25A:
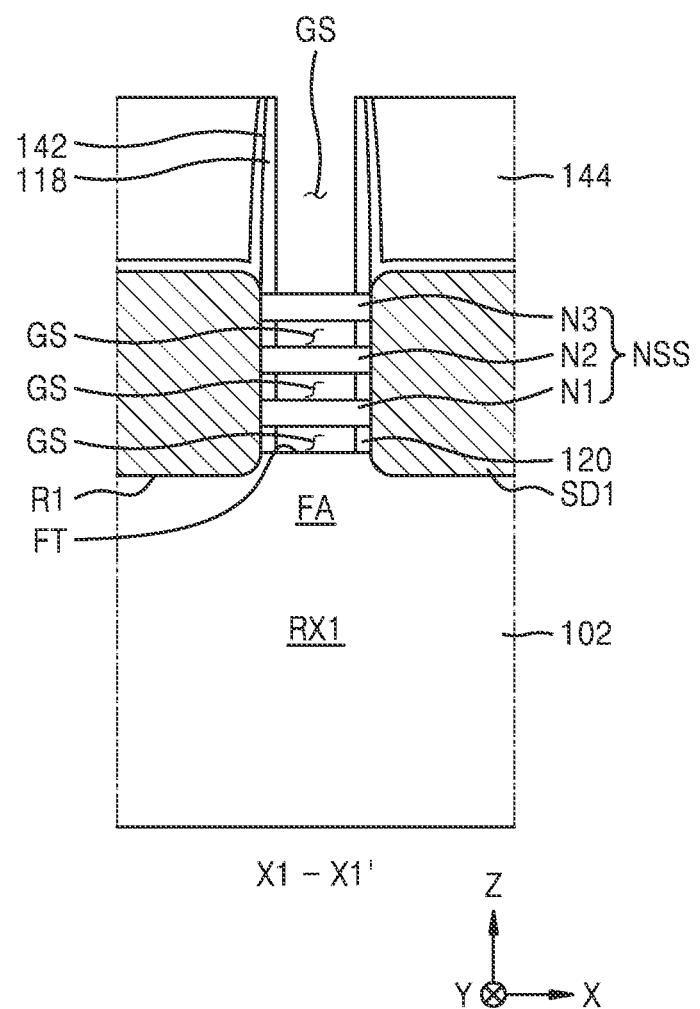
Figure 25B:
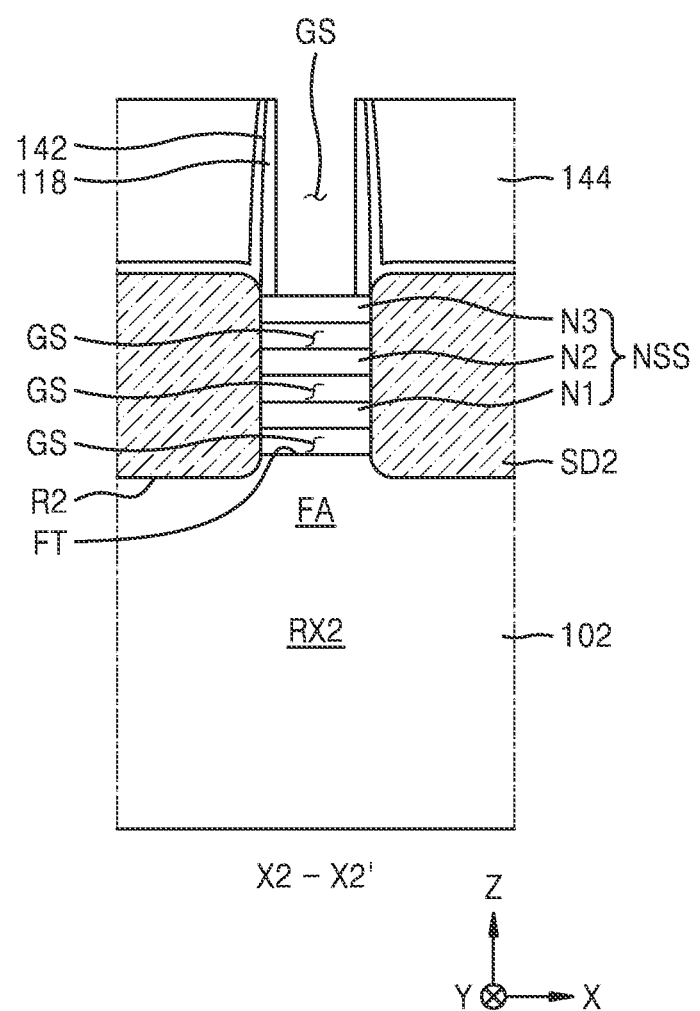
Figure 25C:
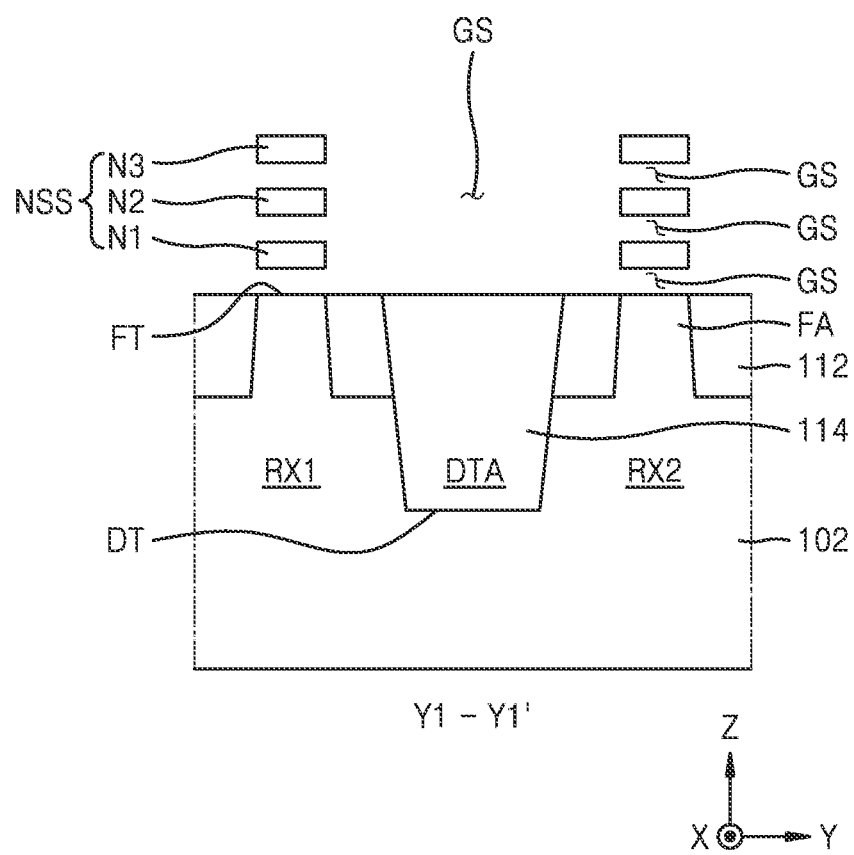

Referring to FIGS. 25A to 25C, by removing the plurality of sacrificial semiconductor layers 104, remaining on the fin-type active region FA through the gate space GS on the nanosheet stack NSS, from a resultant material of FIGS. 24A to 24C, the gate space GS may extend to a space between the plurality of nanosheets N1 to N3 and a space between the first nanosheet N1 and the fin top surface FT.

In embodiments, an etch selectivity difference between the first to third nanosheets N1 to N3 and the plurality of sacrificial semiconductor layers 104 may be used for selectively removing the plurality of sacrificial semiconductor layers 104. A liquid or gaseous etchant may be used for selectively removing the plurality of sacrificial semiconductor layers 104. In embodiments, a CH3COOH-based etchant (for example, an etchant including a compound of CH3COOH, HNO3, and HF or an etchant including a compound of CH3COOH, H2O2, and HF) may be used for selectively removing the plurality of sacrificial semiconductor layers 104, but the inventive concept is not limited thereto.

Figure 26A:
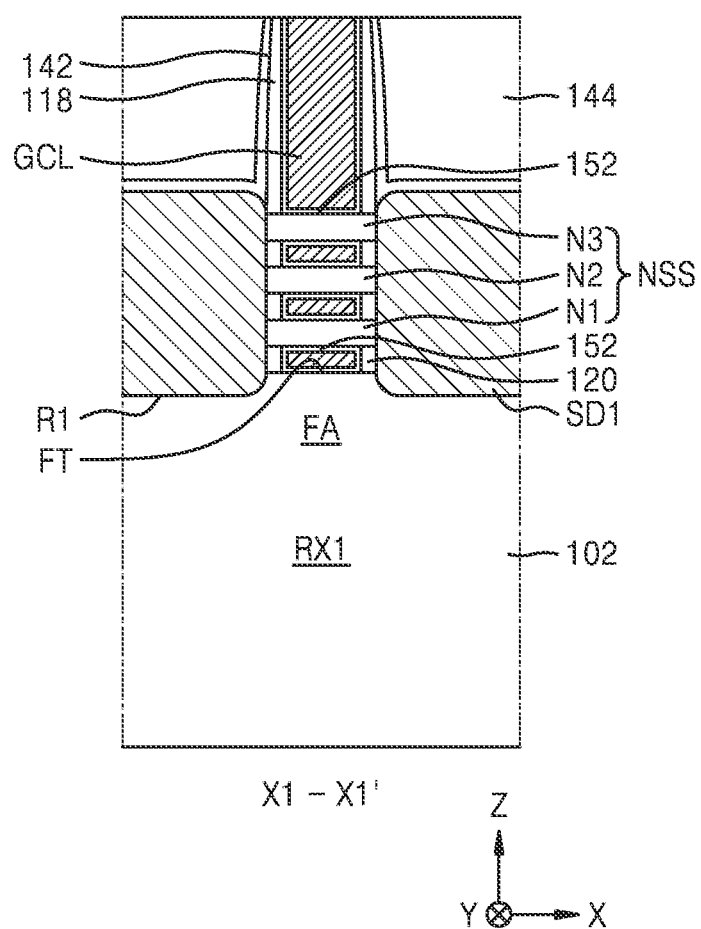
Figure 26B:
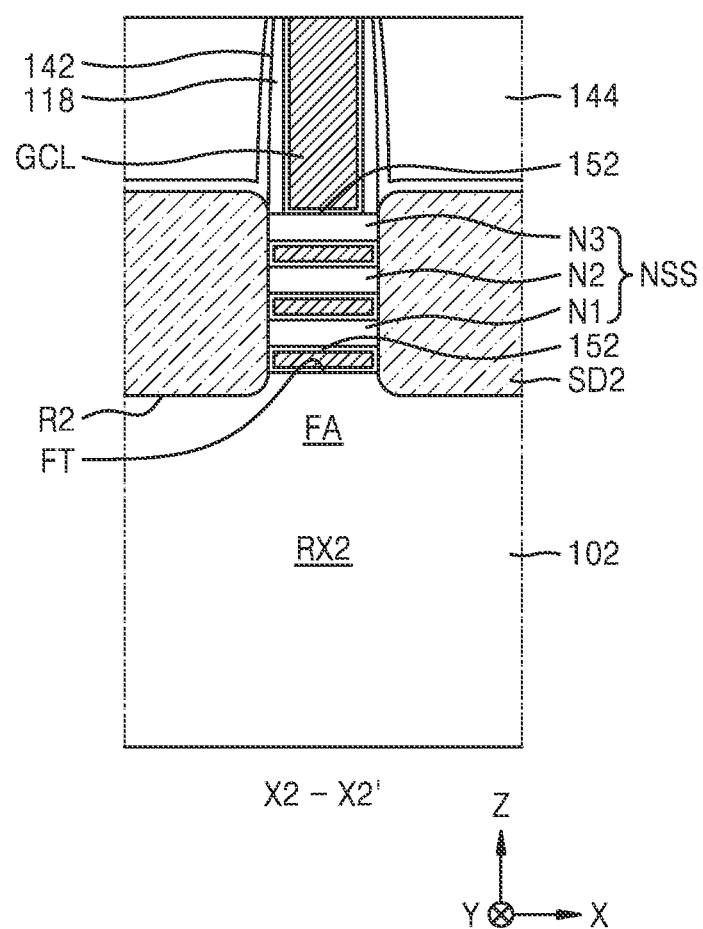
Figure 26C:
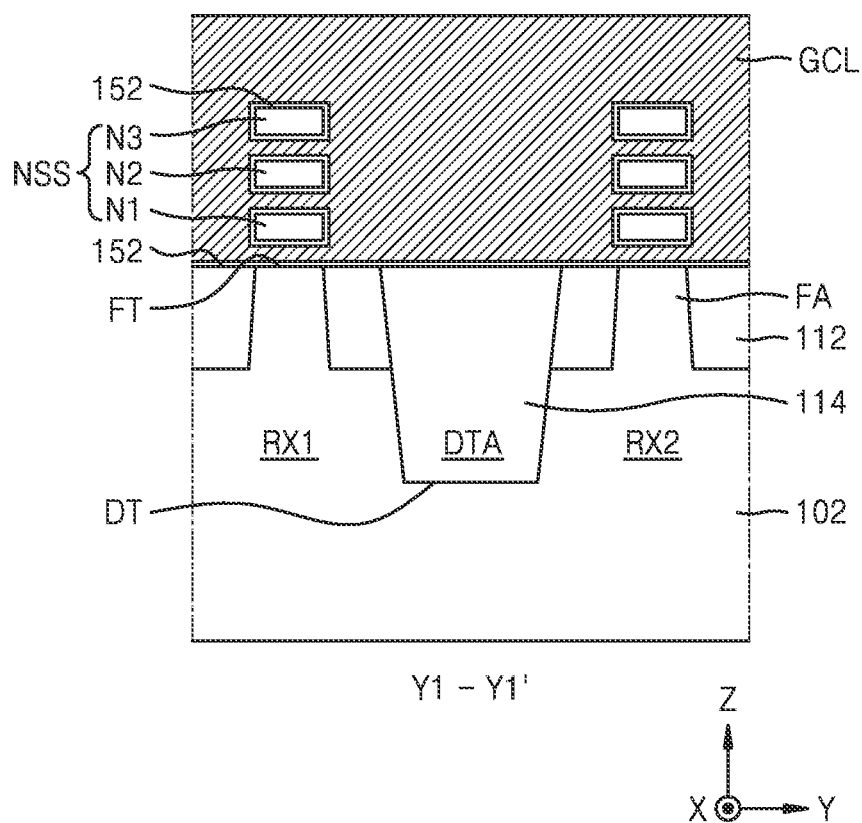

Referring to FIGS. 26A to 26C, a gate dielectric layer 152 covering the first to third nanosheets N1 to N3 and exposed surfaces of the fin-type active region FA may be formed from a resultant material of FIGS. 25A to 25C, a gate-forming conductive layer GCL which fills the gate space GS (see FIG. 18) and covers a top surface of the inter-gate insulation layer 144 may be formed on the gate dielectric layer 152, and then, a top surface of the inter-gate insulation layer 144 may be exposed by planarizing an obtained resultant material. An ALD process or a CVD process may be used for forming the gate dielectric layer 152 and the gate-forming conductive layer GCL.

Figure 27A:
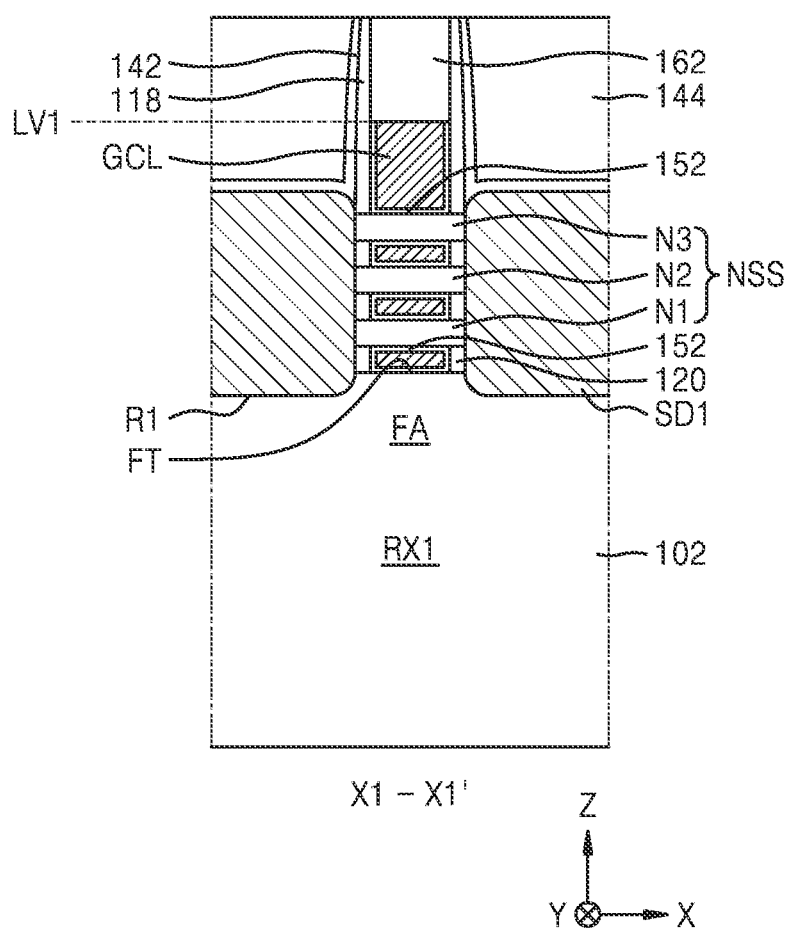
Figure 27B:
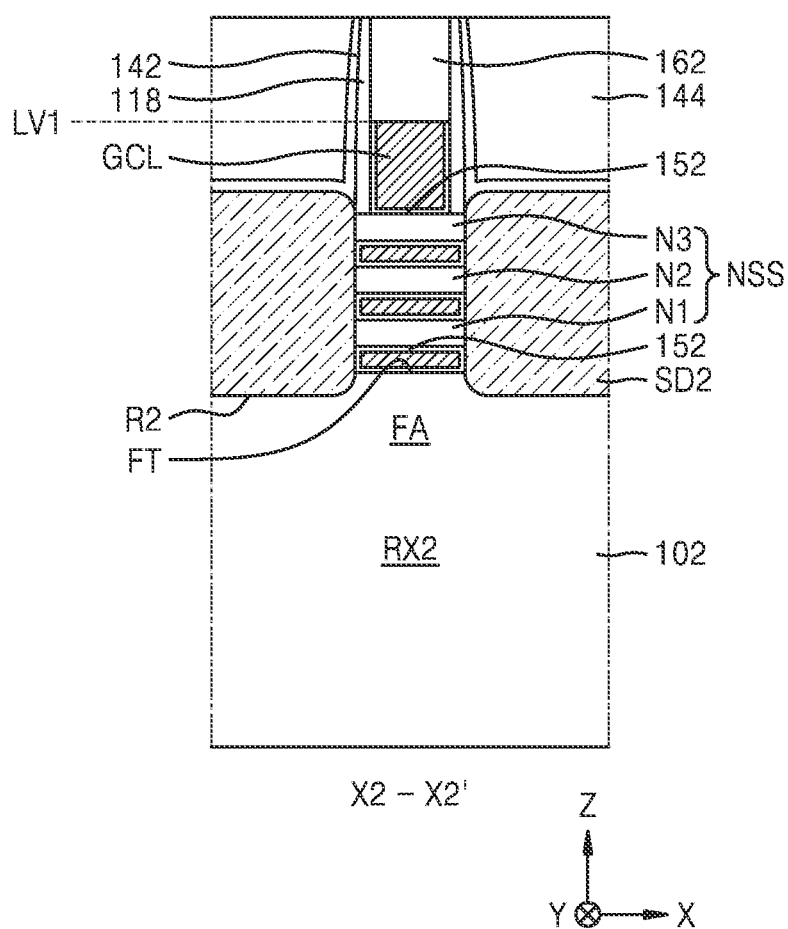
Figure 27C:
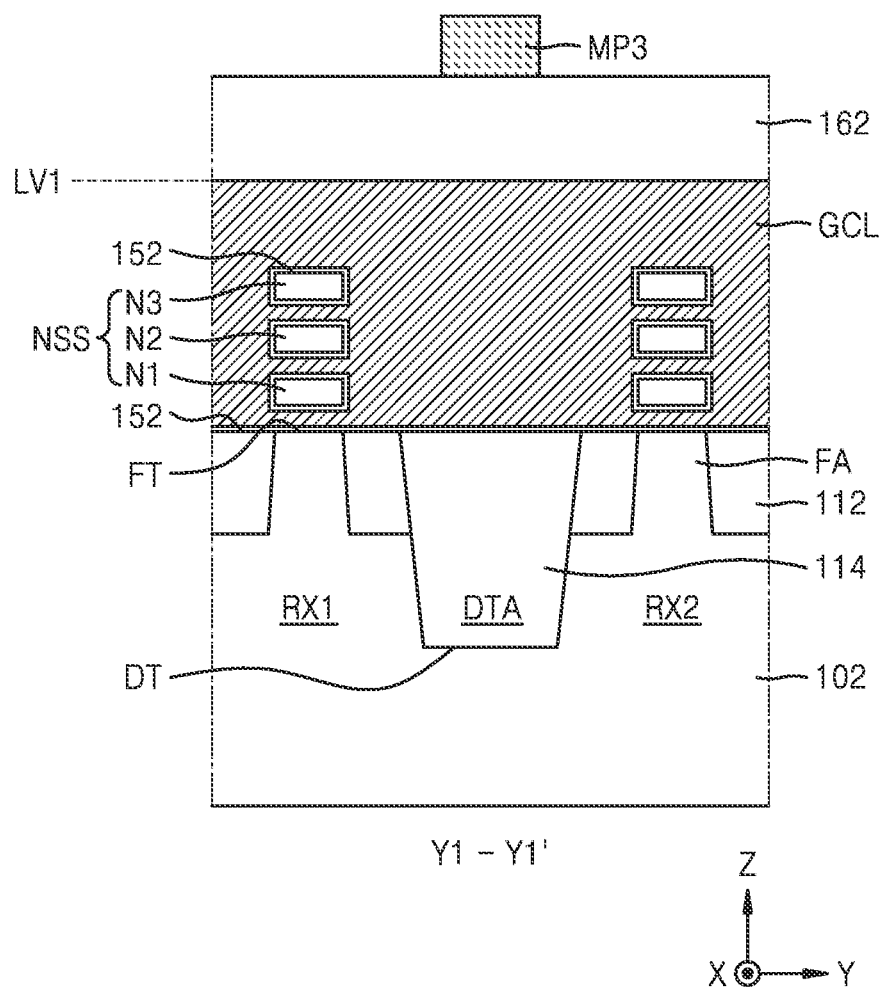

Referring to FIGS. 27A to 27C, by removing a portion of each of the gate-forming conductive layer GCL and the gate dielectric layer 152 from a top surface of a resultant material of FIGS. 26A to 26C, a height of a top surface of each of the gate-forming conductive layer GCL and the gate dielectric layer 152 may be lowered to a first level LV1. As a result, a portion of the gate space GS (see FIGS. 25A to 25C) may be empty on each of the gate-forming conductive layer GCL and the gate dielectric layer 152 again. Subsequently, the empty gate space GS may be filled with an insulation mask 162 again, and a mask pattern MP3 may be formed on the insulation mask 162. The mask pattern MP3 may be formed to cover a top surface of the insulation mask 162, in a region corresponding to a region where a gate contact 184 is to be formed in a post process. The insulation mask 162 may include oxide, nitride, or a combination thereof. The mask pattern MP3 may include a photoresist pattern.

Figure 28A:
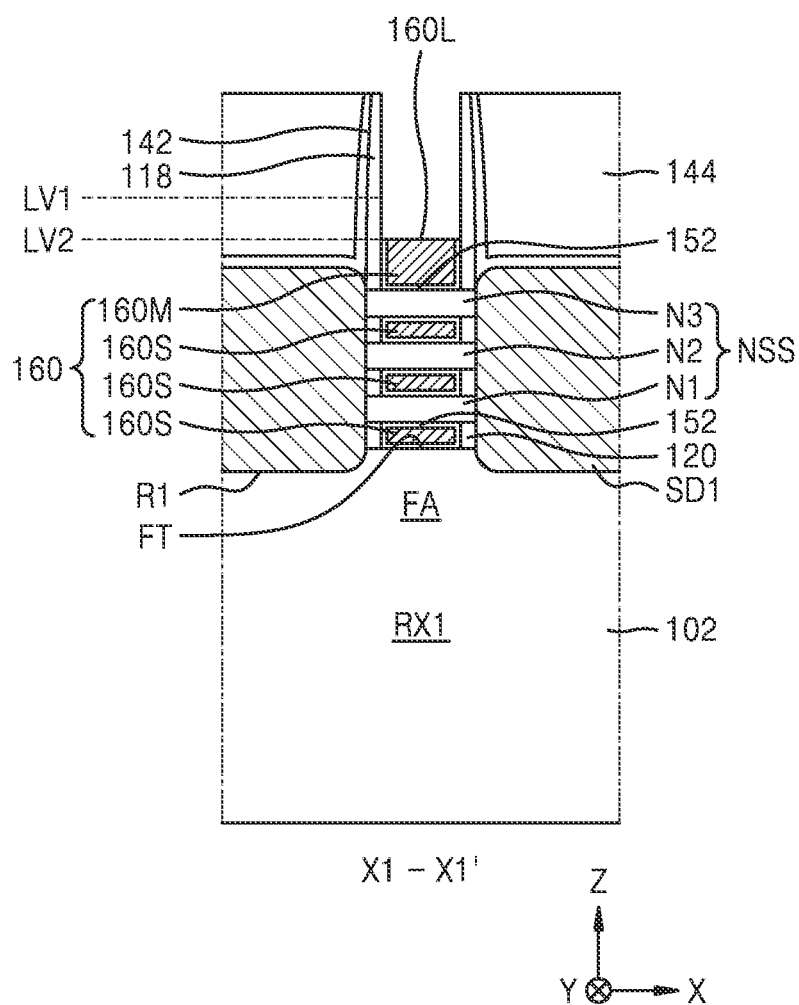
Figure 28B:
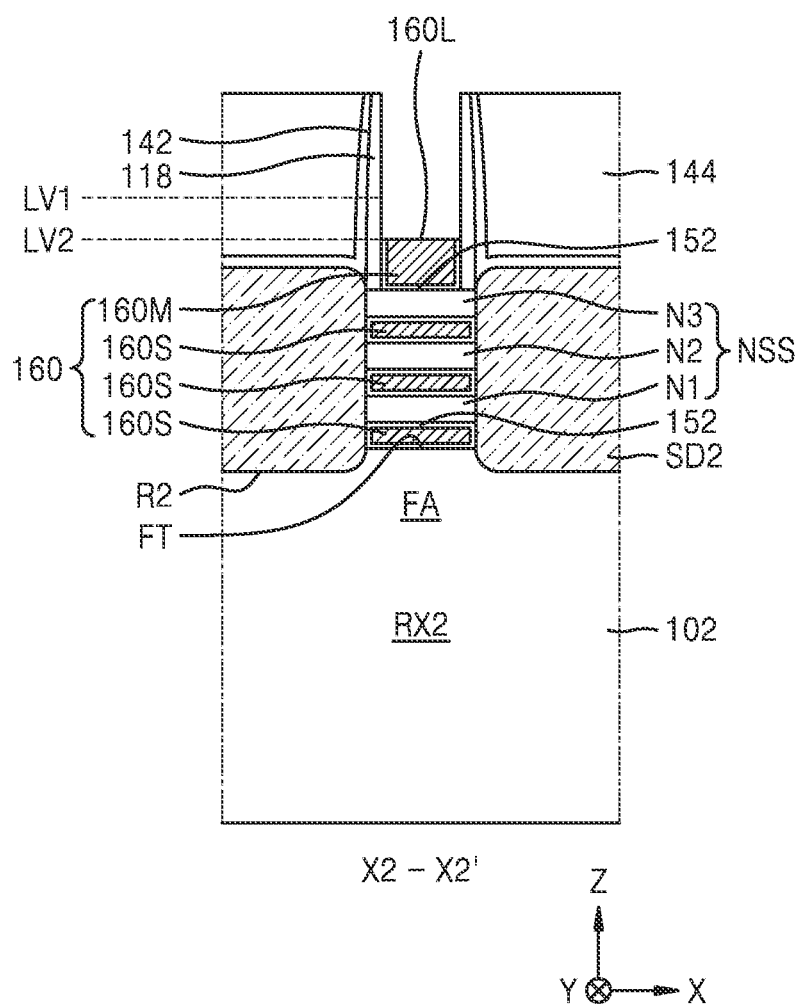
Figure 28C:
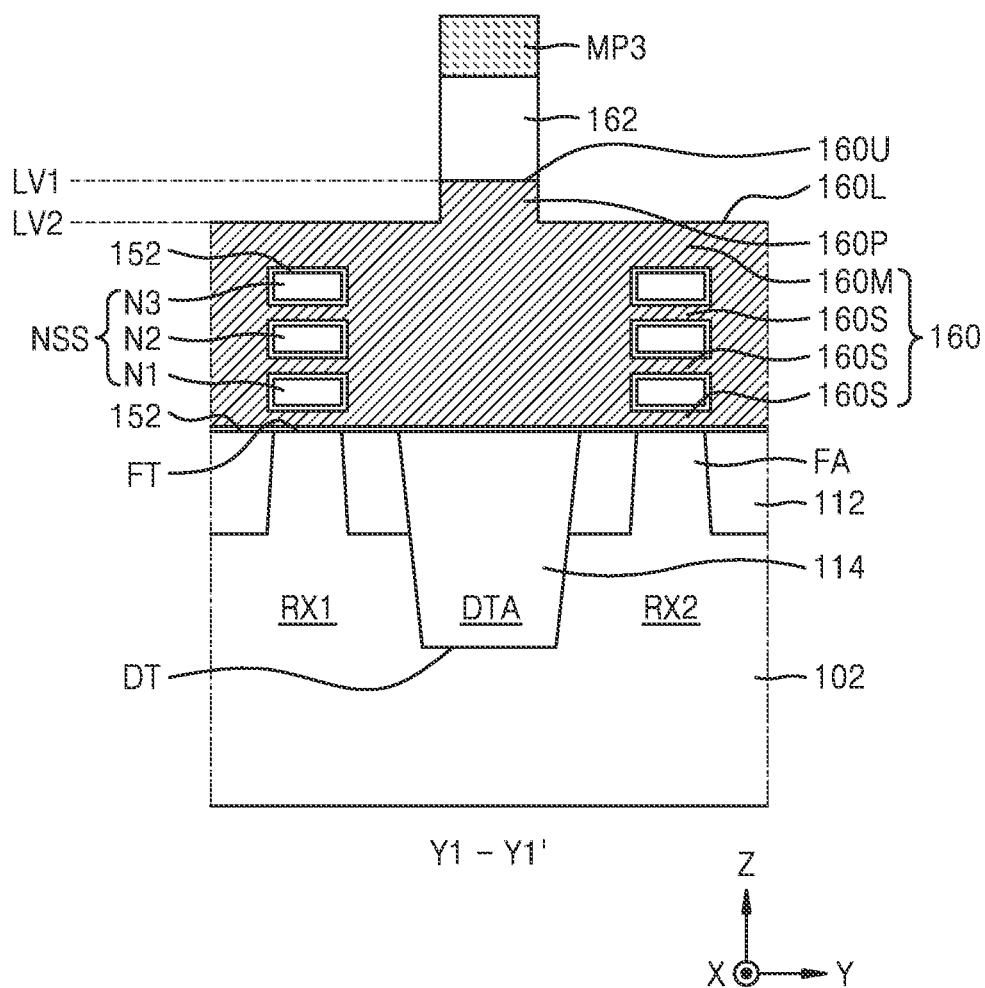

Referring to FIGS. 28A to 28C, the insulation mask 162 may be etched by using the mask pattern MP3 as an etch mask in a resultant material of FIGS. 27A to 27C, and then, by etching a portion of each of the gate-forming conductive layer GCL and the gate dielectric layer 152 which are exposed, a height of a top surface of each of the gate-forming conductive layer GCL and the gate dielectric layer 152 may be lowered to a second level LV2. As a result, the gate line 160 having different heights based on positions may be formed. The gate line 160 may include a main gate portion 160M and a plurality of sub gate portions 160S, and the main gate portion 160M may include a connection protrusion portion 160P which protrudes upward in a vertical direction (a Z direction) in a partial region of the main gate portion 160M. The connection protrusion portion 160P may be a portion which is connected to the gate contact 184 in a post process. In the main gate portion 160M, the connection protrusion portion 160P may include a protrusion top surface 160U at a first level LV1, and a peripheral portion of the connection protrusion portion 160P of the main gate portion 160M may include a recess top surface 160L at a second level LV2 which is lower than the first level LV1.

Figure 29A:
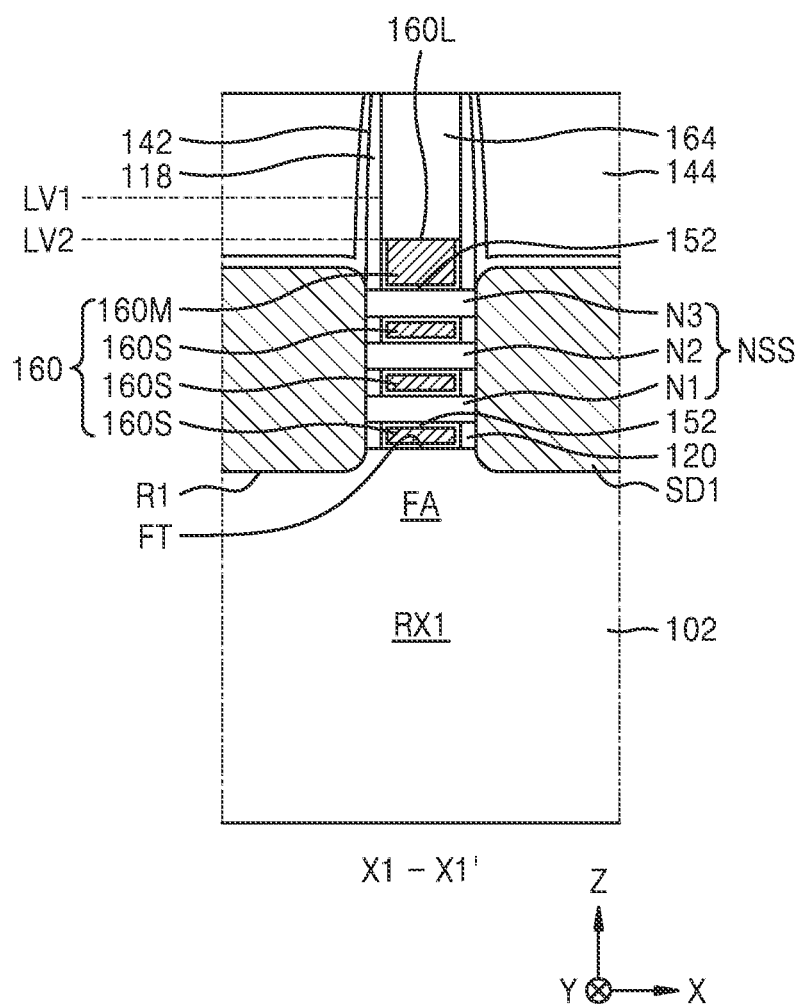
Figure 29B:
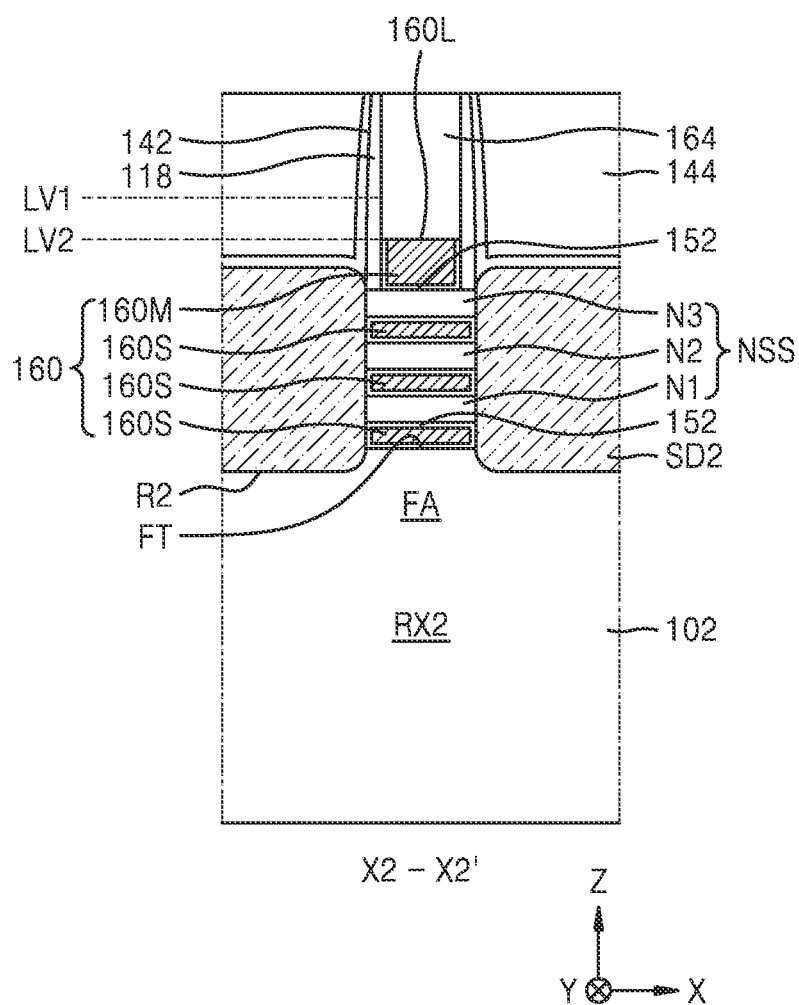
Figure 29C:
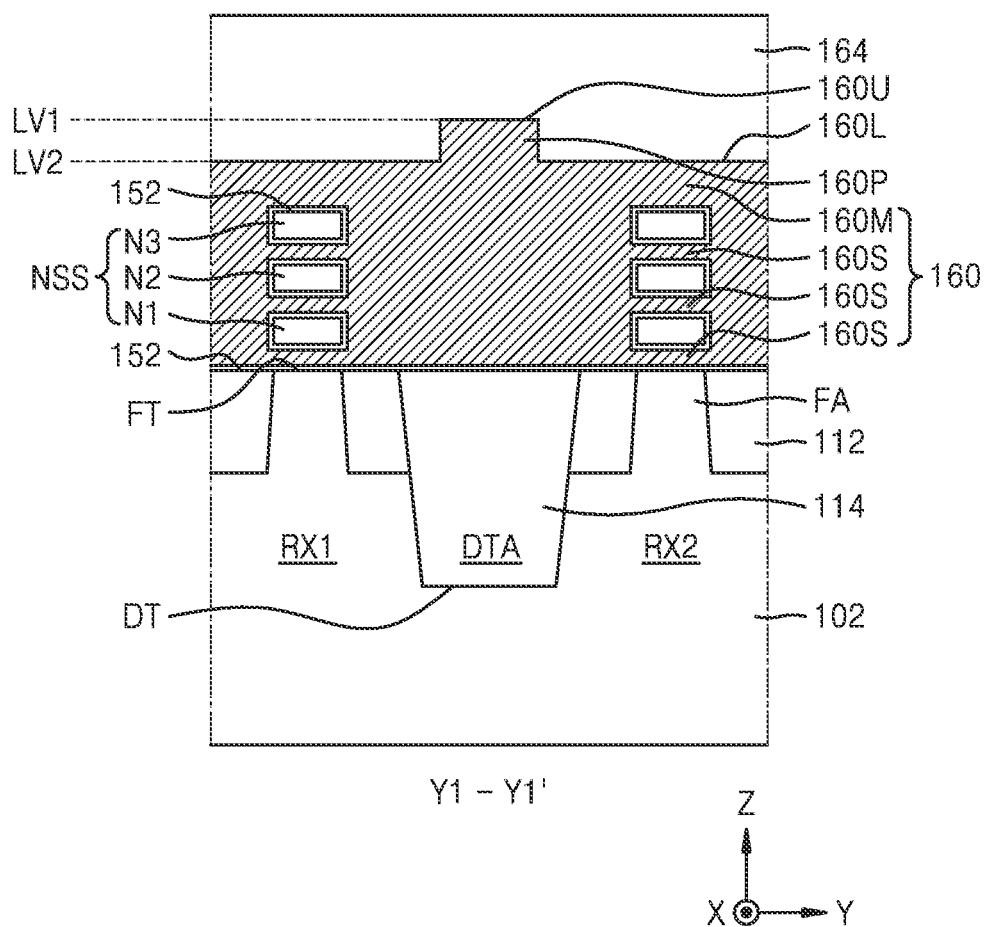

Referring to FIGS. 29A to 29C, the protrusion top surface 160U of the connection protrusion portion 160P may be exposed by removing the mask pattern MP3 and the insulation mask 162 from a resultant material of FIGS. 28A to 28C, and then, a capping insulation pattern 164 which covers the protrusion top surface 160U and the recess top surface 160L of the gate line 160 and a top surface of the gate dielectric layer 152 may be formed.

Figure 30A:
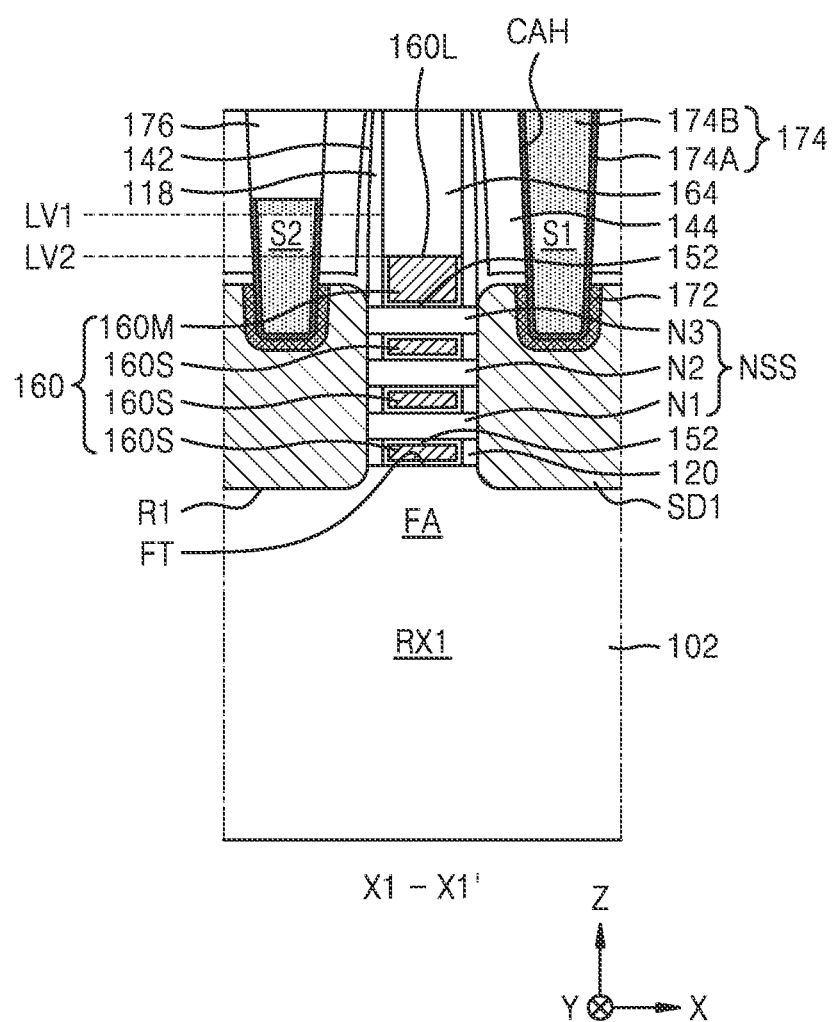
Figure 30B:
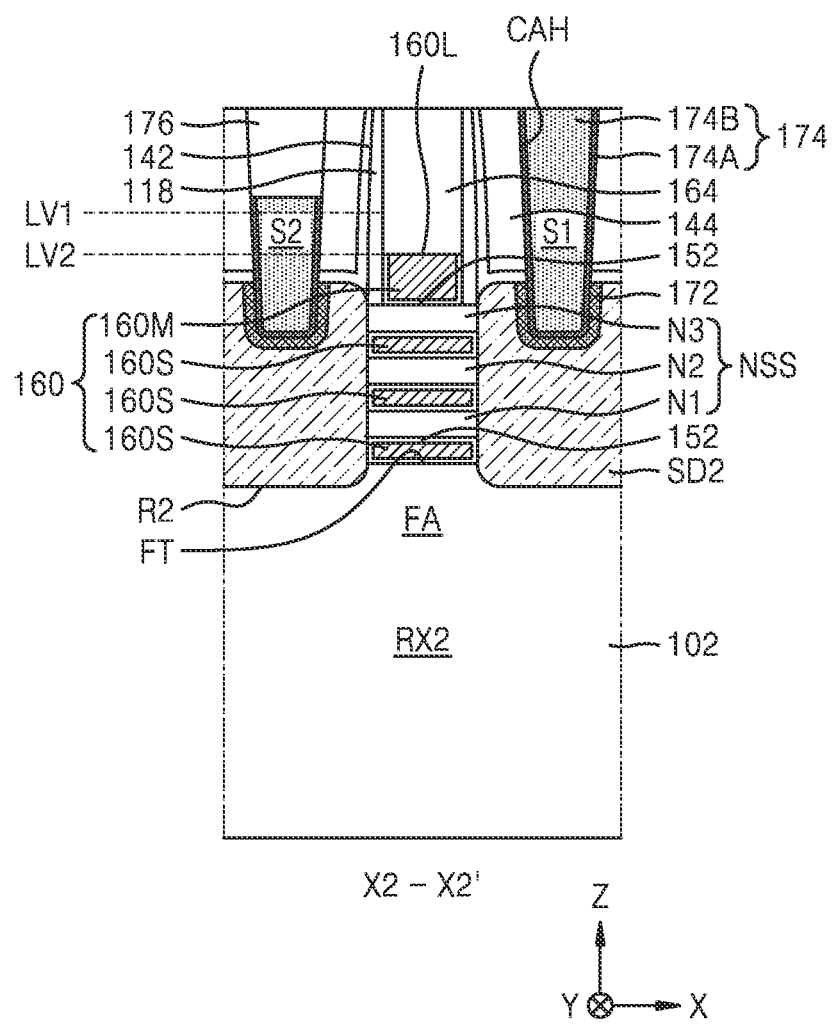
Figure 30C:
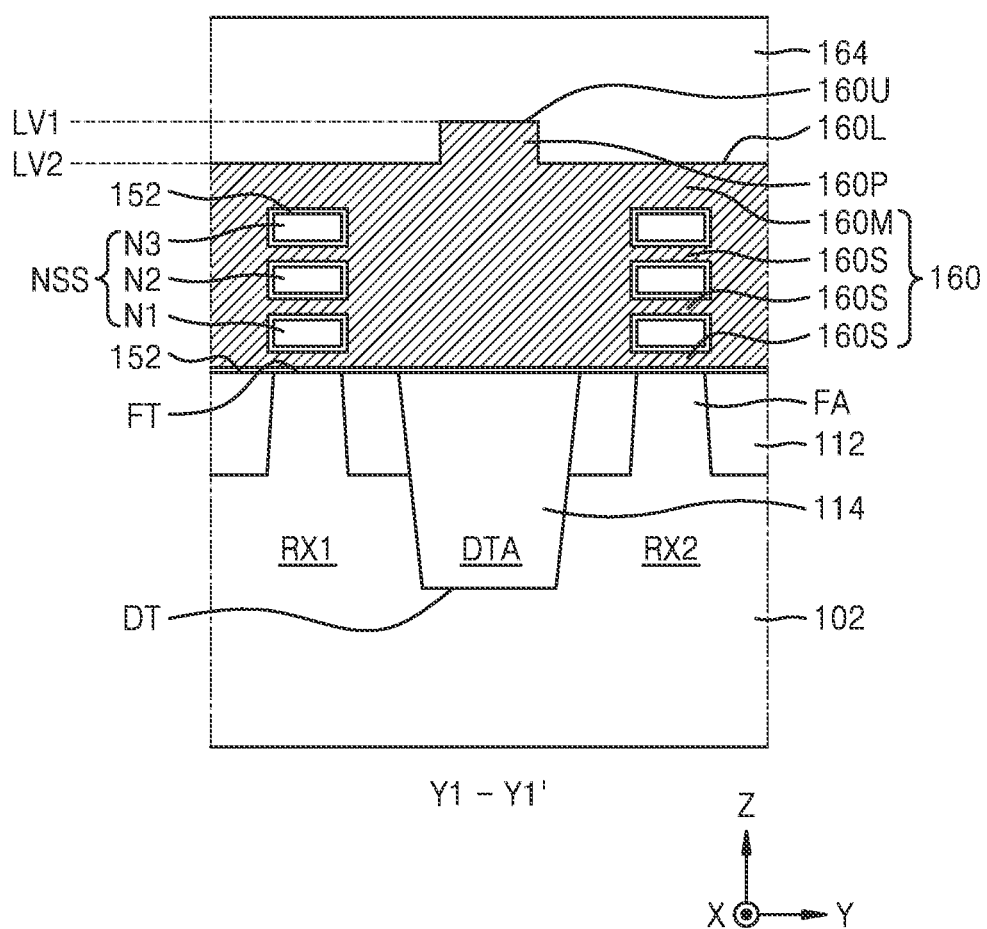

Referring to FIGS. 30A to 30C, a plurality of source/drain contact holes CAH which pass through the inter-gate insulation layer 144 and the insulation liner 142 to expose the plurality of first and second source/drain regions SD1 and SD2 may be formed in the first device region RX1 and the second device region RX2, and then, a plurality of metal silicide layers 172 covering the plurality of first and second source/drain regions SD1 and SD2 and a plurality of source/drain contacts 174 filling the plurality of source/drain contact holes CAH may be formed under the plurality of source/drain contact holes CAH. The plurality of source/drain contacts 174 may be formed to include a conductive barrier layer 174A and a metal plug 174B.

In embodiments, a process of forming a contact insulation spacer covering an inner sidewall of each of the plurality of source/drain contact holes CAH may be further formed before the plurality of source/drain contacts 174. To form the contact insulation spacer, an insulation spacer layer conformally covering an inner wall of each of the plurality of source/drain contact holes CAH may be formed, and then, an anisotropic etching process may be performed on the insulation spacer layer so that the plurality of first and second source/drain regions SD1 and SD2 are exposed through the plurality of source/drain contact holes CAH. As a result, the plurality of contact insulation spacers may remain on sidewalls of the plurality of source/drain contact holes CAH. In this case, the plurality of source/drain contacts 174 may be formed in a space, limited by the plurality of contact insulation spacers, of an inner space of the source/drain contact hole CAH.

In embodiments, the following processes may be performed for forming the metal silicide layer 172 and the plurality of source/drain contacts 174. First, a metal liner conformally covering the plurality of first and second source/drain regions SD1 and SD2 may be formed in the plurality of source/drain contact holes CAH. The metal liner may include Ti, W, Ru, Nb, Mo, Hf, Ni, Co, Pt, Yb, Tb, Dy, Er, Pd, or a combination thereof. Subsequently, a conductive barrier layer 174A which covers an exposed surface of the metal liner and the inner walls of the plurality of source/drain contact holes CAH may be formed. The metal liner and the conductive barrier layer 174A may be formed by using a CVD process, an ALD process, or a physical vapor deposition (PVD) process. Subsequently, by performing thermal treatment on a resultant material in which the metal liner and the conductive barrier layer 174A are formed, a reaction between a semiconductor material of the plurality of first and second source/drain regions SD1 and SD2 and a metal material of the metal liner may be induced, and thus, a plurality of metal silicide layers 172 covering the plurality of first and second source/drain regions SD1 and SD2 may be formed. In embodiments, after the metal silicide layer 172 is formed, a portion of the metal liner may remain between the metal silicide layer 172 and the conductive barrier layer 174A. In embodiments, all of the metal liner may be used to form the metal silicide layer 172 while the metal silicide layer 172 is being formed, and thus, the metal liner may not remain between the metal silicide layer 172 and the conductive barrier layer 174A.

A metal layer having a thickness sufficient to fill an inner portion of each of the plurality of source/drain contact holes CAH may be formed on a resultant material in which the metal silicide layer 172 and the conductive barrier layer 174A are formed. A CVD process, a PVD process, or an electroplating process may be used for forming the metal layer. Subsequently, undesired portions of the conductive barrier layer 174A and the metal layer may be removed through a chemical mechanical polishing (CMP) process so that a top surface of the inter-gate insulation layer 144 is exposed, and thus, a metal plug 174B including the metal layer remaining on the conductive barrier layer 174A may be formed in each of the plurality of source/drain contact holes CAH.

Subsequently, an etch stop layer covering a top surface of a resultant material in which the plurality of source/drain contacts 174 are formed may be formed, and then, a plurality of local mask patterns covering partial regions of the plurality of source/drain contacts 174 may be formed on the etch stop layer. The etch stop layer and the plurality of local mask patterns may include different materials. In embodiments, the etch stop layer may include SiOC, SiN, or a combination thereof and the plurality of local mask patterns may include a silicon oxide layer, a spin on hardmask (SOH) layer, a photoresist layer, or a combination thereof, but the inventive concept is not limited thereto.

By using the plurality of local mask patterns as an etch mask, heights of partial regions of the plurality of source/drain contacts 174 may be lowered by etching a partial region of each of the etch stop layer and the source/drain contact 174. As a result, the plurality of source/drain contacts 174 may have different heights based on positions. Each of the plurality of source/drain contacts 174 may be formed to include a first segment S1 and a second segment S2, which have different heights and are connected to each other as one body in a vertical direction (a Z direction). A height of a top surface of the second segment S2 may be lower than a top surface of the first segment S1. The first segment S1 and the second segment S2 each included in one source/drain contact 174 may be disposed on a straight line in a second horizontal direction (a Y direction).

The plurality of source/drain contacts 174 including the first segment S1 and the second segment S2 may be formed, and then, a buried insulation layer 176 may fill a space remaining on the second segment S2. A top surface of each of the buried insulation layer 176, the first segment S1 of the source/drain contact 174, and the inter-gate insulation layer 144 may extend to be flat at the same level.

Figure 31A:
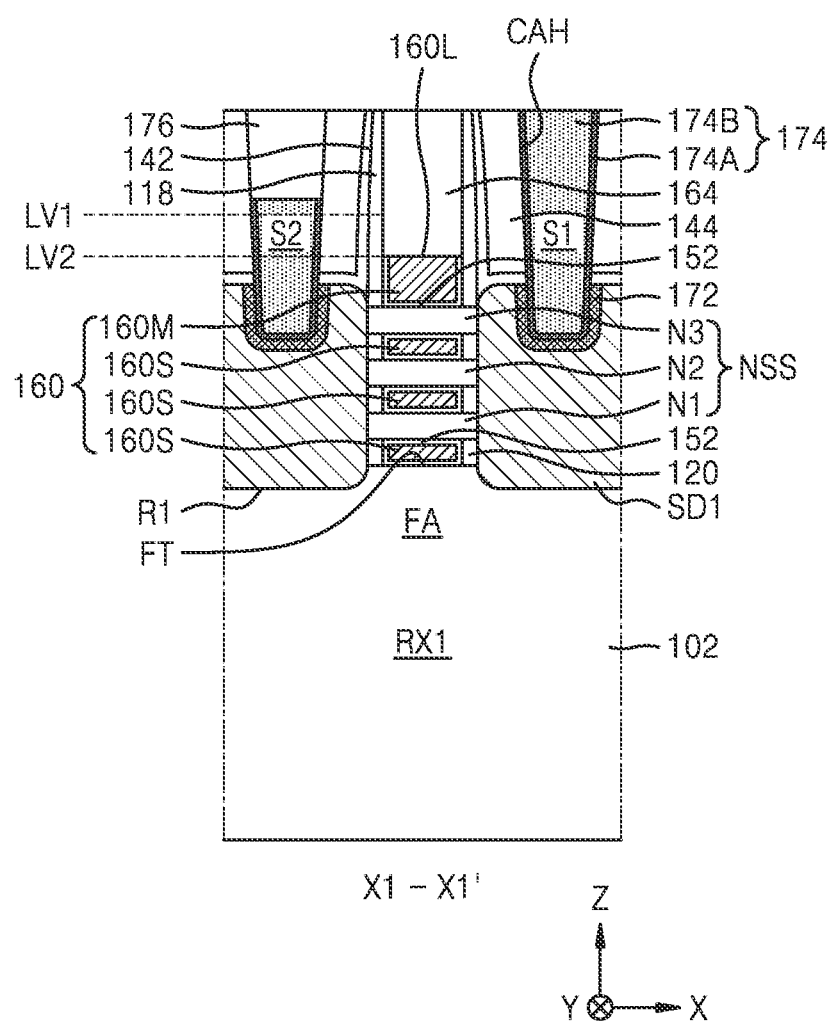
Figure 31B:
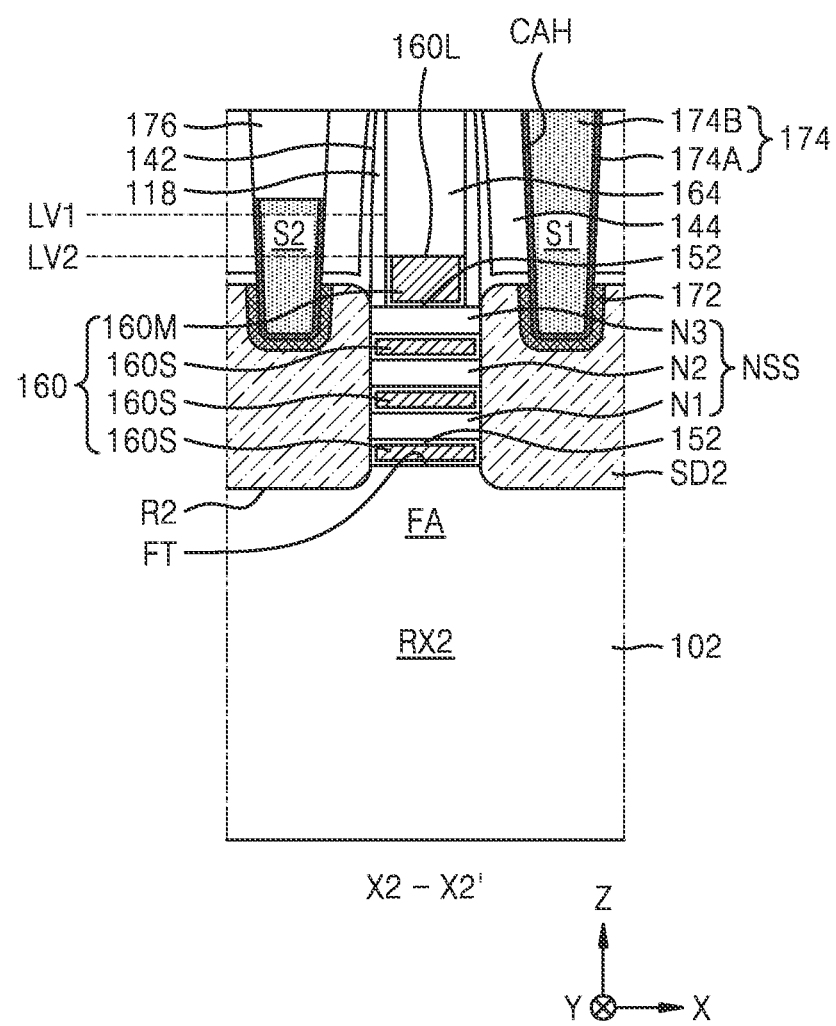
Figure 31C:
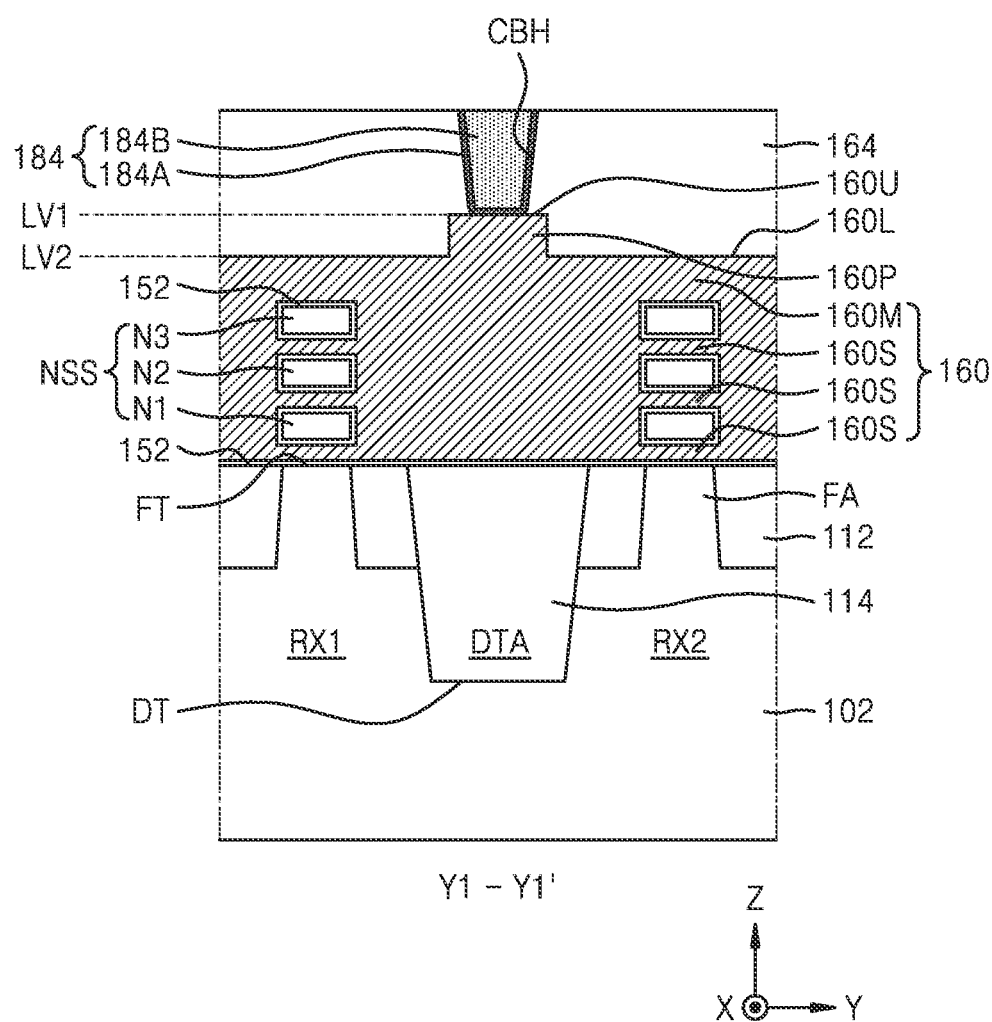

Referring to FIGS. 31A to 31C, a gate contact hole CBH exposing a top surface of the connection protrusion portion 160P included in the main gate portion 160M of the gate line 160 may be formed by etching a partial region of a capping insulation pattern 164 in a resultant material of FIGS. 30A to 30C, and a gate contact 184 filling the gate contact hole CBH may be formed. The gate contact 184 may be formed to include a conductive barrier layer 184A and a metal plug 184B. The conductive barrier layer 184A and the metal plug 184B may be formed by a method similar to a method of forming the conductive barrier layer 174A and the metal plug 174B of the source/drain contact 174 described above with reference to FIGS. 30A to 30C.

Subsequently, as illustrated in FIGS. 2A to 2D, an insulation structure 190 may be formed on a resultant material in which the source/drain contact 174 and the gate contact 184 are formed. The insulation structure 190 may include an etch stop layer 190A and an interlayer insulation layer 190B. Subsequently, a plurality of source/drain via contacts 192 which pass through the insulations structure 190 and are connected to the first segments S1 of the plurality of source/drain contacts 174 and a gate via contact 194 which passes through the insulation structure 190 and is connected to the gate contact 184 may be formed. The plurality of source/drain via contacts 192 may include a conductive barrier layer 192A and a metal plug 192B. The gate via contact 194 may include a conductive barrier layer 194A and a metal plug 194B. The conductive barrier layers 192A and 194A and the metal plugs 192B and 194B may be formed by a method similar to the method of forming the conductive barrier layer 174A and the metal plug 174B of the source/drain contact 174 described above with reference to FIGS. 30A to 30C.

In embodiments, the plurality of source/drain via contacts 192 and the gate via contact 194 may be sequentially formed. In this case, the plurality of source/drain via contacts 192 may be first formed and then the gate via contact 194 may be formed, or the gate via contact 194 may be first formed and then the plurality of source/drain via contacts 192 may be formed. In other embodiments, the plurality of source/drain via contacts 192 and the gate via contact 194 may be simultaneously formed.

Hereinabove, the method of manufacturing the integrated circuit device 100 illustrated in FIGS. 1 and 2A to 2D has been described above with reference to FIGS. 21A to 31C, but is not limited thereto and it may be easily understood by those of ordinary skill in the art that the integrated circuit devices 100A, 100B, 100C, 100D, 100E, 200, 200A, 200B, 200C, 300, 400, 400A, 400B, 500, 600A, 600B, 600C, 700, and 800 illustrated in FIGS. 3A to 20B and various integrated circuit devices having a structure similar thereto are manufactured by performing various modifications and changes from the descriptions of FIGS. 11A to 21C within the scope of the inventive concept.

In the method of manufacturing the integrated circuit device 100 described above with reference to FIGS. 21A to 31C, an example in which three nanosheets N1 to N3 are formed in a process described above with reference to FIGS. 21A to 21C, but the inventive concept is not limited thereto. For example, four nanosheets overlapping one another in a vertical direction (a Z direction) may be formed in a process described above with reference to FIGS. 21A to 21C, and then, the integrated circuit devices 100A, 100B, 100C, 100D, 100E, 200, 200A, 200B, 200C, 300, 400, 400A, 400B, 500, 600A, 600B, 600C, 700, and 800 illustrated in FIGS. 3A to 20B and various integrated circuit devices having a structure similar thereto may be manufactured by performing various modifications and changes on processes of forming the gate line 160 including the connection protrusion portion 160P as described above with reference to FIGS. 27A to 28C, within the scope of the inventive concept.

While the inventive concept has been shown and described with reference to embodiments thereof, it will be understood that various changes in form and details may be made therein without departing from the spirit and scope of the following claims.

What is claimed is:

1. An integrated circuit device comprising:
    a fin-type active region disposed on a substrate and extending in a first horizontal direction;
    a gate line disposed on the fin-type active region and extending in a second horizontal direction intersecting the first horizontal direction, the gate line comprising:
        a connection protrusion portion comprising a protrusion top surface at a first vertical level from the substrate, and
        a main gate portion comprising a recess top surface extending in the second horizontal direction from the connection protrusion portion, the recess top surface being at a second vertical level lower than the first vertical level;
    a gate contact disposed on the gate line and connected to the connection protrusion portion;
    a source/drain region disposed on the fin-type active region and disposed adjacent to the gate line; and
    a source/drain contact disposed on the source/drain region, the source/drain contact comprising an uppermost surface at a third vertical level higher than the first vertical level.

2. The integrated circuit device of claim 1, wherein the substrate comprises:
    a device region; and
    an inter-device isolation region defining the device region,
    wherein the main gate portion extends in the second horizontal direction in the device region and the inter-device isolation region, and
    wherein the connection protrusion portion and the gate contact are disposed in the device region.

3. The integrated circuit device of claim 1, wherein the substrate comprises:
    a device region; and
    an inter-device isolation region defining the device region,
    wherein the main gate portion extends in the second horizontal direction in the device region and the inter-device isolation region, and
    wherein the connection protrusion portion and the gate contact are disposed in the inter-device isolation region.

4. The integrated circuit device of claim 1, wherein the substrate comprises:
    a first device region; and
    a second device region disposed apart from the first device region,
    wherein the connection protrusion portion is disposed in one among the first device region and the second device region, and
    wherein the recess top surface is disposed in another one among the first device region and the second device region.

5. The integrated circuit device of claim 1, wherein the gate contact and the source/drain contact are staggeredly arranged not to be disposed on a straight line in the first horizontal direction.

6. The integrated circuit device of claim 1, wherein the gate contact and the source/drain contact are disposed on a straight line in the first horizontal direction.

7. The integrated circuit device of claim 1, further comprising a capping insulation pattern covering the protrusion top surface of the connection protrusion portion and the recess top surface of the main gate portion,
    wherein the gate contact is disposed through the capping insulation pattern and contacts the protrusion top surface.

8. The integrated circuit device of claim 1, further comprising a nanosheet stack facing a fin top surface of the fin-type active region and disposed apart from the fin top surface in a vertical direction, the nanosheet stack comprising a plurality of nanosheets having different vertical distances from the fin top surface,
    wherein the gate line further comprises at least one sub gate portion connected to the main gate portion as one body and interposed between two adjacent nanosheets among the plurality of nanosheets, and
    wherein the recess top surface is higher than a top surface of the nanosheet stack in the vertical direction.

9. The integrated circuit device of claim 1, further comprising a nanosheet stack facing a fin top surface of the fin-type active region and disposed apart from the fin top surface in a vertical direction, the nanosheet stack comprising a plurality of nanosheets having different vertical distances from the fin top surface,
    wherein the recess top surface is lower than or equal to a vertical level of a top surface of the nanosheet stack.

10. The integrated circuit device of claim 1, further comprising:
    a nanosheet stack comprising at least one nanosheet facing a fin top surface of the fin-type active region and disposed apart from the fin top surface; and
    a gate dielectric layer comprising a first portion covering a surface of the at least one nanosheet,
    wherein the recess top surface is lower than or equal to a vertical level of a top surface of the first portion of the gate dielectric layer.

11. The integrated circuit device of claim 1, wherein the substrate comprises:
    a first device region; and
    a second device region disposed apart from the first device region,
    wherein the fin-type active region comprises:
    a first fin-type active region extending in the first horizontal direction in the first device region; and
    a second fin-type active region extending in the first horizontal direction in the second device region,
    wherein the integrated circuit device further comprises:
    a first nanosheet stack comprising at least one first nanosheet facing a first fin top surface of the first fin-type active region and disposed apart from the first fin top surface in a vertical direction, the at least one first nanosheet being surrounded by the gate line;

a second nanosheet stack comprising at least one second nanosheet facing a second fin top surface of the second fin-type active region and disposed apart from the second fin top surface in the vertical direction, the at least one second nanosheet being surrounded by the gate line, wherein the first fin-type active region overlaps the protrusion top surface in the vertical direction, wherein the second fin-type active region overlaps the recess top surface in the vertical direction, and wherein a number of the at least one second nanosheet is less than a number of the at least one first nanosheet.

12. The integrated circuit device of claim 1, further comprising:
a capping insulation pattern covering the recess top surface of the main gate portion and the protrusion top surface of the connection protrusion portion;
at least one nanosheet facing a fin top surface of the fin-type active region and disposed apart from the fin top surface in a vertical direction; and
a semiconductor oxide piece interposed between the source/drain region and the capping insulation pattern at a position overlapping the at least one nanosheet in the vertical direction.

13. The integrated circuit device of claim 1, further comprising a nanosheet stack comprising at least one nanosheet facing a fin top surface of the fin-type active region and disposed apart from the fin top surface in a vertical direction,
wherein the connection protrusion portion comprises a protrusion sidewall comprising a lateral recess recessed in the first horizontal direction at a position overlapping the at least one nanosheet in the vertical direction.

14. The integrated circuit device of claim 1, further comprising:
a nanosheet stack comprising at least one nanosheet facing a fin top surface of the fin-type active region and disposed apart from the fin top surface in a vertical direction,
wherein the connection protrusion portion comprises a protrusion sidewall overlapping the at least one nanosheet in the vertical direction, the protrusion sidewall comprising a lateral recess recessed in the first horizontal direction at a position overlapping the at least one nanosheet in the vertical direction; and
a semiconductor oxide piece buried into the lateral recess and comprising a portion overlapping the at least one nanosheet in the vertical direction.

15. An integrated circuit device comprising:
a substrate comprising:
a first region; and
a second region disposed apart from the first region;
a first fin-type active region extending in a first horizontal direction in the first region;
a first gate line extending in a second horizontal direction intersecting the first horizontal direction, in the first fin-type active region, the first gate line comprising a top surface at a first vertical level from the substrate;
a second fin-type active region extending in the first horizontal direction in the second region; and
a second gate line extending in the second horizontal direction in the second fin-type active region, the second gate line comprising a recess top surface at a second vertical level lower than the first vertical level,
wherein the second gate line further comprises a connection protrusion portion protruding in a vertical direction from the recess top surface, the connection protrusion portion comprising a protrusion top surface at the first vertical level.

16. The integrated circuit device of claim 15, further comprising:
a first gate contact contacting the top surface of the first gate line in the first region; and
a second gate contact connected to the second gate line in the second region,
wherein the top surface of the first gate line extends over a total length of the first gate line, and
wherein the second gate contact contacts the protrusion top surface.

17. The integrated circuit device of claim 15, further comprising:
a first gate contact contacting the top surface of the first gate line in the first region, the first gate contact having a first vertical length; and
a second gate contact contacting the recess top surface of the second gate line in the second region, the second gate contact having a second vertical length greater than the first vertical length,
wherein the top surface of the first gate line extends over a total length of the first gate line, and
wherein the recess top surface of the second gate line extends over a total length of the second gate line.

18. The integrated circuit device of claim 15, further comprising:
a first nanosheet stack comprising at least one first nanosheet facing a first fin top surface of the first fin-type active region and disposed apart from the first fin top surface in a vertical direction in the first region, the at least one first nanosheet being surrounded by the first gate line; and
a second nanosheet stack comprising at least one second nanosheet facing a second fin top surface of the second fin-type active region and disposed apart from the second fin top surface in the vertical direction in the second region, the at least one second nanosheet being surrounded by the second gate line,
wherein a number of the at least one second nanosheet is less than a number of the at least one first nanosheet.

19. An integrated circuit device comprising:
a substrate comprising:
a first device region; and
a second device region disposed apart from the first device region;
a first fin-type active region extending in a first horizontal direction in the first device region;
a second fin-type active region extending in the first horizontal direction in the second device region;
a first nanosheet stack comprising at least one first nanosheet facing a first fin top surface of the first fin-type active region and disposed apart from the first fin top surface in a vertical direction;
a second nanosheet stack comprising at least one second nanosheet facing a second fin top surface of the second fin-type active region and disposed apart from the second fin top surface in the vertical direction;
a gate line comprising:
a connection protrusion portion extending in a second horizontal direction intersecting the first horizontal direction, in the first device region and the second device region, the connection protrusion portion comprising a protrusion top surface at a first vertical level from the substrate;

a main gate portion comprising a recess top surface extending in the second horizontal direction from the connection protrusion portion, the recess top surface being at a second vertical level lower than the first vertical level; and a plurality of sub gate portions connected to the main gate portion as one body and surrounding the first nanosheet stack and the second nanosheet stack;

a gate contact disposed on the gate line and contacting the connection protrusion portion;

a source/drain region disposed on one among the first fin-type active region and the second fin-type active region and disposed adjacent to the gate line; and a source/drain contact disposed on the source/drain region, the source/drain contact comprising an uppermost surface at a third vertical level higher than the first vertical level.

20. The integrated circuit device of claim 19, wherein a number of the at least one first nanosheet differs from a number of the at least one second nanosheet.

\* \* \* \* \*